United States Patent
Ishida et al.

(10) Patent No.: US 11,492,475 B2
(45) Date of Patent: Nov. 8, 2022

(54) POLYPROPYLENE FILM, METAL LAYER-INTEGRATED POLYPROPYLENE FILM, FILM CAPACITOR AND FILM ROLL

(71) Applicant: Oji Holdings Corporation, Tokyo (JP)

(72) Inventors: Tatsuji Ishida, Tokyo (JP); Yoshimune Okuyama, Tokyo (JP); Masahiro Nakata, Tokyo (JP); Tadakazu Ishiwata, Tokyo (JP)

(73) Assignee: OJI HOLDINGS CORPORATION, Tokyo (JP)

( * ) Notice: Subject to any disclaimer, the term of this patent is extended or adjusted under 35 U.S.C. 154(b) by 314 days.

(21) Appl. No.: 16/767,092

(22) PCT Filed: Dec. 26, 2018

(86) PCT No.: PCT/JP2018/047983
§ 371 (c)(1),
(2) Date: May 26, 2020

(87) PCT Pub. No.: WO2019/131815
PCT Pub. Date: Jul. 4, 2019

(65) Prior Publication Data
US 2020/0377706 A1    Dec. 3, 2020

(30) Foreign Application Priority Data

Dec. 26, 2017 (JP) .............................. JP2017-249788
Dec. 26, 2017 (JP) .............................. JP2017-249799
(Continued)

(51) Int. Cl.
*C08L 23/12* (2006.01)
*C08J 5/18* (2006.01)
(Continued)

(52) U.S. Cl.
CPC ................. *C08L 23/12* (2013.01); *C08J 5/18* (2013.01); *H01G 4/14* (2013.01); *H01G 4/32* (2013.01);
(Continued)

(58) Field of Classification Search
CPC ................ C08J 5/18; H01G 4/14; H01G 4/32
See application file for complete search history.

(56) References Cited

U.S. PATENT DOCUMENTS

2013/0170096 A1   7/2013   Sugata et al.
2015/0050456 A1   2/2015   Nakatsuka et al.

FOREIGN PATENT DOCUMENTS

| JP | 2016-188360 A | 11/2016 |
| WO | WO2012/002123 A1 | 6/2011 |
| WO | WO2013/146367 A1 | 3/2013 |

OTHER PUBLICATIONS

International Search Report in International Application No. PCT/JP2018/047983 dated Feb. 26, 2019.
(Continued)

*Primary Examiner* — Catherine S Branch
(74) *Attorney, Agent, or Firm* — Knobbe, Martens, Olson & Bear LLP

(57) ABSTRACT

A polypropylene film which is capable of suppressing blocking in a rolled polypropylene film. The polypropylene film has a first surface and a second surface, contains a polypropylene resin as a main component, and is configured such that: the Svk value (SvkA) of the first surface is 0.005 µm or more and 0.030 µm or less; the Spk value (SpkA) of the
(Continued)

first surface is more than 0.035 μm and 0.080 μm or less; the Svk value (SvkB) of the second surface is 0.005 μm or more and 0.030 μm or less; and the Spk value (SpkB) of the second surface is 0.015 μm or more and 0.035 μm or less.

8 Claims, 3 Drawing Sheets

(30) Foreign Application Priority Data

| Dec. 27, 2017 | (JP) | JP2017-252094 |
|---|---|---|
| Dec. 22, 2018 | (JP) | JP2018-240389 |
| Dec. 22, 2018 | (JP) | JP2018-240392 |
| Dec. 22, 2018 | (JP) | JP2018-240394 |
| Dec. 26, 2018 | (JP) | JP2018-243115 |
| Dec. 26, 2018 | (JP) | JP2018-243118 |
| Dec. 26, 2018 | (JP) | JP2018-243125 |

(51) Int. Cl.
*H01G 4/14* (2006.01)
*H01G 4/32* (2006.01)
*C23C 14/20* (2006.01)

(52) U.S. Cl.
CPC ........ *C08J 2323/12* (2013.01); *C08J 2423/12* (2013.01); *C23C 14/20* (2013.01)

(56) References Cited

OTHER PUBLICATIONS

Office Action in corresponding Japanese Patent Application No. 2018-243115, dated Jun. 22, 2021.
Office Action in corresponding Japanese Patent Application No. 2018-243118, dated Jun. 22, 2021.
Office Action in corresponding Japanese Patent Application No. 2018-243125, dated Jun. 22, 2021.
Office Action in Japanese Patent Application No. 2021-133170 dated May 30, 2022.
Office Action in Japanese Patent Application No. 2021-133159 dated May 30, 2022.
Office Action in Japanese Patent Application No. 2021-133153 dated May 30, 2022.
International Preliminary Report on Patentability issued in application No. PCT/JP2018/047983, dated Jul. 9, 2020.
Extended European Search Report in European Patent Application No. 18897008.1 dated Aug. 9, 2021.
Office Action issued in Chinese Patent Application No. 201880083593.9, dated Jul. 8, 2022.

(a)

(b)

(c)

50 μm (a)

(b)

(c)

POLYPROPYLENE FILM, METAL LAYER-INTEGRATED POLYPROPYLENE FILM, FILM CAPACITOR AND FILM ROLL

CROSS-REFERENCE TO RELATED APPLICATIONS

This application is the U.S. National Phase under 35 U.S.C. § 371 of International Application PCT/JP2018/047983, filed Dec. 26, 2018, designating the U.S., and published in Japanese as WO 2019/131815 on Jul. 4, 2019 which claims priority to Japanese Patent Application Nos. 2017-249788 and 2017-249799, both filed Dec. 26, 2017; Japanese Patent application No. 2017-252094, filed Dec. 26, 2017; Japanese Patent Application Nos. 2018-240389, 2018-240392 and 2018-240394, all filed Dec. 22, 2018; and Japanese Patent Application Nos. 2018-243115, 2018-243118, and 2018-243125, all filed Dec. 26, 2018, the entire contents of which are incorporated herein by reference.

TECHNICAL FIELD

The present invention (first present invention, second present invention, and third present invention) relates to a polypropylene film, a metal layer-integrated polypropylene film, a film capacitor, and a film roll.

BACKGROUND ART

Polypropylene films have excellent electric characteristics such as high dielectric strength and low dielectric loss characteristics and also have high moisture resistance. Therefore, polypropylene films are widely used in electronic devices and electrical machinery and apparatus. Specifically, polypropylene films, for example, are utilized as films used in high voltage capacitors, various switched mode power supplies, capacitors for filter (for example, convertor and inverter), smoothing capacitors, and the like.

In recent years, miniaturization and increase in capacity of capacitors have been further demanded. In order to improve the capacitance without changing the volume of capacitor, it is preferred to decrease the thickness of film as a dielectric. Therefore, there is a demand for thinner films.

However, thin polypropylene films have a problem that wrinkling and winding shift are likely to occur in the element winding processing at the time of fabrication of a capacitor. Hence, there is a case in which fine irregularities are formed on the surface of polypropylene film to roughen the surface mainly for the purpose of improving the slipperiness at the time of element winding processing and facilitating the element winding processing.

Patent Document 1 discloses a biaxially-oriented polypropylene film for capacitor which has a thickness of 1 to 3 μm and in which the number of protrusions (Pa) present on the surface A per 0.1 mm², the number of protrusions (Pb) present on the surface B per 0.1 mm², 10-point average roughness (SRzA) of surface A, and 10-point average roughness (SRzB) of surface B satisfy predetermined relation when one surface of the film is denoted as surface A and the other surface is denoted as surface B (see claim 1).

Patent Document 1 describes that the biaxially-oriented polypropylene film for capacitor has excellent processing suitability although the film is a thin film and exerts high dielectric strength even under a wide range of ambient temperature conditions from a low temperature (−40° C.) to a high temperature (150° C.) as an effect of the biaxially-oriented polypropylene film for capacitor having the above-mentioned configuration (see paragraph[0023]). With regard to the processing suitability, it is specifically described that the occurrence rates of wrinkling and shift are low when the element winding processing is performed (see paragraphs [0122] and [0123]).

Moreover, Patent Document 2 discloses a biaxially-oriented polypropylene film in which both surfaces of the film are provided with protrusions, the heights (PhZ) of most protrusions among the protrusions on each surface are 100 nm or more and less than 400 nm on both surfaces and the number of protrusions (Pc) per 0.1 mm² on each surface is 150 or more and less than 500 on both surfaces (see claim 1).

Patent Document 2 describes that the biaxially-oriented polypropylene film has high dielectric strength, suitable element processability, and excellent squealing characteristics particularly in the applications of AC voltage capacitors since the film has a surface with a large number of low-height protrusions on both surfaces of the film as an effect of the biaxially-oriented polypropylene film having the above-mentioned configuration (see paragraph[0025]). With regard to the element processability, it is specifically described that the occurrence rates of wrinkling and shift are low when the element winding processing is performed (see paragraphs [0098] and [0099]).

PRIOR ART DOCUMENT

Patent Documents

Patent Document 1: WO 2013/146367
Patent Document 2: WO 2012/002123

SUMMARY OF THE INVENTION

Problems to be Solved by the Invention

There is a step of winding a polypropylene film for capacitor into a roll in the production process even before subjecting the film to element winding in order to fabricate a capacitor. Specifically, in the step of biaxially stretching an unstretched cast sheet, the polypropylene film after being biaxially stretched is once wound into a roll. Furthermore, the polypropylene film wound into a roll in the above step is then rewound (unrolled), a metal layer such as a vapor-deposited film or the like is formed on one surface of the polypropylene film, and the polypropylene film is wound again.

<First Object>

The present inventors have diligently carried out investigations on polypropylene films for capacitor. As a result, it has been found out that there is a case in which the vapor-deposited surface and the non-vapor-deposited surface are blocked and the film wrinkles in the machine direction when the film on which a metal layer is formed is rewound even in the case of using a polypropylene film having a roughened surface in order to improve the slipperiness at the time of element winding processing. Incidentally, in the present description, blocking means that the upper polypropylene film and the lower polypropylene film which are wound and in contact with each other come closer to each other by the pressure generated by winding, and the like.

The first present invention has been devised in light of the above-mentioned problem, and it is an object of the first present invention to provide a polypropylene film which is capable of suppressing blocking in a rolled metal layer-integrated polypropylene film. It is another object of the first present invention to provide a metal layer-integrated polypropylene film including the polypropylene film, a film capacitor including the metal layer-integrated polypropylene film, and a film roll in which the polypropylene film is wound into a roll.

<Second Object>

The present inventors have diligently carried out investigations on polypropylene films for capacitor. As a result, it has been found out that there is a case in which the vapor-deposited surface and the non-vapor-deposited surface are blocked and the film wrinkles in the machine direction when the film on which a metal layer is formed is rewound even in the case of using a polypropylene film having a roughened surface in order to improve the slipperiness at the time of element winding processing. Incidentally, in the present description, blocking means that the upper polypropylene film and the lower polypropylene film which are wound and in contact with each other come closer to each other by the pressure generated by winding, and the like. It has also been found out that there is a case in which the end surface shift (the shift length when the film meanders left and right at the time of winding and the end surfaces of small roll are unmatched) increases when the polypropylene film is subjected to slit processing as metal vapor deposition winding.

The second present invention has been devised in light of the above-mentioned problem, and it is an object of the second present invention to provide a polypropylene film which is capable of suppressing blocking in a rolled metal layer-integrated polypropylene film. It is another object of the second present invention to provide a metal layer-integrated polypropylene film including the polypropylene film, a film capacitor including the metal layer-integrated polypropylene film, and a film roll in which the polypropylene film is wound into a roll. Moreover, the second present invention still more preferably provides a polypropylene film having excellent processability in the slitting step, a metal layer-integrated polypropylene film including the polypropylene film, a film capacitor including the metal layer-integrated polypropylene film, and a film roll in which the polypropylene film is wound into a roll in addition to the objects described above.

<Third Object>

The present inventors have diligently carried out investigations on polypropylene films for capacitor. As a result, it has been found out that there is a case in which the vapor-deposited surface and the non-vapor-deposited surface are blocked and the film wrinkles in the machine direction when the film on which a metal layer is formed is rewound even in the case of using a polypropylene film having a roughened surface in order to improve the slipperiness at the time of element winding processing. Incidentally, in the present description, blocking means that the upper polypropylene film and the lower polypropylene film which are wound and in contact with each other come closer to each other by the pressure generated by winding, and the like.

The third present invention has been devised in light of the above-mentioned problem, and it is an object of the third present invention to provide a polypropylene film which is capable of suppressing blocking in a rolled metal layer-integrated polypropylene film. It is another object of the third present invention to provide a metal layer-integrated polypropylene film including the polypropylene film, a film capacitor including the metal layer-integrated polypropylene film, and a film roll in which the polypropylene film is wound into a roll.

Means for Solving the Problems

<First Present Invention>

The present inventors have diligently carried out investigations on the above findings in order to achieve the first object. As a result, the present inventors have found out that it is possible to suppress blocking in a rolled polypropylene film by adopting the following constitution, and completed the first present invention.

The polypropylene film according to the first present invention is a polypropylene film having a first surface and a second surface, in which the polypropylene film contains a polypropylene resin as a main component;

a Svk value ($Svk_A$) of the first surface is 0.005 μm or more and 0.030 μm or less;

a Spk value ($Spk_A$) of the first surface is more than 0.035 μm and 0.080 μm or less;

a Svk value ($Svk_B$) of the second surface is 0.005 μm or more and 0.030 μm or less; and a Spk value ($Spk_B$) of the second surface is 0.015 μm or more and 0.035 μm or less.

Here, the Svk value and the Spk value are parameters defined by the surface quality parameter (ISO 25178-2: 2007). The Svk value refers to the average height of the protruding valley portions below the curve attained by removing the protruding hill portions and the protruding valley portions from the bearing curve. The Spk value refers to the average height of the protruding hill portions above the curve attained by removing the protruding hill portions and the protruding valley portions from the bearing curve.

The polypropylene film includes a metal layer formed on either or both of the first surface and the second surface, and the first surface and the second surface are in contact with each other in a state in which the metal layer formed thereon when the polypropylene film is wound. According to the configuration, the Spk value ($Spk_A$) of the first surface, the Spk value ($Spk_A$) of the first surface, the Svk value ($Svk_B$) of the second surface, and the Spk value ($Spk_B$) of the second surface are within the numerical ranges and both surfaces of the polypropylene film are roughened. In addition, on the assumption that both surfaces are roughened, the degrees of roughening are different from each other within the numerical ranges. Hence, the contact area between the first surface and the second surface when the polypropylene film is wound decreases, the gaps between the first surface and the second surface due to moderate coarse protrusions can be maintained, and excellent cushioning property is exhibited. As a result, it is possible to suppress blocking as can be seen from Examples as well.

In addition, the polypropylene film is generally wound by using a plurality of conveying rolls while applying tension to the polypropylene film in order not to cause wrinkling and meandering. Therefore, not only one surface touches the conveying rolls, but the winding is performed while both surfaces touch one of the conveying rolls.

According to the configuration, both surfaces of the polypropylene film are roughened and thus the slipperiness with respect to the conveying rolls is suitable on both surfaces when the polypropylene film after being biaxially stretched is wound into a roll. As a result, suitable conveying property is attained, wrinkling and winding shift are suppressed, and the element winding processability is improved.

Here, it is preferred that the degree of roughening of the first surface is about equal to that of the second surface when only the conveying property is taken into consideration. However, it is preferred that the degree of roughening of the first surface is different from that of the second surface when the dielectric strength is taken into consideration. Hereinafter, this point will be described.

In general, the thickness of the film is such that the apex of the convex portion is the end portion of the thickness in a case in which there are irregularities on the surface. In other words, in a case in which there are irregularities on both the first surface and the second surface, the distance from the apex of the convex portion present on the first surface to the apex of the convex portion present on the second surface is the film thickness.

Here, the thickness of the core portion is the thickness attained by subtracting the height of the convex portion of the first surface and the height of the convex portion of the second surface. Hence, when a polypropylene film of which both surfaces are roughened is fabricated, the thickness of the core portion is thin, a leakage current is likely to be generated, and the dielectric strength decreases.

Consequently, the first present invention is configured to moderately roughen both surfaces by setting (1) the Svk value ($Svk_A$) of the first surface and the Svk value ($Svk_B$) of the second surface to be about the same, namely, the depths of the valley portions to be about the same on the first surface and the second surface and to ensure the thickness of the core portion by setting (2) the Spk value ($Spk_B$) of the second surface to be smaller than the Spk value ($Spk_A$) of the first surface for the coarse protrusions. In this manner, the conveying property due to roughening is exhibited while the dielectric strength is maintained.

As described above, according to the first present invention, it is possible to suppress blocking and further to achieve both the conveying property and dielectric strength.

A polypropylene film having the configuration is preferably for use in capacitor.

A polypropylene film in which the Spk value ($Spk_A$) of the first surface, the Spk value ($Spk_A$) of the first surface, the Svk value ($Svk_B$) of the second surface, and the Spk value ($Spk_B$) of the second surface are within the numerical ranges can suppress blocking, further has both conveying property and dielectric strength, and thus can be suitably used for capacitors.

A polypropylene film having the configuration is preferably biaxially stretched.

When the polypropylene film is biaxially stretched, it is easy to fabricate a polypropylene film in which the Spk value ($Spk_A$) of the first surface, the Spk value ($Spk_A$) of the first surface, the Svk value ($Svk_B$) of the second surface, and the Spk value ($Spk_B$) of the second surface are within the numerical ranges.

In the polypropylene film having the configuration, it is preferred that the ratio $Sq_B/Sq_A$ of the Sq value ($Sq_B$) of the second surface to the Sq value ($Sq_A$) of the first surface is 0.4 to 1.0.

Here, the Sq value is a parameter defined by a surface quality parameter (ISO 25178-2: 2007) and is the value of the root mean square of the height data in the defined region.

When the ratio $Sq_B/Sq_A$ is 0.4 to 1.0, blocking after the formation of metal layer can be suppressed while the dielectric breakdown strength is maintained. As a result, it is preferred since it leads to suppression of wrinkling at the time of feeding in the subsequent slitting step.

In the polypropylene film having the configuration, it is preferred that the ratio $Sa_B/Sa_A$ of the Sa value ($Sa_B$) of the second surface to the Sa value ($Sa_A$) of the first surface is 0.6 to 1.0.

Here, the Sa value is a parameter defined by a surface quality parameter (ISO 25178-2: 2007) and is the arithmetic mean value of the absolute values of the height data in the defined region.

When the ratio $Sa_B/Sa_A$ is 0.6 to 1.0, the amounts of air associated with the run of film become closer to each other on the front and back. As a result, it is preferred since meandering of the film is suppressed and this leads to suppression of end surface shift of small roll in the slitting step of the metal layer-integrated film.

In the polypropylene film having the configuration, it is preferred that the polypropylene resin contains a linear polypropylene resin A having a difference (a difference when a differential distribution value when Log (M)=6.0 is 100% (basis), hereinafter also referred to as "differential distribution value difference $D_M$") of 8.0% or more attained by subtracting a differential distribution value when a logarithmic molecular weight Log(M)=6.0 from a differential distribution value when a logarithmic molecular weight Log(M)=4.5 in a molecular weight differential distribution curve;

a linear polypropylene resin B having a difference (differential distribution value difference $D_M$) of less than 8.0% attained by subtracting a differential distribution value when a logarithmic molecular weight Log(M)=6.0 from a differential distribution value when a logarithmic molecular weight Log(M)=4.5 in a molecular weight differential distribution curve; and a long-chain branched polypropylene resin C polymerized using a metallocene catalyst.

To contain the linear polypropylene resin A and linear polypropylene resin B which have different differential distribution values from each other means to contain two kinds of linear polypropylene resins in which the quantitative relation between the higher molecular weight component and the lower molecular weight component are different from each other. Therefore, the nonoriented polypropylene film (cast sheet) containing the linear polypropylene resin A and the linear polypropylene resin B is in a finely mixed state (phase separated state). It is considered that the dielectric strength at high temperatures is improved as compared with a case in which one kind of linear polypropylene resin is used singly since the arrangement of the resin components constituting the film is complicated by stretching such a nonoriented polypropylene film.

In addition, the present inventors have discovered that a large amount of β crystal is formed in the specific cast sheet when the long-chain branched polypropylene resin C polymerized using a metallocene catalyst is contained. Moreover, the present inventors have discovered that the β crystal is transformed into α crystal by stretching the cast sheet containing the β crystal, thus (substantially) arc-shaped irregularities are formed on the polypropylene film obtained by stretching due to the difference in density between the β crystal and the α crystal, and the surface can be suitably roughened.

Incidentally, by containing the long-chain branched polypropylene resin C polymerized using a metallocene catalyst as well as containing the linear polypropylene resin A and linear polypropylene resin B which have different differential distribution values from each other, it is possible to improve the dielectric strength of the oriented film by the complicated arrangement of the resin components constituting the film, to form finer (substantially) arc-shaped irregularities, and to realize more suitable roughening.

In this manner, when the polypropylene film contains the linear polypropylene resin A, the linear polypropylene resin B, and the long-chain branched polypropylene resin C, it is possible to realize more suitable roughening while achieving more suitable dielectric strength at high temperatures.

Incidentally, when a long-chain branched polypropylene resin obtained through crosslinking modification by a peroxide is used instead of the long-chain branched polypropylene resin C polymerized using a metallocene catalyst, the α crystal formation is promoted in the cast sheet and the β crystal formation is greatly suppressed by the α crystal nucleation effect of the long-chain branched polypropylene resin obtained through crosslinking modification by a peroxide. Even when the cast sheet containing α crystal is stretched, the transfer of crystallites does not occur and thus irregularities are hardly formed. Hence, in order to roughen the polypropylene film, the long-chain branched polypropylene resin C polymerized using a metallocene catalyst is suitable.

In addition, the metal layer-integrated polypropylene film according to the first present invention includes
the polypropylene film; and
a metal layer stacked on either surface or both surfaces of the polypropylene film.

According to the configuration, the film includes a metal layer stacked on either surface or both surfaces of the polypropylene film and thus can be used in a film capacitor including a polypropylene film as a dielectric and a metal layer as an electrode. In addition, blocking in the polypropylene film is suppressed, further both conveying property and dielectric strength are achieved, and thus the metal layer-integrated polypropylene film including the polypropylene film can be suitably produced and has dielectric strength.

In addition, the film capacitor according to the first present invention includes the metal layer-integrated polypropylene film that is wound or has a configuration in which a plurality of the metal layer-integrated polypropylene films are stacked.

In addition, in the film roll according to the first present invention, the polypropylene film is wound into a roll.

The first present invention has been described above.

<Second Present Invention>

The present inventors have diligently carried out investigations on the above findings in order to achieve the second object. As a result, the present inventors have found out that it is possible to suppress blocking in a rolled polypropylene film by adopting the following constitution, and completed the second present invention. In addition, it has been found out that the processability in the slitting step is also excellent as a preferred case by adopting the following configuration.

The polypropylene film according to the second present invention is a polypropylene film having a first surface and a second surface, in which
the polypropylene film contains a polypropylene resin as a main component;
a ratio $Spk_B/Spk_A$ of a Spk value ($Spk_B$) of the second surface to a Spk value ($Spk_A$) of the first surface is 0.490 or more and 0.730 or less, and
a ratio $Svk_B/Svk_A$ of a Svk value ($Svk_B$) of the second surface to a Svk value ($Svk_A$) of the first surface is 0.735 or more and 1.250 or less.

Here, the Svk value and the Spk value are parameters defined by the surface quality parameter (ISO 25178-2: 2007). The Svk value refers to the average height of the protruding valley portions below the curve attained by removing the protruding hill portions and the protruding valley portions from the bearing curve. The Spk value refers to the average height of the protruding hill portions above the curve attained by removing the protruding hill portions and the protruding valley portions from the bearing curve.

The polypropylene film includes a metal layer formed on either or both of the first surface and the second surface, and the first surface and the second surface are in contact with each other in a state in which the metal layer formed thereon when the polypropylene film is wound. According to the configuration, the ratios attained using the Spk value ($Spk_A$) of the first surface, the Spk value ($Spk_A$) of the first surface, the Svk value ($Svk_B$) of the second surface, and the Spk value ($Spk_B$) of the second surface are within the numerical ranges and the degrees of surface roughening are different from each other within the numerical ranges. Hence, the contact area between the first surface and the second surface when the polypropylene film is wound decreases, the gaps between the first surface and the second surface due to moderate coarse protrusions can be maintained, and excellent cushioning property is exhibited. As a result, it is possible to suppress blocking as can be seen from Examples as well. In addition, according to the configuration, the processability in the slitting step is also excellent as a preferred case.

In addition, the polypropylene film is generally wound by using a plurality of conveying rolls while applying tension to the polypropylene film in order not to cause wrinkling and meandering. Therefore, not only one surface touches the conveying rolls, but the winding is performed while both surfaces touch one of the conveying rolls.

According to the configuration, both surfaces of the polypropylene film are roughened to about an equal degree and thus the slipperiness with respect to the conveying rolls is suitable on both surfaces when the polypropylene film after being biaxially stretched is wound into a roll. As a result, suitable conveying property is attained, wrinkling and winding shift are suppressed, and the element winding processability is improved.

Here, it is preferred that the degree of roughening of the first surface is about equal to that of the second surface when only the conveying property is taken into consideration. However, it is preferred that the degree of roughening of the first surface is different from that of the second surface when the dielectric strength is taken into consideration. Hereinafter, this point will be described.

In general, the thickness of the film is such that the apex of the convex portion is the end portion of the thickness in a case in which there are irregularities on the surface. In other words, in a case in which there are irregularities on both the first surface and the second surface, the distance from the apex of the convex portion present on the first surface to the apex of the convex portion present on the second surface is the film thickness.

Here, the thickness of the core portion is the thickness attained by subtracting the height of the convex portion of the first surface and the height of the convex portion of the second surface. Hence, when a polypropylene film of which both surfaces are roughened is fabricated, the thickness of the core portion is thin, a leakage current is likely to be generated, and the dielectric strength decreases.

Consequently, the second present invention is configured to set (1) the Svk value ($Svk_A$) of the first surface and the Svk value ($Svk_B$) of the second surface to be about the same, namely, the depths of the valley portions to be about the same on the first surface and the second surface and to ensure the thickness of the core portion by setting (2) the Spk value ($Spk_B$) of the second surface to be smaller than the Spk value ($Spk_A$) of the first surface for the coarse protrusions. In this manner, the conveying property due to roughening is exhibited while the dielectric strength is maintained.

As described above, according to the second present invention, it is possible to suppress blocking and further to achieve all the processability in the slitting step, conveying property, and dielectric strength.

A polypropylene film having the configuration is preferably for use in capacitor.

A polypropylene film in which the Spk value ($Spk_A$) of the first surface, the Spk value ($Spk_A$) of the first surface, the Svk value ($Svk_B$) of the second surface, and the Spk value ($Spk_B$) of the second surface are within the numerical ranges can suppress blocking, further has all the processability in the slitting step, conveying property, and dielectric strength, and thus can be suitably used for capacitors.

A polypropylene film having the configuration is preferably biaxially stretched.

When the polypropylene film is biaxially stretched, it is easy to fabricate a polypropylene film in which the Spk value ($Spk_A$) of the first surface, the Spk value ($Spk_A$) of the first surface, the Svk value ($Svk_B$) of the second surface, and the Spk value ($Spk_B$) of the second surface are within the numerical ranges.

In the polypropylene film having the configuration, it is preferred that the ratio $Sq_B/Sq_A$ of the Sq value ($Sq_B$) of the second surface to the Sq value ($Sq_A$) of the first surface is 0.4 to 1.0.

Here, the Sq value is a parameter defined by a surface quality parameter (ISO 25178-2: 2007) and is the value of the root mean square of the height data in the defined region.

When the ratio $Sq_B/Sq_A$ is 0.4 to 1.0, blocking after the formation of metal layer can be suppressed while the dielectric breakdown strength is maintained. As a result, it is preferred since it leads to suppression of wrinkling at the time of feeding in the subsequent slitting step.

In the polypropylene film having the configuration, it is preferred that the ratio $Sa_B/Sa_A$ of the Sa value ($Sa_B$) of the second surface to the Sa value ($Sa_A$) of the first surface is 0.6 to 1.0.

Here, the Sa value is a parameter defined by a surface quality parameter (ISO 25178-2: 2007) and is the arithmetic mean value of the absolute values of the height data in the defined region.

When the ratio $Sa_B/Sa_A$ is 0.6 to 1.0, the amounts of air associated with the run of film become closer to each other on the front and back. As a result, it is preferred since meandering of the film is suppressed and this leads to suppression of end surface shift of small roll in the slitting step of the metal layer-integrated film.

In the polypropylene film having the configuration,
it is preferred that the polypropylene resin contains
a linear polypropylene resin A having a difference (a difference when a differential distribution value when Log (M)=6.0 is 100% (basis), hereinafter also referred to as "differential distribution value difference $D_M$") of 8.0% or more attained by subtracting a differential distribution value when a logarithmic molecular weight Log(M)=6.0 from a differential distribution value when a logarithmic molecular weight Log(M)=4.5 in a molecular weight differential distribution curve;
a linear polypropylene resin B having a difference (differential distribution value difference $D_M$) of less than 8.0% attained by subtracting a differential distribution value when a logarithmic molecular weight Log (M)=6.0 from a differential distribution value when a logarithmic molecular weight Log(M)=4.5 in a molecular weight differential distribution curve; and
a long-chain branched polypropylene resin C polymerized using a metallocene catalyst.

To contain the linear polypropylene resin A and linear polypropylene resin B which have different differential distribution values from each other means to contain two kinds of linear polypropylene resins in which the quantitative relation between the higher molecular weight component and the lower molecular weight component are different from each other. Therefore, the nonoriented polypropylene film (cast sheet) containing the linear polypropylene resin A and the linear polypropylene resin B is in a finely mixed state (phase separated state). It is considered that the dielectric strength at high temperatures is improved as compared with a case in which one kind of linear polypropylene resin is used singly since the arrangement of the resin components constituting the film is complicated by stretching such a nonoriented polypropylene film.

In addition, the present inventors have discovered that a large amount of β crystal is formed in the specific cast sheet when the long-chain branched polypropylene resin C polymerized using a metallocene catalyst is contained. Moreover, the present inventors have discovered that the β crystal is transformed into α crystal by stretching the cast sheet containing the β crystal, thus (substantially) arc-shaped irregularities are formed on the polypropylene film obtained by stretching due to the difference in density between the β crystal and the α crystal, and the surface can be suitably roughened.

Incidentally, by containing the long-chain branched polypropylene resin C polymerized using a metallocene catalyst as well as containing the linear polypropylene resin A and linear polypropylene resin B which have different differential distribution values from each other, it is possible to improve the dielectric strength of the oriented film by the complicated arrangement of the resin components constituting the film, to form finer (substantially) arc-shaped irregularities, and to realize more suitable roughening.

In this manner, when the polypropylene film contains the linear polypropylene resin A, the linear polypropylene resin B, and the long-chain branched polypropylene resin C, it is possible to realize more suitable roughening while achieving more suitable dielectric strength at high temperatures.

Incidentally, when a long-chain branched polypropylene resin obtained through crosslinking modification by a peroxide is used instead of the long-chain branched polypropylene resin C polymerized using a metallocene catalyst, the α crystal formation is promoted in the cast sheet and the β crystal formation is greatly suppressed by the α crystal nucleation effect of the long-chain branched polypropylene resin obtained through crosslinking modification by a peroxide. Even when the cast sheet containing α crystal is stretched, the transfer of crystallites does not occur and thus irregularities are hardly formed. Hence, in order to roughen the polypropylene film, the long-chain branched polypropylene resin C polymerized using a metallocene catalyst is suitable.

In addition, the metal layer-integrated polypropylene film according to the second present invention includes
the polypropylene film; and
a metal layer stacked on either surface or both surfaces of the polypropylene film.

According to the configuration, the film includes a metal layer stacked on either surface or both surfaces of the polypropylene film and thus can be used in a film capacitor including a polypropylene film as a dielectric and a metal layer as an electrode. In addition, blocking in the polypropylene film is suppressed, further all the processability in the slitting step, conveying property, and dielectric strength are achieved, and thus the metal layer-integrated polypropylene film including the polypropylene film can be suitably produced and has dielectric strength.

In addition, the film capacitor according to the second present invention includes the metal layer-integrated polypropylene film that is wound or has a configuration in which a plurality of the metal layer-integrated polypropylene films are stacked.

In addition, in the film roll according to the second present invention, the polypropylene film is wound into a roll.

The second present invention has been described above.

<Third Present Invention>

The present inventors have diligently carried out investigations on the above findings in order to achieve the third object. As a result, the present inventors have found out that it is possible to suppress blocking in a rolled polypropylene film by adopting the following constitution, and completed the third present invention.

The polypropylene film according to the third present invention is a polypropylene film having a first surface and a second surface, in which the polypropylene film contains a polypropylene resin as a main component;

an ellipse density $D_A$ on the first surface is 85 to 120 pieces/mm$^2$; and an ellipse density $D_B$ on the second surface is 1 to 12 pieces/mm$^2$.

Both surfaces of the polypropylene film are roughened by crater-like fine irregularities. FIG. 1(a) is a perspective view schematically illustrating crater-like fine irregularities, FIG. 1(b) is a cross-sectional view of the crater-like fine irregularities, and FIG. 1(c) is a vertical cross-sectional view taken along line I-I' in FIG. 1(b). Incidentally, FIG. 1(a) to FIG. 1(c) are schematic views for explaining an "ellipse" but do not illustrate the surface shape of the polypropylene film or the like according to Examples to be described later.

Most of the crater-like fine irregularities are observed as two arc shapes or substantially arc shapes (hereinafter, the arc shape and the substantially arc shape are collectively referred to as "(substantially) arc shape") which form a pair of curves which are curved in opposite directions under, for example, an optical microscope. In a case in which two (substantially) arc-shaped parts forming an observed pair are complemented (interpolated) and connected, the two parts form an elliptical shape or a substantially elliptical shape (hereinafter, the elliptical shape and the substantially elliptical shape are collectively referred to as "(substantially) elliptical shape").

These two (substantially) arc-shaped parts forming a pair form a protrusion and a recess between the protrusions (see FIG. 1(a)). These protrusions and recesses form the crater-like fine irregularities (see FIGS. 1(b) and 1(c)). Incidentally, the two (substantially) arc shapes may be combined to form a circular shape, a substantially circular shape (hereinafter, the circular shape and the substantially circular shape are collectively referred to as "(substantially) circular shape"), or a (substantially) elliptical shape. The cross section of the protrusion in this case becomes a circular ring or a substantially circular ring (hereinafter, the circular ring and the substantially circular ring are collectively referred to as "(substantially) circular ring") or an elliptical ring or a substantially elliptical ring (hereinafter, the elliptical ring and the substantially elliptical ring are collectively referred to as "(substantially) elliptical ring"). In addition, the arc-shaped parts are observed as a single (substantially) arc shape without forming a pair in some cases.

The ellipse density refers to the total number of the following (X) and (Y) observed using a digital scope (for example, Digital Microscope VHX-2000 available from Keyence Corporation) per unit area. Hereinafter, the shape of the following (X) and the shape of the following (Y) are also collectively referred to as "ellipse".

Incidentally, those satisfying S≤L and 1≤L≤300, where the length of one axis is denoted as L μm and the length of the other axis is denoted as S μm, are defined as "ellipses" to be considered when the ellipse density is calculated. Those that do not satisfy this are not considered when the ellipse density is calculated (not counted as "ellipses" when the ellipse density is calculated).

(X) A (substantially) circular shape or (substantially) elliptical shape formed by combining two (substantially) arc-shaped protrusions forming the above pair.

(Y) A (substantially) elliptical shape formed by interpolating and connecting the two (substantially) arc shapes forming the pair.

The ellipse density $D_A$ on the first surface is 85 to 120 pieces/mm$^2$ and the ellipse density $D_B$ on the second surface is 1 to 12 pieces/mm$^2$, thus the contact area between the first surface and the second surface when the polypropylene film is wound decreases, the gap between the first surface and the second surface can be maintained due to the difference in ellipse density, and excellent cushioning property is exhibited. As a result, it is possible to suppress blocking as can be seen from Examples as well.

In addition, the ellipse density $D_A$ on the first surface is 85 to 120 pieces/mm$^2$ and it can be said that the number of "ellipses" is relatively large. Hence, the surface is roughened to a greater degree. Meanwhile, the ellipse density $D_B$ on the second surface is 1 to 12 pieces/mm$^2$ and it can be said that the number of "ellipses" is relatively small. Hence, the degree of roughening is low although the surface is roughened.

It is possible to prevent the film from meandering to left and right in the slit processing and the end surfaces of small roll from being unmatched if the ellipse density $D_A$ on the first surface is set to 85 to 120 pieces/mm$^2$ and the ellipse density $D_B$ on the second surface is set to 1 to 12 pieces/mm$^2$ in this manner. As a result, it is possible to improve the processability in the slitting step as can be seen from Examples as well.

In addition, the polypropylene film is generally wound by using a plurality of conveying rolls while applying tension to the polypropylene film in order not to cause wrinkling and meandering. Therefore, not only one surface touches the conveying rolls, but the winding is performed while both surfaces touch one of the conveying rolls.

According to the polypropylene film, both surfaces of the polypropylene film are roughened and thus the slipperiness with respect to the conveying rolls is suitable on both surfaces when the polypropylene film after being biaxially stretched is wound into a roll. As a result, suitable conveying property is attained and wrinkling and winding shift are suppressed.

Specifically, the ellipse density $D_A$ on the first surface is 85 to 120 pieces/mm$^2$ and the ellipse density $D_B$ on the second surface is 1 to 12 pieces/mm$^2$, thus both surfaces of the polypropylene film are suitably roughened, and thus the slipperiness with respect to the conveying rolls is suitable on both surfaces when the polypropylene film after being biaxially stretched is wound into a roll. As a result, suitable conveying property is attained, wrinkling and winding shift are further suppressed, and the element winding processability is improved.

Here, it is preferred that the degree of roughening of the first surface is about equal to that of the second surface when only the conveying property is taken into consideration. However, it is preferred that the degree of roughening of the first surface is different from that of the second surface when the dielectric strength is taken into consideration. Generally, when the surface is roughened, thin parts (concave portions of irregularities) of the film cause leakage current. Hence, it is possible to diminish the number of irregularities that may cause leakage current if the ellipse density $D_B$ on the second surface is set to be lower than the ellipse density $D_A$ on the first surface. Specifically, it can be said that the number of irregularities that may cause leakage current is small when the ellipse density $D_B$ on the second surface is 1 to 12 pieces/mm². As a result, a configuration is attained in which more suitable conveying property due to roughening is exhibited while the dielectric strength is suitably maintained.

As described above, according to the third present invention, it is possible to suppress blocking and further to achieve all the processability in the slitting step, conveying property, and dielectric strength.

A polypropylene film having the configuration is preferably for use in capacitor.

A polypropylene film in which the ellipse density $D_A$ on the first surface is 85 to 120 pieces/mm² and the ellipse density $D_B$ on the second surface is 1 to 12 pieces/mm² can suppress blocking, further has all the processability in the slitting step, conveying property, and dielectric strength, and thus can be suitably used for capacitors.

A polypropylene film having the configuration is preferably biaxially stretched.

When the polypropylene film is biaxially stretched, it is easy to fabricate a polypropylene film in which the ellipse density $D_A$ on the first surface is 85 to 120 pieces/mm² and the ellipse density $D_B$ on the second surface is 1 to 12 pieces/mm².

In the polypropylene film having the configuration, it is preferred that the average major axis length $L_A$ of the ellipses constituting the ellipse density $D_A$ on the first surface is 20 to 80 μm and the average major axis length $L_B$ of the ellipses constituting the ellipse density $D_B$ on the second surface is 30 to 100 μm.

The average major axis length $L_A$ is an average value of major axes of the "ellipses" observed in the measurement of the ellipse density $D_A$.

The average major axis length $L_B$ is an average value of major axes of the "ellipses" observed in the measurement of the ellipse density $D_B$.

When the average major axis length $L_A$ of the ellipses constituting the ellipse density $D_A$ on the first surface is 20 to 80 μm, it is easy to set the ellipse density $D_A$ on the first surface to be within the numerical range. In addition, when the average major axis length $L_B$ of the ellipses constituting the ellipse density $D_B$ on the second surface is 30 to 100 μm, it is easy to set the ellipse density $D_B$ on the second surface to be within the numerical range.

In the polypropylene film having the configuration, it is preferred that the ratio $Sq_B/Sq_A$ of the Sq value ($Sq_B$) of the second surface to the Sq value ($Sq_A$) of the first surface is 0.4 to 1.0.

Here, the Sq value is a parameter defined by a surface quality parameter (ISO 25178-2: 2007) and is the value of the root mean square of the height data in the defined region.

When the ratio $Sq_B/Sq_A$ is 0.4 to 1.0, blocking after the formation of metal layer can be suppressed while the dielectric breakdown strength is maintained. As a result, it is preferred since it leads to suppression of wrinkling at the time of feeding in the subsequent slitting step.

In the polypropylene film having the configuration, it is preferred that the ratio $Sa_B/Sa_A$ of the Sa value ($Sa_B$) of the second surface to the Sa value ($Sa_A$) of the first surface is 0.6 to 1.0.

Here, the Sa value is a parameter defined by a surface quality parameter (ISO 25178-2: 2007) and is the arithmetic mean value of the absolute values of the height data in the defined region.

When the ratio $Sa_B/Sa_A$ is 0.6 to 1.0, the amounts of air associated with the run of film become closer to each other on the front and back. As a result, it is preferred since meandering of the film is suppressed and this leads to suppression of end surface shift of small roll in the slitting step of the metal layer-integrated film.

In the polypropylene film having the configuration, it is preferred that the polypropylene resin contains a linear polypropylene resin A having a difference (a difference when a differential distribution value when Log (M)=6.0 is 100% (basis), hereinafter also referred to as "differential distribution value difference $D_M$") of 8.0% or more attained by subtracting a differential distribution value when a logarithmic molecular weight Log(M)=6.0 from a differential distribution value when a logarithmic molecular weight Log(M)=4.5 in a molecular weight differential distribution curve;

a linear polypropylene resin B having a difference (differential distribution value difference $D_M$) of less than 8.0% attained by subtracting a differential distribution value when a logarithmic molecular weight Log (M)=6.0 from a differential distribution value when a logarithmic molecular weight Log(M)=4.5 in a molecular weight differential distribution curve; and a long-chain branched polypropylene resin C polymerized using a metallocene catalyst.

To contain the linear polypropylene resin A and linear polypropylene resin B which have different differential distribution values from each other means to contain two kinds of linear polypropylene resins in which the quantitative relation between the higher molecular weight component and the lower molecular weight component are different from each other. Therefore, the nonoriented polypropylene film (cast sheet) containing the linear polypropylene resin A and the linear polypropylene resin B is in a finely mixed state (phase separated state). It is considered that the dielectric strength at high temperatures is improved as compared with a case in which one kind of linear polypropylene resin is used singly since the arrangement of the resin components constituting the film is complicated by stretching such a nonoriented polypropylene film.

In addition, the present inventors have discovered that a large amount of β crystal is formed in the specific cast sheet when the long-chain branched polypropylene resin C polymerized using a metallocene catalyst is contained. Moreover, the present inventors have discovered that the β crystal is transformed into α crystal by stretching the cast sheet containing the β crystal, thus (substantially) arc-shaped irregularities are formed on the polypropylene film obtained by stretching due to the difference in density between the β crystal and the α crystal, and the surface can be suitably roughened.

Incidentally, by containing the long-chain branched polypropylene resin C polymerized using a metallocene catalyst as well as containing the linear polypropylene resin A and linear polypropylene resin B which have different differential distribution values from each other, it is possible to improve the dielectric strength of the oriented film by the complicated arrangement of the resin components constituting the film, to form finer (substantially) arc-shaped irregularities, and to realize more suitable roughening.

In this manner, when the polypropylene film contains the linear polypropylene resin A, the linear polypropylene resin B, and the long-chain branched polypropylene resin C, it is possible to realize more suitable roughening while achieving more suitable dielectric strength at high temperatures.

Incidentally, when a long-chain branched polypropylene resin obtained through crosslinking modification by a peroxide is used instead of the long-chain branched polypropylene resin C polymerized using a metallocene catalyst, the α crystal formation is promoted in the cast sheet and the β crystal formation is greatly suppressed by the α crystal nucleation effect of the long-chain branched polypropylene resin obtained through crosslinking modification by a peroxide. Even when the cast sheet containing α crystal is stretched, the transfer of crystallites does not occur and thus irregularities are hardly formed. Hence, in order to roughen the polypropylene film, the long-chain branched polypropylene resin C polymerized using a metallocene catalyst is suitable.

In addition, the metal layer-integrated polypropylene film according to the third present invention includes the polypropylene film; and a metal layer stacked on either surface or both surfaces of the polypropylene film.

According to the configuration, the film includes a metal layer stacked on either surface or both surfaces of the polypropylene film and thus can be used in a film capacitor including a polypropylene film as a dielectric and a metal layer as an electrode. In addition, blocking in the polypropylene film is suppressed, further all the processability in the slitting step, conveying property, and dielectric strength are achieved, and thus the metal layer-integrated polypropylene film including the polypropylene film can be suitably produced and has dielectric strength.

In addition, the film capacitor according to the third present invention includes the metal layer-integrated polypropylene film that is wound or has a configuration in which a plurality of the metal layer-integrated polypropylene films are stacked.

In addition, in the film roll according to the third present invention, the polypropylene film is wound into a roll.

The third present invention has been described above.

Effect of the Invention

According to the first present invention, it is possible to provide a polypropylene film which is capable of suppressing blocking in a rolled metal layer-integrated polypropylene film. It is also possible to provide a metal layer-integrated polypropylene film including the polypropylene film, a film capacitor including the metal layer-integrated polypropylene film, and a film roll in which the polypropylene film is wound into a roll.

According to the second present invention, it is possible to provide a polypropylene film which is capable of suppressing blocking in a rolled metal layer-integrated polypropylene film. It is also possible to provide a metal layer-integrated polypropylene film including the polypropylene film and a film capacitor including the metal layer-integrated polypropylene film. Moreover, according to the second present invention, it is possible to still more preferably provide a polypropylene film having excellent processability in the slitting step, a metal layer-integrated polypropylene film including the polypropylene film, and a film capacitor including the metal layer-integrated polypropylene film in addition to the objects described above.

According to the third present invention, it is possible to provide a polypropylene film which is capable of suppressing blocking in a rolled metal layer-integrated polypropylene film. It is also possible to provide a metal layer-integrated polypropylene film including the polypropylene film, a film capacitor including the metal layer-integrated polypropylene film, and a film roll in which the polypropylene film is wound into a roll.

MODE FOR CARRYING OUT THE INVENTION

Figure 1:
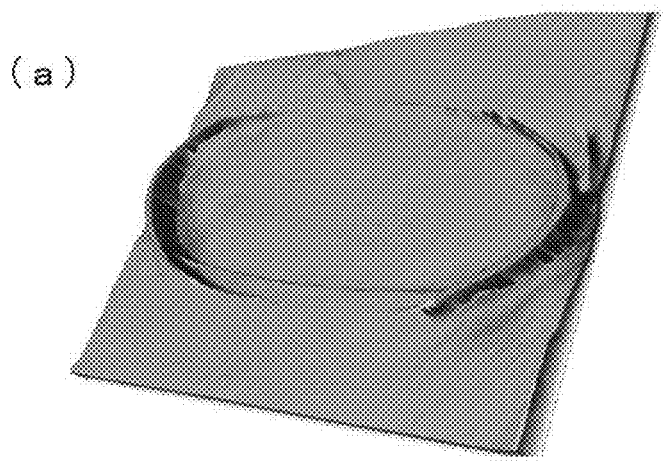
FIG. 1(a) is a perspective view schematically illustrating crater-like fine irregularities.
FIG. 1(b) is a cross-sectional view of the crater-like fine irregularities.
FIG. 1(c) is a vertical cross-sectional view taken along line I-I' in FIG. 1(b).
Figure 1:
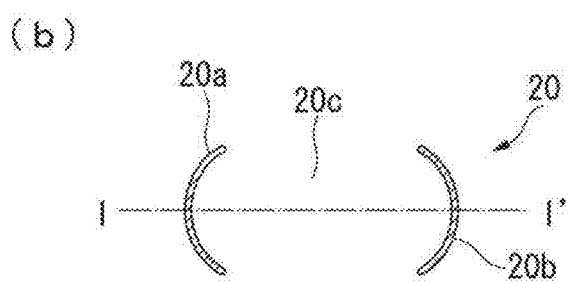
Figure 1:
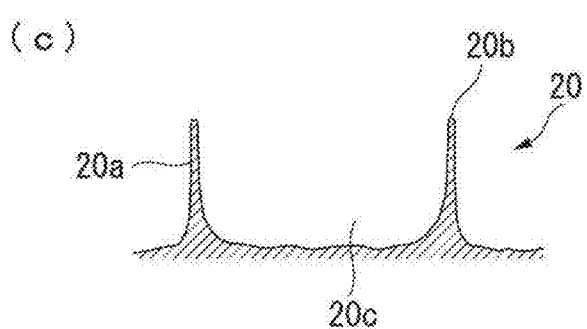

Hereinafter, embodiments of the present invention (first present invention, second present invention, and third present invention) will be described. It is to be noted that the present invention (first present invention, second present invention, and third present invention) is not limited only to these embodiments.

In the present description, the expressions "containing" and "including" include the concepts of "containing", "including", "consisting substantially of" and "consisting only of".

In the present description, the terms "element", "capacitor", "capacitor element", and "film capacitor" mean the same one.

The biaxially-oriented polypropylene film of the embodiments of the present invention (first present invention, second present invention, and third present invention) is not a microporous film and thus does not have a large number of pores.

The biaxially-oriented polypropylene film of the embodiments of the present invention (first present invention, second present invention, and third present invention) may be formed of two or more layers but is preferably formed of one layer.

Embodiment According to First Present Invention

Hereinafter, an embodiment of the first present invention will be described.

The polypropylene film according to an embodiment (hereinafter, also referred to as "first embodiment") according to the first present invention is a polypropylene film contains a polypropylene resin as a main component, and
in the polypropylene film
the Svk value ($Svk_A$) of the first surface is 0.005 μm or more and 0.030 μm or less, the Spk value ($Spk_A$) of the first surface is more than 0.035 μm and 0.080 μm or less, the Svk value ($Svk_B$) of the second surface is 0.005 μm or more and 0.030 μm or less, and the Spk value ($Spk_B$) of the second surface is 0.015 μm or more and 0.035 μm or less.

The Svk value ($Svk_A$) of the first surface is preferably 0.007 μm or more and 0.025 μm or less, more preferably 0.008 μm or more and 0.020 μm or less, further preferably 0.009 μm or more and 0.015 μm or less.

The Spk value ($Spk_A$) of the first surface is preferably 0.040 μm or more and 0.075 μm or less, more preferably 0.043 μm or more and 0.060 μm or less, further preferably 0.045 μm or more and 0.055 μm or less.

The Svk value ($Svk_B$) of the second surface is preferably 0.007 μm or more and 0.025 μm or less, more preferably 0.008 μm or more and 0.020 μm or less, further preferably 0.009 μm or more and 0.015 μm or less.

The Spk value ($Spk_B$) of the second surface is preferably 0.017 μm or more and 0.033 μm or less, more preferably 0.018 μm or more and 0.030 μm or less, further preferably 0.020 μm or more and 0.025 μm or less.

The polypropylene film includes a metal layer formed on either or both of the first surface and the second surface, and the first surface and the second surface are in contact with each other in a state in which the metal layer formed thereon when the polypropylene film is wound. According to the polypropylene film, the Spk value ($Spk_A$) of the first surface, the Spk value ($Spk_A$) of the first surface, the Svk value ($Svk_B$) of the second surface, and the Spk value ($Spk_B$) of the second surface are within the numerical ranges and both surfaces of the polypropylene film are roughened. In addition, on the assumption that both surfaces are roughened, the degrees of roughening are different from each other within the numerical ranges. Hence, the contact area between the first surface and the second surface when the polypropylene film is wound decreases, the gaps between the first surface and the second surface due to moderate coarse protrusions can be maintained, and excellent cushioning property is exhibited. As a result, it is possible to suppress blocking as can be seen from Examples as well.

In addition, the polypropylene film is generally wound by using a plurality of conveying rolls while applying tension to the polypropylene film in order not to cause wrinkling and meandering. Therefore, not only one surface touches the conveying rolls, but the winding is performed while both surfaces touch one of the conveying rolls.

According to the polypropylene film, both surfaces of the polypropylene film are roughened and thus the slipperiness with respect to the conveying rolls is suitable on both surfaces when the polypropylene film after being biaxially stretched is wound into a roll. As a result, suitable conveying property is attained, wrinkling and winding shift are suppressed, and the element winding processability is improved.

Here, it is preferred that the degree of roughening of the first surface is about equal to that of the second surface when only the conveying property is taken into consideration. However, it is preferred that the degree of roughening of the first surface is different from that of the second surface when the dielectric strength is taken into consideration. Hereinafter, this point will be described.

In general, the thickness of the film is such that the apex of the convex portion is the end portion of the thickness in a case in which there are irregularities on the surface. In other words, in a case in which there are irregularities on both the first surface and the second surface, the distance from the apex of the convex portion present on the first surface to the apex of the convex portion present on the second surface is the film thickness.

Here, the thickness of the core portion is the thickness attained by subtracting the height of the convex portion of the first surface and the height of the convex portion of the second surface. Hence, when a polypropylene film of which both surfaces are roughened is fabricated, the thickness of the core portion is thin, a leakage current is likely to be generated, and the dielectric strength decreases.

Consequently, in the first embodiment, the polypropylene film is configured to moderately roughen both surfaces by setting (1) the Svk value ($Svk_A$) of the first surface and the Svk value ($Svk_B$) of the second surface to be about the same, namely, the depths of the valley portions to be about the same on the first surface and the second surface and to ensure the thickness of the core portion by setting (2) the Spk value ($Spk_B$) of the second surface to be smaller than the Spk value ($Spk_A$) of the first surface for the coarse protrusions. In this manner, the conveying property due to roughening is exhibited while the dielectric strength is maintained.

As described above, according to the polypropylene film according to the first embodiment, it is possible to suppress blocking and further to achieve both the conveying property and dielectric strength.

The Svk value ($Svk_A$) of the first surface, the Spk value ($Spk_A$) of the first surface, the Svk value ($Svk_B$) of the second surface, and the Spk value ($Spk_B$) of the second surface are determined by measuring the surface shapes by a three-dimensional surface roughness evaluation method using an optical interference type non-contact surface shape measuring instrument. By the "three-dimensional surface roughness evaluation method", the height of the entire film surface is evaluated and thus the shape of the film surface is three-dimensionally evaluated. Hence, it is possible to grasp the local minute change or modification of the surface to be measured and to more accurately evaluate the surface roughness. It is possible to suppress blocking by evaluating the film surface roughness not simply using the heights of protrusions (two-dimensional surface roughness evaluation by general centerline average roughness Ra and the like) but using the average height of three-dimensional protruding hill portions and average height of protruding valley portions. In addition, it is possible to have a configuration achieving both the favorable conveying property and dielectric strength.

More specifically, the Svk value ($Svk_A$) of the first surface, the Spk value ($Spk_A$) of the first surface, the Svk value ($Svk_B$) of the second surface, and the Spk value ($Spk_B$) of the second surface are values measured using "VertScan 2.0 (model: R5500GML)" available from Ryoka Systems, Inc. as an optical interference type non-contact surface shape measuring instrument.

The details of the measuring method will be described below.

First, the measurement is performed in a region of 470.92 μm×353.16 μm per one visual field at the WAVE mode by applying a 530 white filter and a 1×BODY lens tube and using an objective lens (10×). This operation is performed at 10 positions at 1 cm intervals in the machine direction from the position to be the center in both the machine direction and width direction of the target sample (polypropylene film).

Next, the acquired data is subjected to noise removal processing by a median filter (3×3) and then to Gaussian filter processing at a cutoff value of 30 μm to remove the waviness component. By this, a state is attained in which the state of the roughened surface can be properly measured.

Next, analysis is performed using the "ISO parameter" in the plug-in function "Bearing" of the analysis software "VS-Viewer" of "VertScan 2.0".

Finally, the average values are each calculated for the respective values ($Svk_A$, $Spk_A$, $Svk_B$, $Spk_B$, $Sq_A$, $Sq_B$, $Sa_A$, $Sa_B$, $Sk_A$, and $Sk_B$) attained at the 10 positions. In this manner, the Svk value ($Svk_A$) of the first surface, the Spk value ($Spk_A$) of the first surface, the Svk value ($Svk_B$) of the second surface, and the Spk value ($Spk_B$) of the second surface are attained. In addition, $Sq_A$, $Sq_B$, $Sa_A$, $Sa_B$, $Sk_A$, and $Sk_B$ are also attained in the same manner.

More specifically, the method described in Examples is adopted.

In the polypropylene film, the ratio $Sq_B/Sq_A$ of the Sq value ($Sq_B$) of the second surface to the Sq value ($Sq_A$) of the first surface is preferably 0.4 to 1.0, more preferably 0.45 to 0.8, further preferably 0.48 to 0.7.

The $Sq_A$ is preferably 0.020 μm to 0.080 μm, more preferably 0.025 μm to 0.070 μm.

The $Sq_B$ is preferably 0.005 μm to 0.030 μm, more preferably 0.010 μm to 0.025 μm.

When the ratio $Sq_B/Sq_A$ is 0.4 to 1.0, blocking after the formation of metal layer can be suppressed while the dielectric breakdown strength is maintained. As a result, it is preferred since it leads to suppression of wrinkling at the time of feeding in the subsequent slitting step.

The detailed method for measuring the Sq value ($Sq_A$) of the first surface, the Sq value ($Sq_B$) of the second surface, and the ratio $Sq_B/Sq_A$ follows the method described in Examples.

In the polypropylene film, the ratio $Sa_B/Sa_A$ of the Sa value ($Sa_B$) of the second surface to the Sa value ($Sa_A$) of the first surface is preferably 0.6 to 1.0, more preferably 0.65 to 0.9, further preferably 0.7 to 0.8.

The $Sa_A$ is preferably 0.005 μm to 0.025 μm, more preferably 0.009 μm to 0.020 μm.

The $Sa_B$ is preferably 0.005 μm to 0.025 μm, more preferably 0.007 μm to 0.015 μm.

When the ratio $Sa_B/Sa_A$ is 0.6 to 1.0, the amounts of air associated with the run of film become closer to each other on the front and back. As a result, it is preferred since meandering of the film is suppressed and this leads to suppression of end surface shift of small roll in the slitting step of the metal layer-integrated film.

The detailed method for measuring the Sa value ($Sa_A$) of the first surface, the Sa value ($Sa_B$) of the second surface, and the ratio $Sa_B/Sa_A$ follows the method described in Examples.

In the polypropylene film, the ratio $Sk_B/Sk_A$ of the Sk value ($Sk_B$) of the second surface to the Sk value ($Sk_A$) of the first surface and is preferably 0.6 to 1.0, more preferably 0.7 to 0.9, further preferably 0.75 to 0.85.

The $Sk_A$ is preferably 0.030 μm to 0.070 μm, more preferably 0.035 to 0.060.

The $Sk_B$ is preferably 0.010 μm to 0.050 μm, more preferably 0.020 μm to 0.040 μm.

Here, the Sk value is a parameter defined by a surface quality parameter (ISO 25178-2: 2007) and is the difference between the upper level and the lower level in the curve attained by removing the protruding hill portions and the protruding valley portions from the bearing curve.

When the ratio $Sk_B/Sk_A$ is 0.6 to 1.0, blocking after the formation of metal layer can be suppressed while the dielectric breakdown strength is maintained. As a result, it is preferred since it leads to suppression of wrinkling at the time of feeding in the subsequent slitting step.

The detailed method for measuring the Sk value ($Sk_A$) of the first surface, the Sk value ($Sk_B$) of the second surface, and the ratio $Sk_B/Sk_A$ follows the method described in Examples.

The method for setting the Svk value ($Svk_A$) of the first surface, the Spk value ($Spk_A$) of the first surface, the Svk value ($Svk_B$) of the second surface, the Spk value ($Spk_B$) of the second surface, the Sq value ($Sq_A$) of the first surface, the Sq value ($Sq_B$) of the second surface, the ratio $Sq_B/Sq_A$, the Sa value ($Sa_A$) of the first surface, the Sa value ($Sa_B$) of the second surface, the ratio $Sa_B/Sa_A$, the Sk value ($Sk_A$) of the first surface, the Sk value ($Sk_B$) of the second surface, and the ratio $Sk_B/Sk_A$ to be within the numerical ranges is not particularly limited, but these values can be appropriately adjusted by (i) the selection of the kinds, stereoregularity, molecular weight distribution, and differential distribution value difference $D_M$ of resins (raw material resins) constituting the polypropylene film, (ii) the contents of the respective resins with respect to the entire polypropylene film, (iii) the stretch ratios in the longitudinal and transverse directions at the time of stretching and the stretching temperature, (iv) the selection of the kinds of additives (particularly nucleating agent) and the contents thereof, and the like.

The method for setting the Svk value ($Svk_A$) of the first surface and the Svk value ($Svk_B$) of the second surface to be different from each other, the method for settiating the Spk value ($Spk_A$) of the first surface and the Spk value ($Spk_B$) of the second surface to be different from each other, the method for setting the Sq value ($Sq_A$) of the first surface and the Sq value ($Sq_B$) of the second surface to be different from each other, the method for setting the Sa value ($Sa_A$) of the first surface and the Sa value ($Sa_B$) of the second surface to be different from each other, and the method for setting the Sk value ($Sk_A$) of the first surface and the Sk value ($Sk_B$) of the second surface to be different from each other are not particularly limited, but these values can be adjusted by, for example, fabricating a cast sheet with the first surface as the cast roll side surface and the second surface as the air knife side surface and biaxially stretching this cast sheet.

Both surfaces of the polypropylene film may be roughened by crater-like fine irregularities. FIG. 1(a) is a perspective view schematically illustrating crater-like fine irregularities, FIG. 1(b) is a cross-sectional view of the crater-like fine irregularities, and FIG. 1(c) is a vertical cross-sectional view taken along line I-I' in FIG. 1(b). Incidentally, FIG. 1(a) to FIG. 1(c) are schematic views for explaining an "ellipse" but do not illustrate the surface shape of the polypropylene film or the like according to Examples to be described later.

Most of the crater-like fine irregularities are observed as two arc shapes or substantially arc shapes (hereinafter, the arc shape and the substantially arc shape are collectively referred to as "(substantially) arc shape") which form a pair of curves which are curved in opposite directions under, for example, an optical microscope. In a case in which two (substantially) arc-shaped parts forming an observed pair are complemented (interpolated) and connected, the two parts form an elliptical shape or a substantially elliptical shape (hereinafter, the elliptical shape and the substantially elliptical shape are collectively referred to as "(substantially) elliptical shape").

These two (substantially) arc-shaped parts forming a pair form a protrusion and a recess between the protrusions (see FIG. 1(a)). These protrusions and recesses form the crater-like fine irregularities (see FIGS. 1(b) and 1(c)). Incidentally, the two (substantially) arc shapes may be combined to form a circular shape, a substantially circular shape (hereinafter, the circular shape and the substantially circular shape are collectively referred to as "(substantially) circular shape"), or a (substantially) elliptical shape. The cross section of the protrusion in this case becomes a circular ring or a substantially circular ring (hereinafter, the circular ring and the substantially circular ring are collectively referred to as "(substantially) circular ring") or an elliptical ring or a substantially elliptical ring (hereinafter, the elliptical ring and the substantially elliptical ring are collectively referred to as "(substantially) elliptical ring"). In addition, the arc-shaped parts are observed as a single (substantially) arc shape without forming a pair in some cases.

In the polypropylene film, it is preferred that the ellipse density $D_A$ on the first surface is 85 to 120 pieces/mm$^2$ and the ellipse density $D_B$ on the second surface is 1 to 12 pieces/mm$^2$.

The ellipse density $D_A$ is more preferably 85 to 110 pieces/mm$^2$, further preferably 90 to 105 pieces/mm$^2$.

The ellipse density $D_B$ is more preferably 3 to 11 pieces/mm$^2$, further preferably 4 to 10 pieces/mm$^2$.

The ellipse density refers to the total number of the following (X) and (Y) observed using a digital scope (for example, Digital Microscope VHX-2000 available from Keyence Corporation) per unit area. Hereinafter, the shape of the following (X) and the shape of the following (Y) are also collectively referred to as "ellipse".

Incidentally, those satisfying S≤L and 1 L 300, where the length of one axis is denoted as L μm and the length of the other axis is denoted as S μm, are defined as "ellipses" to be considered when the ellipse density is calculated. Those that do not satisfy this are not considered when the ellipse density is calculated (not counted as "ellipses" when the ellipse density is calculated).

(X) A (substantially) circular shape or (substantially) elliptical shape formed by combining two (substantially) arc-shaped protrusions forming the above pair.

(Y) A (substantially) elliptical shape formed by interpolating and connecting the two (substantially) arc shapes forming the pair.

The specific method for measuring the ellipse density follows the method described in Examples.

When the ellipse density $D_A$ on the first surface is 85 to 120 pieces/mm$^2$ and the ellipse density $D_B$ on the second surface is 1 to 12 pieces/mm$^2$, it is possible to further decrease the contact area between the first surface and the second surface when the polypropylene film is wound.

Specifically, when the ellipse density $D_A$ on the first surface is 85 to 120 pieces/mm$^2$, it can be said that the number of "ellipses" is relatively large. Hence, the surface is roughened to a greater degree. Meanwhile, when the ellipse density $D_B$ on the second surface is 1 to 12 pieces/mm$^2$, it can be said that the number of "ellipses" is relatively small. Hence, the degree of roughening is low although the surface is roughened.

It is possible to prevent the film from meandering to left and right in the slit processing and the end surfaces of small roll from being unmatched if the ellipse density $D_A$ on the first surface is set to 85 to 120 pieces/mm$^2$ and the ellipse density $D_B$ on the second surface is set to 1 to 12 pieces/mm$^2$ in this manner. As a result, it is possible to improve the processability in the slitting step as can be seen from Examples as well.

In addition, when the ellipse density $D_A$ on the first surface is 85 to 120 pieces/mm$^2$ and the ellipse density $D_B$ on the second surface is 1 to 12 pieces/mm$^2$, both surfaces of the polypropylene film are more suitably roughened, and thus the slipperiness with respect to the conveying rolls is more suitable on both surfaces when the polypropylene film after being biaxially stretched is wound into a roll. As a result, more suitable conveying property is attained and wrinkling and winding shift are further suppressed.

Here, it is preferred that the degree of roughening of the first surface is about equal to that of the second surface when only the conveying property is taken into consideration. However, it is preferred that the degree of roughening of the first surface is different from that of the second surface when the dielectric strength is taken into consideration. Generally, when the surface is roughened, thin parts (concave portions of irregularities) of the film cause leakage current. Hence, it is possible to diminish the number of irregularities that may cause leakage current if the ellipse density $D_B$ on the second surface is set to be lower than the ellipse density $D_A$ on the first surface. Specifically, it can be said that the number of irregularities that may cause leakage current is small when the ellipse density $D_B$ on the second surface is 1 to 12 pieces/mm$^2$. As a result, a configuration is attained in which conveying property due to roughening is more suitably exhibited while the dielectric strength is more suitably maintained.

In the polypropylene film, it is preferred that the average major axis length $L_A$ of the ellipses constituting the ellipse density $D_A$ on the first surface is 20 to 80 μm and the average major axis length $L_B$ of the ellipses constituting the ellipse density $D_B$ on the second surface is 30 to 100 μm.

The average major axis length $L_A$ is more preferably 30 to 70 μm, further preferably 40 to 68 μm.

The average major axis length $L_B$ is more preferably 35 to 90 μm, further preferably 40 to 80 μm.

The average major axis length $L_A$ is an average value of major axes of the "ellipses" observed in the measurement of the ellipse density $D_A$.

The average major axis length $L_B$ is an average value of major axes of the "ellipses" observed in the measurement of the ellipse density $D_B$.

The specific method for measuring the average major axis length $L_A$ and the average major axis length $L_B$ follows the method described in Examples.

When the average major axis length $L_A$ of the ellipses constituting the ellipse density $D_A$ on the first surface is 20 to 80 μm, it is easy to set the ellipse density $D_A$ on the first surface to be within the numerical range. In addition, when the average major axis length $L_B$ of the ellipses constituting the ellipse density $D_B$ on the second surface is 30 to 100 μm, it is easy to set the ellipse density $D_B$ on the second surface to be within the numerical range.

In the polypropylene film, it is preferred that the ellipse perfectness $P_A$ of the ellipses constituting the ellipse density $D_A$ on the first surface is 30% to 70% and the ellipse perfectness $P_B$ of the ellipses constituting the ellipse density $D_B$ on the second surface is 15% to 50%.

The ellipse perfectness $P_A$ is more preferably 35% to 65%, further preferably 40% to 60%.

The ellipse perfectness $P_B$ is more preferably 20% to 45%, further preferably 25% to 40%.

The ellipse perfectness is a value determined as follows.

First, surface shape data in a region of 470.92 μm×353.16 μm per one visual field is acquired at the WAVE mode by applying a 530 white filter and a 1×BODY lens tube and using an objective lens (10×) and "VertScan 2.0 (model: R5500GML)" available from Ryoka Systems, Inc. as an optical interference type non-contact surface shape measuring instrument. This operation is performed at 10 positions at 1 cm intervals in the machine direction from the position to be the center in both the machine direction and width direction of the target sample (polypropylene film).

Next, the acquired data is subjected to noise removal processing by a median filter (3×3) and then to Gaussian filter processing at a cutoff value of 30 μm to remove the waviness component.

Three crater projection images each consisting of paired arcs are extracted from each of the projection images of surface shape data at 10 positions acquired as described above (see FIG. 2).

Figure 2:
FIG. 2 is a diagram illustrating an example of a projection image acquired by projecting parts having a height of 0.02 μm or more among fine irregularities onto the film surface using an optical interference type non-contact surface shape measuring instrument.

FIG. 2 is a diagram illustrating an example of a projection image acquired by projecting parts having a height of 0.02 μm or more among fine irregularities onto the film surface using an optical interference type non-contact surface shape measuring instrument. Incidentally, FIG. 2 is an image illustrated in order to facilitate visual understanding of the "projection image" but is not a projection image of the polypropylene film or the like according to Examples to be described later.

When extracting crater projection images, three crater projection images in which arcs based on different β-spherulites are not acknowledged to overlap each other are extracted. As the method for extracting three crater projection images, the ellipses which become the quartiles (first quartile, second quartile (namely, median value), and third quartile) in the area of ellipse by visual observation are extracted. For example, in a case in which N crater projection images are confirmed, the crater projection images having the [(3+N)/4]th largest area, the [(1+N)/2]th largest area, and the [(1+3N)/4]th largest area are extracted as the first quartile, the second quartile, and the third quartile, respectively. In a case in which the first quartile to the third quartile attained by substituting N have a decimal point, the numbers after the decimal point are rounded off so that the first quartile to the third quartile are integers. Specifically, for example, in a case in which 9 crater projection images are confirmed, the crater projection images having the 3rd, 5th, and 7th areas are extracted. In addition, for example, in a case in which 12 crater projection images are confirmed, the crater projection images having the 4th, 7th, and 9th areas are extracted.

Next, for each of the three extracted crater projection images, the total length Lt of the paired arcs and the total circumferential length Lc of the virtual circular ring including the paired arcs are measured to determine the ratio (Lt/Lc). Thereafter, the values of the ratio for total 30 images thus attained are averaged to attain the average value a of the ratio (Lt/Lc).

The determination of virtual circular ring and the measurement of Lt and Lc are performed using the plug-in function "edge curve length" of the analysis software "VS-Viewer" of the optical interference type non-contact surface shape measuring instrument VertScan 2.0. The specific procedure is as follows.

FIGS. 3(a) to 3(c) are schematic plan views for explaining a method for determining a virtual circular ring.

(1) First, two points farthest from each other on arcs 30a and 30b are denoted as $P_1$ and $P_2$ and a straight line (hereinafter, referred to as straight line ($P_1$-$P_2$)) connecting $P_1$ and $P_2$ is determined as illustrated in FIG. 3(a).

Figure 3:
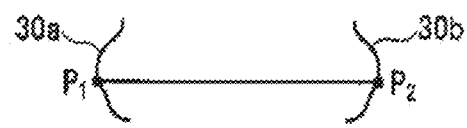
FIGS. 3(a) to 3(c) are schematic plan views for explaining a method for determining a virtual circular ring.
Figure 3:
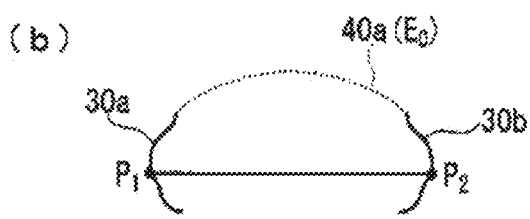
Figure 3:
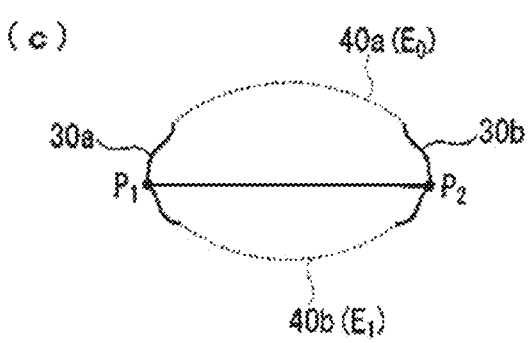

(2) Subsequently, an ellipse ($E_0$) is derived from the shape (location data) of the arcs 30a and 30b at the part located on one side (the upper side of the straight line ($P_1$-$P_2$) in FIG. 3) of the straight line ($P_1$-$P_2$) by the least-squares method so that the straight line ($P_1$-$P_2$) becomes the major axis as illustrated in FIG. 3(b). Thereafter, the curve (a part of the circumference of the ellipse ($E_0$)) constituting this ellipse ($E_0$) complements the part between the arcs 30a and 30b on the one side to form a complementary line 40a. Incidentally, the ellipse ($E_0$) is not illustrated except for the part corresponding to the complementary line 40a in FIG. 3.

(3) Subsequently, an ellipse ($E_1$) is derived from the shape (location data) of the arcs 30a and 30b at the part located on the other side (the lower side of the straight line ($P_1$-$P_2$) in FIG. 3) of the straight line ($P_1$-$P_2$) by the least-squares method so that the straight line ($P_1$-$P_2$) becomes the major axis as illustrated in FIG. 3(c). Thereafter, the curve (a part of the circumference of the ellipse ($E_1$)) constituting this ellipse ($E_1$) complements the part between the arcs 30a and 30b on the other side to form a complementary line 40b. Incidentally, the ellipse ($E_1$) is not illustrated except for the part corresponding to the complementary line 40b in FIG. 3.

(4) The circular ring which is connected by the complementary lines 40a and 40b thus determined and the arcs 30a and 30b and illustrated in FIG. 3(c) is a virtual circular ring.

(5) Thereafter, a height profile of fine irregularities 20 is drawn which indicates the heights of the fine irregularities 20 at the respective locations with respect to the respective locations (distances when a point on the circumference is used as the basis) on the circumference of this virtual circular ring. Lt and Lc in a crater projection image G corresponding to the part having a height of 0.02 μm or more are read out from this height profile.

Incidentally, 30 pieces (n=30) of location data are used for each when the least-squares method is carried out.

When the ellipse perfectness $P_A$ is 40% to 60% and the ellipse perfectness $P_B$ is 25% to 35%, blocking after the formation of metal layer can be suppressed while the dielectric breakdown strength is maintained. As a result, it is preferred since it leads to suppression of wrinkling at the time of feeding in the subsequent slitting step.

The direct current dielectric breakdown strength ES of the polypropylene film at 100° C. is preferably 510 $V_{DC}$/μm or more, more preferably 525 $V_{DC}$/μm or more, further preferably 540 $V_{DC}$/μm or more. It is more preferred as the direct current dielectric breakdown strength ES of the polypropylene film at 100° C. is higher, but ES is, for example, 600 $V_{DC}$/μm or less, 570 $V_{DC}$/μm or less, or 550 $V_{DC}$/μm or less.

The direct current dielectric breakdown strength ES of the polypropylene film at 120° C. is preferably 485 $V_{DC}$/μm or more, more preferably 490 $V_{DC}$/μm or more. It is more preferred as the direct current dielectric breakdown strength ES of the polypropylene film at 120° C. is higher, but ES is, for example, 600 $V_{DC}$/μm or less or 550 $V_{DC}$/μm or less.

The ash content in the polypropylene film is preferably 6×10 ppm or less (60 ppm or less), more preferably 5×10 ppm or less (50 ppm or less), further preferably 4×10 ppm or less (40 ppm or less), especially preferably 3×10 ppm or less (30 ppm or less) with respect to the polypropylene film. The ash content is preferably 0×10 ppm or more, more preferably 1 ppm or more, further preferably 5 ppm or more, especially preferably 1×10 ppm or more (10 ppm or more). When the ash content is within the numerical range, the electric characteristics as a capacitor are further improved while the generation of polar low molecular weight components is suppressed. The ash content refers to a value attained by the method described in Examples.

The thickness of the polypropylene film is preferably 9.5 μm or less, more preferably 6.0 μm or less, further preferably 3.0 μm or less, yet further preferably 2.9 μm or less, especially preferably 2.8 μm or less, yet especially preferably 2.5 μm or less. In addition, the thickness of the polypropylene film is preferably 0.8 μm or more, more preferably 1.0 μm or more, further preferably 1.4 μm or more, yet further preferably 1.5 µm or more, especially preferably 1.8 µm or more. In particular, it is preferred that the thickness is within the range of 1.4 to 6.0 µm, 1.5 to 3.0 µm, 1.5 to 2.9 µm, and the like since the polypropylene film has excellent processability in the slitting step, blocking suppressibility at the time of the vapor deposition step, and element winding processability although the polypropylene film is significantly thin.

When the thickness is 9.5 µm or less, it is possible to increase the capacitance and thus to suitably use the polypropylene film for a capacitor. In addition, the thickness can be set to be 0.8 µm or more from the viewpoint of production.

The thickness of the polypropylene film means a value measured in accordance with JIS-C2330 except that the measurement is performed at 100±10 kPa using a paper thickness measuring device MEI-11, available from Citizen Seimitsu Co., Ltd.

The polypropylene film may be a biaxially-oriented film, a uniaxially-oriented film, or a nonoriented film. Among these, the polypropylene film is a biaxially-oriented film from the viewpoint of easily setting the Spk value ($Spk_A$) of the first surface, the Spk value ($Spk_A$) of the first surface, the Svk value ($Svk_B$) of the second surface, and the Spk value ($Spk_B$) of the second surface to be within the numerical ranges.

The polypropylene film and the metal layer-integrated polypropylene film are each wound into a roll and preferably in the form of a film roll. The film roll may or may not have a winding core (core). The film roll preferably has a winding core (core). The material for the winding core of the film roll is not particularly limited. Examples of the material include paper (paper tube), resin, fiber reinforced plastic (FRP), and metal. Examples of the resin include polyvinyl chloride, polyethylene, polypropylene, phenol resin, epoxy resin, and acrylonitrile-butadiene-styrene copolymer. Examples of the plastic constituting the fiber reinforced plastic include polyester resin, epoxy resin, vinyl ester resin, phenol resin, and thermoplastic resin. Examples of the fiber constituting the fiber reinforced plastic include glass fiber, aramid fiber (Kevlar (registered trademark) fiber), carbon fiber, polyparaphenylene benzoxazole fiber (Zylon (registered trademark) fiber), polyethylene fiber, and boron fiber. Examples of the metal include iron, aluminum, and stainless steel. The winding core of the film roll also includes a winding core formed by impregnating a paper tube with the resin. In this case, the material for the winding core is classified as resin.

As described above, the polypropylene film contains a polypropylene resin as the main component. In the present description, to contain a polypropylene resin as a main component means to contain a polypropylene resin at 50% by mass or more with respect to the entire polypropylene film (when the entire polypropylene film is 100% by mass). The content of the polypropylene resin with respect to the entire polypropylene film is preferably 75% by mass or more, more preferably 90% by mass or more. The upper limit of the content of the polypropylene resin is, for example, 100% by mass, 98% by mass and the like with respect to the entire polypropylene film.

The polypropylene resin is not particularly limited, and one kind may be used singly or two or more kinds may be used in combination. Among these, the polypropylene resin is preferably a polypropylene resin which forms β-spherulites when being formed into a cast sheet.

Examples of the polypropylene resin include a linear polypropylene resin. The linear polypropylene resin can be used singly or in mixture of two or more kinds thereof.

Among these, it is preferred to use the following linear polypropylene resin A and/or the following linear polypropylene resin B. In particular, it is preferred to use the following linear polypropylene resin A and the following linear polypropylene resin B in combination. The following linear polypropylene resin A and the following linear polypropylene resin B are preferably homopolypropylene resins. Suitable examples of the combination of the following linear polypropylene resin A and the following linear polypropylene resin B include a combination of the following resin A-1 and the following resin B-1, a combination of the following resin A-2 and the following resin B-2, a combination of the following resin A-3 and the following resin B-3, and a combination of the following resin A-4 and the following resin B-4. However, in the first the present invention, the polypropylene resin is not limited to the following resins.

<Linear Polypropylene Resin A>

(Linear Polypropylene Resin A-1)

Linear polypropylene resin in which the difference attained by subtracting the differential distribution value when the logarithmic molecular weight Log(M)=6.0 from the differential distribution value when the logarithmic molecular weight Log(M)=4.5 is 8.0% or more when the differential distribution value when Log(M)=6.0 is 100% (basis) in the molecular weight differential distribution curve.

(Linear Polypropylene Resin A-2)

Linear polypropylene resin having heptane insolubles (HI) of 98.5% or less.

(Linear Polypropylene Resin A-3)

Linear polypropylene resin having melt flow rate (MFR) of 4.0 to 10.0 g/10 min at 230° C.

(Linear Polypropylene Resin A-4)

Linear polypropylene resin having weight average molecular weight Mw of 340,000 or less.

<Linear Polypropylene Resin B>

(Linear Polypropylene Resin B-1)

Linear polypropylene resin in which the difference attained by subtracting the differential distribution value when the logarithmic molecular weight Log(M)=6.0 from the differential distribution value when the logarithmic molecular weight Log(M)=4.5 is less than 8.0% when the differential distribution value when Log(M)=6.0 is 100% (basis) in the molecular weight differential distribution curve.

(Linear Polypropylene Resin B-2)

Linear polypropylene resin having heptane insolubles (HI) of more than 98.5%.

(Linear Polypropylene Resin B-3)

Linear polypropylene resin having melt flow rate (MFR) of less than 4.0 g/10 min at 230° C. (especially linear polypropylene resin having melt flow rate (MFR) of 0.1 to 3.9 g/10 min).

(Linear Polypropylene Resin B-4)

Linear polypropylene resin having weight average molecular weight Mw of more than 340,000.

The weight average molecular weight Mw of the linear polypropylene resin A is preferably 250,000 or more. In addition, the weight average molecular weight Mw of the linear polypropylene resin A is preferably 450,000 or less, more preferably 400,000 or less, further preferably 350,000 or less, especially preferably 340,000 or less. When the weight average molecular weight Mw of the linear polypropylene resin A is 250,000 or more and 450,000 or less, the resin fluidity is moderate. As a result, the thickness of the cast sheet can be easily controlled, and a thin oriented film can be easily fabricated. In addition, it is preferred that the weight average molecular weight Mw of the linear polypropylene resin A is within the range since unevenness in the thickness of the cast sheet and oriented film is less likely to occur and moderate stretchability is attained.

The molecular weight distribution [(weight average molecular weight Mw)/(number average molecular weight Mn)] of the linear polypropylene resin A is preferably 5.5 or more and 12.0 or less, more preferably 7.0 or more and 12.0 or less, further preferably 7.5 or more and 11.0 or less, especially preferably 8.0 or more and 11.0 or less, yet especially preferably 9.0 or more and 11.0 or less.

The molecular weight distribution [(z average molecular weight Mz)/(number average molecular weight Mn)] of the linear polypropylene resin A is preferably 15.0 or more and 70.0 or less, more preferably 20.0 or more and 60.0 or less, further preferably 25.0 or more and 50.0 or less.

It is preferred that the respective molecular weight distributions of the linear polypropylene resin A are within the preferred ranges since unevenness in the thickness of the cast sheet and oriented film is less likely to occur and moderate stretchability is attained.

In the present description, the weight average molecular weight (Mw), the number average molecular weight (Mn), the z average molecular weight, and the molecular weight distribution (Mw/Mn and Mz/Mn) of the linear polypropylene resin A and linear polypropylene resin B are values measured by using a gel permeation chromatograph (GPC) device. In the present description, these are values measured by using HLC-8121GPC-HT (trade name) available from TOSOH CORPORATION, which is a high temperature GPC measuring machine incorporating a differential refractometer (RI). As a GPC column, three TSKgel GMHHR-H (20)HT available from TOSOH CORPORATION are connected and used. Measured values of Mw and Mn are attained by setting the column temperature to 140° C. and allowing trichlorobenzene as an eluent to flow at a flow rate of 1.0 ml/10 min. A calibration curve regarding molecular weight M is created using standard polystyrene available from TOSOH CORPORATION, and measured values are converted into the molecular weight of polypropylene using the Q-factor to attain Mw, Mn, and Mz. Furthermore, the logarithm with base 10 of molecular weight M is referred to as logarithmic molecular weight ("Log(M)").

In addition, the weight average molecular weight (Mw), the number average molecular weight (Mn), the z average molecular weight, and the molecular weight distribution (Mw/Mn and Mz/Mn) of the long-chain branched polypropylene C are values measured by using a gel permeation chromatograph (GPC) device. More specifically, these are measured by high temperature GPC-MALS, that is, using a high temperature GPC device (HLC-8121GPC/HT available from TOSOH CORPORATION) equipped with a light scattering detector (DAWN EOS available from Wyatt Technology Corporation). As the column, TSKgel guard column HHR (30) (7.8 mm ID×7.5 cm) and three TSKgelGMH-HR-H(20)HT (7.8 mm ID×30 cm) that are all available from TOSOH CORPORATION are connected and used. Measured values of Mw and Mn are attained by setting the column temperature to 140° C. and allowing trichlorobenzene as an eluent to flow at a flow rate of 1.0 ml/min.

The differential distribution value difference $D_M$ of the linear polypropylene resin A is preferably 8.0% or more, more preferably 8.0% or more and 18.0% or less, further preferably 9.0% or more and 17.0% or less, especially preferably 10.0% or more and 16.0% or less.

The fact that the differential distribution value difference $D_M$ of the linear polypropylene resin A is 8.0% or more and 18.0% or less can be understood to mean that the lower molecular weight component is contained in a more amount by a proportion of 8.0% or more and 18.0% or less when a component having a logarithmic molecular weight Log (M)=4.5 as a representative distribution value of a component (hereinafter, also referred to as "lower molecular weight component") having a molecular weight of from 10,000 to 100,000 on the lower molecular weight side and a component having a logarithmic molecular weight of around Log(M)=6.0 as a representative distribution value of a component (hereinafter, also referred to as "higher molecular weight component") having a molecular weight of around 1,000,000 on the higher molecular weight side are compared with each other.

In other words, for example, a case in which the molecular weight distribution Mw/Mn is 7.0 to 12.0 is taken as an example, the molecular weight distribution Mw/Mn being 7.0 to 12.0 merely indicates the breadth of the molecular weight distribution width, and the quantitative relation between the higher molecular weight component and the lower molecular weight component therein is not recognized. Hence, the linear polypropylene resin A contains a component having a molecular weight of from 10,000 to 100,000 in a larger amount than a component having a molecular weight of 1,000,000 by a proportion of 8.0% or more and 18.0% or less.

The linear polypropylene resin A contains a lower molecular weight component in a larger amount than a higher molecular weight component by a proportion of 8.0% or more and 18.0% or less in a case in which the differential distribution value difference $D_M$ is 8.0% or more and 18.0% or less. Therefore, it is preferred since the surface of the film in the first embodiment is likely to be obtained.

The differential distribution value is a value attained in the following manner by using GPC. A curve is used which indicates the intensity versus time (generally, also referred to as "elution curve") and is attained by using a differential refractometer (RI) detector of GPC. By converting the time axis into the logarithmic molecular weight (Log(M)) by using the calibration curve attained using standard polystyrene, the elution curve is converted into a curve indicating intensity versus Log(M). Since the RI detection intensity is proportional to the component concentration, an integral distribution curve with respect to the logarithmic molecular weight Log(M) can be attained by letting the total area of the curve indicating intensity be 100%. The differential distribution curve is attained by differentiating this integral distribution curve by Log (M). Therefore, "differential distribution" means the differential distribution of concentration fraction with respect to the molecular weight. From this curve, a differential distribution value at a specific Log(M) is read out.

The mesopentad fraction ([mmmm]) of the linear polypropylene resin A is preferably 99.8% or less, more preferably 99.5% or less, further preferably 99.0% or less. In addition, the mesopentad fraction is preferably 94.0% or more, more preferably 94.5% or more, further preferably 95.0% or more. When the mesopentad fraction is within the numerical range, the crystallinity of resin is moderately improved by the moderately high stereoregularity and the dielectric strength at high temperatures is improved. On the other hand, the speed of solidification (crystallization) at the time of cast sheet formation is moderate and moderate stretchability is exhibited.

The mesopentad fraction ([mmmm]) is an index for stereoregularity that can be attained by high temperature nuclear magnetic resonance (NMR) measurement. In the present description, the mesopentad fraction ([mmmm]) refers to a value measured by using a high temperature type Fourier transformation nuclear magnetic resonance apparatus (high temperature FT-NMR) JNM-ECP500 available from JEOL Ltd. The observation nucleus is $^{13}$C (125 MHz), the measurement temperature is 135° C., and o-dichlorobenzene (ODCB: mixed solvent (mixing ratio=4/1) of ODCB and deuterated ODCB) is used as a solvent for dissolving the polypropylene resin. The measuring method by high temperature NMR can be performed, for example, by referring to the method described in "Kobunshi Bunseki Handbook, New edition, The Japan Society for Analytical chemistry ed., KINOKUNIYA COMPANY LTD, 1995, p. 610". A more specific method for measuring the mesopentad fraction ([mmmm]) follows the method described in Examples.

The heptane insolubles (HI) in the linear polypropylene resin A is preferably 96.0% or more, more preferably 97.0% or more. In addition, the heptane insolubles (HI) in the linear polypropylene resin A is preferably 99.5% or less, more preferably 98.5% or less, further preferably 98.0% or less. Here, the more the heptane insolubles, the higher the stereoregularity of the resin is meant. When the heptane insolubles (HI) are 96.0% or more and 99.5% or less, the crystallinity of resin is moderately improved by the moderately high stereoregularity and the dielectric strength under high temperature is improved. On the other hand, the speed of solidification (crystallization) at the time of cast sheet formation is moderate and moderate stretchability is exhibited. The method for measuring the heptane insolubles (HI) follows the method described in Examples.

The ash content in the linear polypropylene resin A is preferably 6×10 ppm or less (60 ppm or less), more preferably 5×10 ppm or less (50 ppm or less), further preferably 4×10 ppm or less (40 ppm or less), especially preferably 3×10 ppm or less (30 ppm or less). In addition, the ash content in the linear polypropylene resin A is preferably 0×10 ppm or more, more preferably 1 ppm or more, further preferably 5 ppm or more, especially preferably 1×10 ppm or more (10 ppm or more). In a case in which the ash content in the linear polypropylene resin A is within the preferred range, the electric characteristics as a capacitor are further improved while the generation of polar low molecular weight components is suppressed. The ash content refers to a value attained by the method described in Examples.

The melt flow rate (MFR) of the linear polypropylene resin A at 230° C. is preferably 1.0 to 15.0 g/10 min, more preferably 2.0 to 10.0 g/10 min, further preferably 4.0 to 10.0 g/10 min, especially preferably 4.3 to 6.0 g/10 min. In a case in which the MFR of the polypropylene A at 230° C. is within the range, the flow characteristics in the molten state are excellent, thus unstable flow such as melt fracture hardly occurs, and breakage at the time of stretching is suppressed. Therefore, the film thickness uniformity is favorable, and thus there is an advantage that the formation of thin portion at which dielectric breakdown easily occurs is suppressed. The method for measuring the melt flow rate follows the method described in Examples.

The content of the linear polypropylene resin A is preferably 55% by mass or more, more preferably 60% by mass or more when the total polypropylene resins in the polypropylene film is 100% by mass. The content of the linear polypropylene resin A is preferably 99.9% by mass or less, more preferably 90% by mass or less, further preferably 85% by mass or less, especially preferably 80% by mass or less when the total polypropylene resins in the polypropylene film is 100% by mass.

The weight average molecular weight Mw of the linear polypropylene resin B is preferably 300,000 or more, more preferably 330,000 or more, further preferably more than 340,000, yet further preferably 350,000 or more, especially preferably more than 350,000. In addition, the weight average molecular weight Mw of the linear polypropylene resin B is preferably 400,000 or less, more preferably 380,000 or less.

The molecular weight distribution [(weight average molecular weight Mw)/(number average molecular weight Mn)] of the linear polypropylene resin B is preferably 7.0 or more and 9.0 or less, more preferably 7.5 or more and 8.9 or less, further preferably 7.5 or more and 8.5 or less.

The molecular weight distribution [(z average molecular weight Mz)/(number average molecular weight Mn)] of the linear polypropylene resin B is preferably 20.0 or more and 70.0 or less, more preferably 25.0 or more and 60.0 or less, further preferably 25.0 or more and 50.0 or less.

It is preferred that the respective molecular weight distributions of the linear polypropylene resin B are within the preferred ranges since unevenness in the thickness of the cast sheet and oriented film is less likely to occur and moderate stretchability is attained.

The differential distribution value difference $D_M$ of the linear polypropylene resin B is preferably less than 8.0%, more preferably −20.0% or more and less than 8.0%, further preferably −10.0% or more and 7.9% or less, and especially preferably −5.0% or more and 7.5% or less.

The mesopentad fraction ([mmmm]) of the linear polypropylene resin B is preferably less than 99.8%, more preferably 99.5% or less, further preferably 99.0% or less. In addition, the mesopentad fraction is preferably 94.0% or more, more preferably 94.5% or more, further preferably 95.0% or more. When the mesopentad fraction is within the numerical range, the crystallinity of resin is moderately improved by the moderately high stereoregularity and the dielectric strength at high temperatures is improved. On the other hand, the speed of solidification (crystallization) at the time of cast sheet formation is moderate and moderate stretchability is exhibited.

The heptane insolubles (HI) in the linear polypropylene resin B is preferably 97.5% or more, more preferably 98% or more, further preferably 98.5% or more, especially preferably 98.6% or more. In addition, the heptane insolubles (HI) in the linear polypropylene resin B is preferably 99.5% or less, more preferably 99.0% or less.

The ash content in the linear polypropylene resin B is preferably 6×10 ppm or less (60 ppm or less), more preferably 5×10 ppm or less (50 ppm or less), further preferably 4×10 ppm or less (40 ppm or less), especially preferably 3×10 ppm or less (30 ppm or less). In addition, the ash content in the linear polypropylene resin B is preferably 0×10 ppm or more, more preferably 1 ppm or more, further preferably 5 ppm or more, especially preferably 1×10 ppm or more (10 ppm or more). In a case in which the ash content in the linear polypropylene resin B is within the preferred range, the electric characteristics as a capacitor are further improved while the generation of polar low molecular weight components is suppressed. The ash content refers to a value attained by the method described in Examples.

The melt flow rate (MFR) of the linear polypropylene resin B at 230° C. is preferably 0.1 g/10 min or more. In addition, the melt flow rate (MFR) of the linear polypropylene resin B at 230° C. is preferably 6.0 g/10 min or less, more preferably 5.0 g/10 min or less, further preferably less than 4.0 g/10 min, especially y preferably 3.9 g/10 min or less.

In the case of using the linear polypropylene resin B as the polypropylene resin, the content of the linear polypropylene resin B is preferably 10% by mass or more, more preferably 15% by mass or more, further preferably 20% by mass or more when the total polypropylene resins in the polypropylene film is 100% by mass. In the same manner, the content of the linear polypropylene resin B is preferably 45% by mass or less, more preferably 40% by mass or less when the total polypropylene resins in the polypropylene film is 100% by mass.

In the case of using the linear polypropylene resin A and the linear polypropylene resin B in combination as the polypropylene resin, it is preferred to contain the linear polypropylene resin A at 55% to 90% by weight and the linear polypropylene resin B at 45% to 10% by weight, it is more preferred to contain the linear polypropylene resin A at 60% to 85% by weight and the linear polypropylene resin B at 40% to 15% by weight, it is especially preferred to contain the linear polypropylene resin A at 60% to 80% by weight and the linear polypropylene resin B at 40% to 20% by weight when the total polypropylene resins is 100% by mass.

In a case in which the polypropylene resin contains the linear polypropylene resin A and the linear polypropylene resin B, the polypropylene film is in a finely mixed state (phase separated state) of the linear polypropylene resin A and the linear polypropylene resin B, and thus the dielectric strength at high temperatures is improved.

The linear polypropylene resins can be produced by generally known polymerization methods. The methods are not particularly limited as long as it is possible to produce linear polypropylene resins which can be used in the polypropylene film of the first embodiment. Examples of such polymerization methods include gas-phase polymerization, block polymerization, and slurry polymerization.

Polymerization may be single-step (one step) polymerization using one polymerization reactor or may be multi-step polymerization using at least two or more polymerization reactors. Furthermore, polymerization may be performed while hydrogen or comonomer is added as a molecular weight regulator in the reactor.

As a catalyst in polymerization, a generally known Ziegler-Natta catalyst can be used, and the catalyst is not particularly limited as long as a polypropylene resin can be obtained. The catalyst may contain a catalyst promoter component or a donor. By adjusting the catalyst and the polymerization conditions, it is possible to control the molecular weight, molecular weight distribution, stereoregularity and the like.

The molecular weight, molecular weight distribution, differential distribution value difference $D_M$ and the like of the linear polypropylene resins can be adjusted by appropriately selecting, for example, (i) the polymerization methods and the respective conditions such as temperature and pressure at the time of the polymerization, (ii) the forms of reactors at the time of the polymerization, (iii) the presence or absence, kinds, and amounts of additives used, and (iv) the kinds and amounts of catalysts used.

Specifically, the molecular weight, molecular weight distribution, differential distribution value difference $D_M$ and the like of the linear polypropylene resins can be adjusted by, for example, multi-step polymerization reaction. As the multi-step polymerization reaction, for example, the following methods are exemplified.

First, propylene and a catalyst are supplied to the first polymerization reactor in the first polymerization step. Hydrogen as a molecular weight regulator is mixed with these components in an amount required to attain the required molecular weight of polymer. For example, in the case of slurry polymerization, the reaction temperature is about 70° C. to 100° C. and the retention time is about 20 to 100 minutes. A plurality of reactors can be used, for example, in series. In this case, the polymerization product in the first step is continuously sent to the next reactor together with additional propylene, catalyst, and molecular weight regulator. Subsequently the second polymerization is performed in which the molecular weight is adjusted to a lower molecular weight or a higher molecular weight than that in the first polymerization step. By adjusting the yield (production amount) in the first and second reactors, it is possible to adjust the composition (constitution) of the higher molecular weight component and the lower molecular weight component.

In addition, the molecular weight, molecular weight distribution, differential distribution value difference $D_M$ and the like of the linear polypropylene resins can also be adjusted by peroxidative decomposition. For example, a method by peroxidation treatment using a decomposing agent such as hydrogen peroxide or an organic peroxide can be exemplified.

When a peroxide is added to a disintegrating polymer such as polypropylene, a hydrogen abstraction reaction from the polymer takes place, the generated polymer radicals are partially recombined and undergo a crosslinking reaction, but most of the radicals undergo secondary decomposition (β cleavage) and are separated into two polymers having lower molecular weights. In other words, the decomposition of a higher molecular weight component proceeds at a higher probability. In this manner, the lower molecular weight components increase and the constitution of the molecular weight distribution can be adjusted.

In the case of adjusting the content of lower molecular weight components by blending (resin mixing), it is preferred to dry-mix or melt-mix at least two or more kinds of resins having different molecular weights. In general, a mixed system of two kinds of propylene in which an additive resin having an average molecular weight higher or lower than the main resin is mixed at about 1% to 40% by mass with the main resin is preferably utilized since the amount of lower molecular weight components can be easily adjusted.

In the case of this mixing adjustment, the melt flow rate (MFR) may be used as a measure of the average molecular weight. In this case, it is preferred that the difference in MFR between the main resin and the additive resin is set to about 1 to 30 g/10 min from the viewpoint of the convenience in the adjustment.

Commercial products can also be used as the linear polypropylene resins.

The polypropylene resin preferably contains a long-chain branched polypropylene resin. Among the long-chain branched polypropylene resins, the long-chain branched polypropylene resin C (hereinafter, also referred to as "long-chain branched polypropylene resin C") obtained by polymerizing propylene using a metallocene catalyst is preferred. Specifically, when the polypropylene resin contains the long-chain branched polypropylene resin C, a large number of β crystals is formed in the cast sheet. Moreover, it is preferred in that the β crystal is transferred into α crystal by stretching the cast sheet containing the β crystal, thus (substantially) arc-shaped irregularities are formed on the polypropylene film obtained by stretching due to the difference in density between the β crystal and the α crystal, and the surface can be suitably roughened.

Among these, it is more preferred that the polypropylene resin contains the linear polypropylene resin A and the long-chain branched polypropylene resin C.

Furthermore, it is more preferred that the polypropylene resin contains the linear polypropylene resin A and the linear polypropylene resin B and contains the long-chain branched polypropylene resin C. The linear polypropylene resin A and the linear polypropylene resin B are different from each other in differential distribution value $D_M$, heptane insolubles (HI), and/or melt flow rate (MFR) and the like and are in a finely mixed state (phase separated state), and thus the arrangement of resin components constituting the film is complicated by stretching such a nonoriented polypropylene film. Hence, by containing the long-chain branched polypropylene resin C as well as containing the linear polypropylene resin A and the linear polypropylene resin B which are different from each other in differential distribution value $D_M$, heptane insolubles (HI), and/or melt flow rate (MFR) and the like, it is possible to improve the dielectric strength of the oriented film by the complicated arrangement of the resin components constituting the film, to form finer (substantially) arc-shaped irregularities, and to realize more suitable roughening.

Incidentally, when a long-chain branched polypropylene resin obtained through crosslinking modification by a peroxide is used instead of the long-chain branched polypropylene resin C polymerized using a metallocene catalyst, the α crystal formation is promoted in the cast sheet and the β crystal formation is greatly suppressed by the α crystal nucleation effect of the long-chain branched polypropylene resin obtained through crosslinking modification by a peroxide. Even when the cast sheet containing α crystal is stretched, the transfer of crystallites does not occur and thus irregularities are hardly formed. Hence, in order to roughen the polypropylene film, the long-chain branched polypropylene resin C polymerized using a metallocene catalyst is suitable.

The metallocene catalyst is generally a metallocene compound which forms a polymerization catalyst which generates an olefin macromer. The long-chain branched polypropylene resin C obtained by polymerizing propylene using a metallocene catalyst is preferred since the branched chain length and branched chain spacing of polypropylene become moderate and excellent compatibility with linear polypropylene is attained. In addition, it is preferred since a uniform composition and a uniform surface shape are attained. In the production of long-chain branched polypropylene resin C, the respective conditions other than the kinds and amounts of catalysts used, for example, (i) the polymerization methods and the respective conditions such as temperature and pressure at the time of the polymerization, (ii) the forms of reactors at the time of the polymerization, and (iii) the presence or absence, kinds, and amounts of additives used can be similar to the respective conditions described in the section of the method for producing the linear polypropylene resins in consideration of the molecular weight, molecular weight distribution, differential distribution value difference $D_M$ and the like of the long-chain branched polypropylene resin C to be produced.

The weight average molecular weight Mw of the long-chain branched polypropylene resin C is preferably 150,000 or more and 600,000 or less, more preferably 200,000 or more and 500,000 or less, further preferably 250,000 or more and 450,000 or less, especially preferably 350,000 or more and 420,000 or less. When the weight average molecular weight Mw of the long-chain branched polypropylene resin C is 150,000 or more and 600,000 or less, the resin fluidity is moderate. As a result, the thickness of the cast sheet can be easily controlled, and a thin oriented film can be easily fabricated. In addition, it is preferred that the weight average molecular weight Mw of the long-chain branched polypropylene resin C is within the range since unevenness in the thickness of the cast sheet and oriented film is less likely to occur and moderate stretchability is attained.

The molecular weight distribution [(weight average molecular weight Mw)/(number average molecular weight Mn)] of the long-chain branched polypropylene resin C is preferably 1.5 or more and 4.5 or less, more preferably 1.8 or more and 4.2 or less, further preferably 2.0 or more and 4.0 or less, particularly preferably 2.1 or more and 3.9 or less, especially preferably 2.2 or more and 3.0 or less.

The [(z average molecular weight Mz)/(number average molecular weight Mn)] of the long-chain branched polypropylene resin C is preferably 4.0 or more and 9.0 or less, more preferably 4.2 or more and 8.8 or less, further preferably 4.5 or more and 8.5 or less, especially preferably 5.0 or more and 8.2 or less.

The molecular weight, molecular weight distribution, differential distribution value difference $D_M$ and the like of the long-chain branched polypropylene resin C can be controlled by adjusting the catalyst and polymerization conditions as described above.

The heptane insolubles (HI) in the long-chain branched polypropylene resin C is preferably 98.0% or more, more preferably 98.2% or more, further preferably 98.5% or more. In addition, the heptane insolubles (HI) in the long-chain branched polypropylene resin C is preferably 99.5% or less, more preferably 99.0% or less. In a case in which the HI in the long-chain branched polypropylene resin C is in the preferred range, β crystals are more suitably formed in the cast sheet, and as a result, the surface of the polypropylene film according to the first embodiment can be suitably roughened.

The ash content in the long-chain branched polypropylene resin C is preferably 45×10 ppm or less (450 ppm or less), more preferably 40×10 ppm or less (400 ppm or less). In addition, the ash content in the long-chain branched polypropylene resin C is preferably 0×10 ppm or more, more preferably 1 ppm or more, yet more preferably 5 ppm or more, further preferably 1×10 ppm or more (10 ppm or more), yet further preferably 10×10 ppm or more (100 ppm or more), especially preferably 20×10 ppm or more (200 ppm or more). In a case in which the ash content in the long-chain branched polypropylene resin C is in the preferred range, β crystals are more suitably formed in the cast sheet, and as a result, the surface of the polypropylene film according to the first embodiment can be suitably roughened.

The melt flow rate (MFR) of the long-chain branched polypropylene resin C at 230° C. is preferably 0.1 to 12 g/10 min, more preferably 0.5 to 5 g/10 min, further preferably 0.7 to 3.5 g/10 min, especially preferably 1.0 to 2.2 g/10 min. In a case in which the MFR of the long-chain branched polypropylene resin C at 230° C. is within the range, the flow characteristics in the molten state are excellent, thus unstable flow such as melt fracture hardly occurs, and breakage at the time of stretching is suppressed. Therefore, the film thickness uniformity is favorable, and thus there is an advantage that the formation of thin portion at which dielectric breakdown easily occurs is suppressed.

The content of the long-chain branched polypropylene resin C is preferably 0.1% by mass or more, more preferably 0.5% by mass or more, further preferably 1% by mass or more, especially preferably 2% by mass or more, more especially preferably 2.5% by mass or more when the total polypropylene resins in the polypropylene film is 100% by mass. In addition, the content of the long-chain branched polypropylene resin C is preferably 30 mass % or less, more preferably 20 mass % or less, further preferably 10 mass % or less, especially preferably 7 mass % or less, more especially preferably 5 mass % or less when the total polypropylene resins in the polypropylene film is 100% by mass. The polypropylene film may contain one kind or two or more kinds of the long chain branched polypropylene resins C.

Examples of representative commercial products of the long-chain branched polypropylene resin C include MFX3 and MFX6 available from JAPAN POLYPROPYLENE CORPORATION and MFX8 available from JAPAN POLYPROPYLENE CORPORATION.

The polypropylene film may contain resins (hereinafter, also referred to as "other resins") other than the polypropylene resins. The "other resins" are generally resins other than the polypropylene resins which are regarded as resins of the main component and are not particularly limited as long as the intended polypropylene film can be obtained. Examples of the other resins include polyolefins such as polyethylene, poly(1-butene), polyisobutene, poly(1-pentene), and poly(1-methylpentene) other than polypropylene; copolymers of α-olefins such as ethylene-propylene copolymer, propylene-butene copolymer, and ethylene-butene copolymer; vinyl monomer-diene monomer random copolymers such as styrene-butadiene random copolymer; and vinyl monomer-diene monomer-vinyl monomer random copolymers such as styrene-butadiene-styrene block copolymer. The polypropylene film can contain the other resins in an amount in which the intended polypropylene film is not adversely affected. The polypropylene film may contain the other resins preferably at 10 parts by mass or less, more preferably at 5 parts by mass or less with respect to 100 parts by mass of the polypropylene resins. In addition, the polypropylene film may contain the other resins preferably at 0.1 part by mass or more, more preferably at 1 part by mass or more with respect to 100 parts by mass of the polypropylene resins.

The polypropylene film may further contain at least one kind of additive in addition to the resin components. The "additives" are generally additives to be used in polypropylene and are not particularly limited as long as the intended polypropylene film can be obtained. The additives include, for example, a nucleating agent (a crystal nucleating agent, β crystal nucleating agent), an antioxidant, necessary stabilizers such as a chlorine absorber and an ultraviolet absorber, a lubricant, a plasticizer, a flame retardant, an antistatic agent, an inorganic filler, and an organic filler. Examples of the inorganic filler include barium titanate, strontium titanate, and aluminum oxide. In the case of using the additives, the additives can be contained in an amount in which the intended polypropylene film is not adversely affected.

The "nucleating agent" is generally used in polypropylene and is not particularly limited as long as the intended polypropylene film can be obtained.

Examples of the nucleating agent include an α crystal nucleating agent which preferentially nucleates α crystals and a β crystal nucleating agent which preferentially nucleates β crystals.

Examples of an organic nucleating agent among the α crystal nucleating agents include a dispersion type nucleating agent and a dissolution type nucleating agent. Examples of the dispersion type nucleating agent include a phosphate metal salt-based nucleating agent, a carboxylic acid metal salt-based nucleating agent, and a rosin metal salt-based nucleating agent. Examples of the dissolution type nucleating agent include a sorbitol-based nucleating agent, a nonitol-based nucleating agent, a xylitol-based nucleating agent, and an amide-based nucleating agent.

Examples of the β crystal nucleating agent include an amide-based nucleating agent, a di- or polycarboxylic acid metal salt-based nucleating agent, a quinacridone-based nucleating agent, an aromatic sulfonic acid-based nucleating agent, a phthalocyanine-based nucleating agent, and a tetraoxaspiro compound-based nucleating agent.

The nucleating agent can be used by being dry-blended or melt-blended with the polypropylene raw materials and pelletized or can be used by being put into the extruder together with polypropylene pellets. The surface roughness of the film can be adjusted to a desired roughness by using a nucleating agent. Examples of a representative commercial product of the nucleating agent include NJSTAR NU-100 available from New Japan Chemical Co., Ltd., for example, as a β crystal nucleating agent. In a case in which the polypropylene film contains a β crystal nucleating agent, the content thereof is preferably 1 to 1000 ppm by mass, more preferably 50 to 600 ppm by mass with respect to the mass of the resin components (with respective to the total mass of the resin components).

The "antioxidant" is generally called antioxidant, used in polypropylene, and is not particularly limited as long as the intended polypropylene film can be obtained. The antioxidant is generally used for two purposes. One purpose is to suppress thermal deterioration and oxidative deterioration in the extruder, and the other purpose is to contribute to the suppression of deterioration in long-term use as a film for capacitor and the improvement of capacitor performance. The antioxidant which suppresses thermal deterioration and oxidative deterioration in the extruder is also referred to as "primary agent", and the antioxidant which contributes to the improvement of capacitor performance is also referred to as "secondary agent".

Two kinds of antioxidants may be used for these two purposes, or one kind of antioxidant may be used for these two purposes.

Examples of the primary agent include 2,6-di-tert-butyl-para-cresol (general name: BHT). The primary agent can be usually added for the purpose of suppressing thermal deterioration and oxidative deterioration in the extruder at the time of preparation of the polypropylene resin composition described in the method for producing a polypropylene film to be described later. The antioxidant added to the polypropylene resin composition for this purpose is mostly consumed in the molding step in the extruder and hardly remains in the film after film formation. Hence, in a case in which the polypropylene film contains the primary agent, the content thereof is usually 100 ppm by mass with respect to the mass of the resin components (with respective to the total mass of the resin components).

Examples of the secondary agent include a hindered phenolic antioxidant having a carbonyl group.

A "hindered phenolic antioxidant having a carbonyl group" is usually a hindered phenolic antioxidant having a carbonyl group and is not particularly limited as long as the intended polypropylene film can be obtained.

Examples of the hindered phenolic antioxidant having a carbonyl group include triethylene glycol-bis[3-(3-tert-butyl-5-methyl-4-hydroxyphenyl)propionate] (trade name: Irganox 245), 1,6-hexanediol-bis[3-(3,5-di-tert-butyl-4-hydroxyphenyl)propionate] (trade name: Irganox 259), pentaerythrutyl tetrakis[3-(3,5-di-tert-butyl-4-hydroxyphenyl)propionate] (trade name: Irganox 1010), 2,2-thiodiethylenebis[3-(3,5-di-tertiary-butyl-4-hydroxyphenyl) propionate] (trade name: Irganox 1035), octadecyl-3-(3,5-di-tert-butyl-4-hydroxyphenyl)propionate (trade name: Irganox 1076), and N,N'-hexamethylenebis(3,5-di-tertiary-butyl-4-hydroxy-hydrocinnamide) (trade name: Irganox 1098), but pentaerythrutyl tetrakis[3-(3,5-di-tert-butyl-4-hydroxyphenyl)propionate] that has a high molecular weight, is highly compatible with polypropylene, has low volatility, and is excellent in heat resistance is particularly preferred.

The polypropylene film may contain one or more kinds of hindered phenolic antioxidants (secondary agents) having a carbonyl group for the purpose of suppressing the deterioration that progresses with time in long-term use. In a case in which the polypropylene film contains one or more kinds of hindered phenolic antioxidants having a carbonyl group, the content thereof is preferably 4000 ppm by mass or more and 6000 ppm by mass or less, more preferably 4500 ppm by mass or more and 6000 ppm by mass or less with respect to the mass of the resin components (with respective to the total mass of the resin components). The content of hindered phenolic antioxidants having a carbonyl group in the film is preferably 4000 ppm by mass or more and 6000 ppm by mass or less from the viewpoint of proper exertion of effects.

A polypropylene film containing a hindered phenolic antioxidant having a carbonyl group, which has favorable compatibility with polypropylene at the molecular level, in an optimal specific amount range is preferred since the long-term durability is improved.

The "chlorine absorber" is generally called chlorine absorber, used in polypropylene, and is not particularly limited as long as the intended polypropylene film can be obtained. Examples of the chlorine absorber include metal soap such as calcium stearate. In the case of using such a chlorine absorber, the chlorine absorber can be contained in an amount in which the intended polypropylene film is not adversely affected.

The polypropylene film is preferably biaxially stretched. In a case in which the polypropylene film is a biaxially-oriented polypropylene film, the biaxially-oriented polypropylene film can be produced by a generally known method for producing a biaxially-oriented polypropylene film. The biaxially-oriented polypropylene film can be produced, for example, by fabricating a cast sheet from a polypropylene resin composition obtained by mixing the linear polypropylene resin A, the linear polypropylene resin B, and the long-chain branched polypropylene resin C with other resins, additives and the like if necessary and then biaxially stretching the cast sheet.

<Preparation of Polypropylene Resin Composition>

The method for preparing the polypropylene resin composition is not particularly limited, but examples thereof include a method in which polymerization powders or pellets of the linear polypropylene resin A, linear polypropylene resin B, and long-chain branched polypropylene resin C are dry-blended with other resins, additives and the like if necessary using a mixer or the like and a method in which polymerization powders or pellets of the linear polypropylene resin A, linear polypropylene resin B, and long-chain branched polypropylene resin C are supplied to a kneader together with other resins, additives and the like if necessary and melt-kneaded to obtain a melt-blended resin composition.

The mixer and the kneader are not particularly limited. The kneader may be of a monoaxial screw type, a biaxial screw type, or a multiaxial (bi- or more axial) screw type. In the case of a bi- or more axial screw type kneader, the kneading type may be co-rating or counter-rotating.

In the case of blending by melt-kneading, the kneading temperature is not particularly limited as long as favorable kneading is achieved but is preferably in the range of 170° C. to 320° C., more preferably in the range of 200° C. to 300° C., further preferably in the range of 230° C. to 270° C. The kneader may be purged with an inert gas such as nitrogen in order to suppress deterioration of the resins during the mixing by kneading. The melt-kneaded resin can be pelletized to a proper size by using a generally known granulator to obtain pellets of the melt-blended resin composition.

In the preparation of the polypropylene resin composition, a primary agent as the antioxidant described in the section of additives can be added for the purpose of suppressing thermal deterioration and oxidative deterioration in the extruder.

In a case in which the polypropylene resin composition contains a primary agent, the content thereof is preferably 1000 ppm by mass to 5000 ppm by mass with respect to the mass of the resin components (with respective to the total mass of the resin components). The antioxidant for this purpose is mostly consumed in the molding step in the extruder and hardly remains in the film after film formation.

The hindered phenolic antioxidant having a carbonyl group described in the section of additives can be added as a secondary agent to the polypropylene resin composition.

In a case in which the polypropylene resin composition contains the hindered phenolic antioxidant having a carbonyl group, the content thereof is preferably 100 ppm by mass to 10,000 ppm by mass, more preferably 5500 ppm by mass to 7,000 ppm by mass with respect to the mass of the resin components (with respective to the total mass of the resin components). In the extruder, a quite amount of hindered phenolic antioxidant having a carbonyl group is also consumed.

In a case in which the polypropylene resin composition does not contain a primary agent, a larger amount of hindered phenolic antioxidant having a carbonyl group can be used. This is because the amount of hindered phenolic antioxidant having a carbonyl group consumed in the extruder can be increased. In a case in which the polypropylene resin composition does not contain a primary agent but contains a hindered phenolic antioxidant having a carbonyl group, the content thereof is preferably 6000 ppm by mass to 8000 ppm by mass with respect to the mass of the resin components (with respective to the total mass of the resin components).

<Fabrication of Cast Sheet>

The cast sheet can be obtained by supplying pellets of the dry-blended resin composition and/or melt-blended resin composition prepared in advance to the extruder, melting the pellets under heating, allowing the molten resultant to pass through a filtration filter, then melting the filtered resultant under heating at preferably 170° C. to 320° C., more preferably 200° C. to 300° C., melt-extruding the molten resultant through a T die, and cooling and solidifying the melt-extruded resultant with at least one metal drum held at a temperature (cast temperature) of preferably 40° C. to 140° C., more preferably 80° C. to 140° C., further preferably 90° C. to 140° C., especially preferably 90° C. to 120° C., more especially preferably 90° C. to 105° C. At this time, it is preferred to press the melt-extruded resin composition against the metal drum with an air knife. Incidentally, the surface on the side that comes into contact with the metal drum is the first surface and the surface on the opposite side (the surface on the air knife side) is the second surface.

The thickness of the cast sheet is not particularly limited as long as the intended polypropylene film can be obtained but is preferably 0.05 mm to 2 mm, more preferably 0.1 mm to 1 mm.

Incidentally, polypropylene undergoes thermal deterioration (oxidative deterioration) and shear deterioration to no small extent during the fabrication process of the cast sheet (particularly in the extruder). It is possible to suppress the degree of progress of such deterioration, namely, changes in the molecular weight distribution and stereoregularity by nitrogen purge (suppression of oxidation) in the extruder, screw shape (shear force) in the extruder, internal shape (shearing force) of T die at the time of casting, amount of antioxidant added (suppression of oxidation), the winding speed (extension force) at the time of casting, and the like.

<Stretching Treatment>

The biaxially-oriented polypropylene film can be produced by subjecting the cast sheet to a stretching treatment. A sequential biaxial stretching method is preferred as the stretching method. As the sequential biaxial stretching method, the cast sheet is first kept at a temperature of preferably 100° C. to 180° C., more preferably 140° C. to 160° C., allowed to pass between rolls with different speeds to be stretched to 3 to 7 times in the machine direction, and immediately cooled to room temperature. By properly adjusting the temperature in this longitudinal stretching step, β crystal melts and is transformed into α crystal, and the irregularities become apparent. Subsequently, the stretched film is guided to a tenter and preferably transversely stretched 3 to 11 times in the width direction at a temperature of preferably 160° C. or more, more preferably 160° C. to 180° C., then relaxed, subjected to thermosetting, and wound into a roll.

The film wound into a roll is subjected to an aging treatment in an atmosphere of about 20° C. to 45° C. and then slit (cut) to the desired product width with a slitter or the like while being rewound (while being unrolled), and the films are each wound again.

By such a stretching step, a film having excellent mechanical strength and rigidity is obtained and a biaxially-oriented film is obtained in which the irregularities on the surface are further clarified and the surfaces are finely roughened.

The polypropylene film may be subjected to a corona discharge treatment online or offline after end of the stretching and thermosetting steps. By performing the corona discharge treatment, it is possible to enhance the adhesion characteristics in a postprocessing step such as a metal vapor deposition processing step. The corona discharge treatment can be performed by a known method. It is preferred to use air, carbon dioxide gas, nitrogen gas, and any mixed gas of these as an atmospheric gas.

In order to process the polypropylene film as a capacitor, a metal layer may be stacked on either surface or both surfaces of the polypropylene film to obtain a metal layer-integrated polypropylene film. The metal layer functions as an electrode. As the metal used in the metal layer, elemental metals such as zinc, lead, silver, chromium, aluminum, copper, and nickel; mixtures of a plurality of the elemental metals, and alloys thereof can be used, but zinc an aluminum are preferred in consideration of environment, economy, and capacitor performance and the like.

As a method for stacking a metal layer on either surface or both surfaces of the polypropylene film, for example, a vacuum vapor deposition method and a sputtering method can be exemplified. From the viewpoint of producibility and economy, the vacuum vapor deposition method is preferred. As the vacuum vapor deposition method, a crucible method or a wire method can be generally exemplified, but the method is not particularly limited, and any suitable method can be appropriately selected.

The margin pattern when stacking a metal layer by vapor deposition is not particularly limited, but it is preferred to apply a pattern including a so-called special margin such as a fish net pattern or a T margin pattern on either surface of the film from the viewpoint of improving the characteristics such as safety of the capacitor. This improves the safety and is also effective from the viewpoint of prevention of breakage of the capacitor and a short circuit and the like.

As a method for forming a margin, a generally known method such as a tape method or an oil method can be used without any limitation.

When forming a metal layer on the polypropylene film, the polypropylene film wound into a roll is rewound (unrolled), a metal layer such as a vapor-deposited film is formed on either surface or both surfaces of the polypropylene film, and the polypropylene film is wound again.

A plurality of the metal layer-integrated polypropylene films can be stacked by a conventionally known method or subjected to an element winding processing (winding) to be formed into a film capacitor.

Specifically, a blade is placed in the center of each margin portion of the metal layer-integrated polypropylene film and slit processing is performed to fabricate a take-up reel having a margin on one surface thereof.

Here, in the polypropylene film, the Spk value ($Spk_A$) of the first surface, the Spk value ($Spk_A$) of the first surface, the Svk value ($Svk_B$) of the second surface, and the Spk value ($Spk_B$) of the second surface are within predetermined numerical ranges and thus blocking is suppressed. Hence, it is possible to prevent the polypropylene film from blocking and wrinkling in the machine direction of the film from occurring at the time of the slitting processing.

Next, two sheets of a take-up reel with a left margin and a take-up reel with a right margin are superposed and wound in the width direction so that the vapor deposition part protrudes more than the margin portion (element winding processing). Next, the core material is removed from the wound body and the wound body is pressed. Next, external electrodes are formed on both end surfaces, and further the external electrodes are provided with lead wires. In this manner, a wound film capacitor is obtained.

Heretofore, the first embodiment (the embodiment according to the first present invention) has been described.

Embodiment According to Second Present Invention

Hereinafter, an embodiment of the second present invention will be described. Incidentally, in the polypropylene film according to the embodiment of the second present invention, the Svk value ($Svk_A$) of the first surface is not required to be 0.005 μm or more and 0.030 μm or less as in the embodiment of the first present invention. In addition, the Spk value ($Spk_A$) of the first surface is not required to be more than 0.035 μm and 0.080 μm or less. In addition, the Svk value ($Svk_B$) of the second surface is not required to be 0.005 μm or more and 0.030 μm or less. In addition, the Spk value ($Spk_B$) of the second surface is not required to be 0.015 μm or more and 0.035 μm or less.

The polypropylene film according to the embodiment (hereinafter, also referred to as "second embodiment") of the second present invention contains a polypropylene resin as a main component, and in the polypropylene film, a ratio $Spk_B/Spk_A$ of a Spk value ($Spk_B$) of the second surface to a Spk value ($Spk_A$) of the first surface is 0.490 or more and 0.730 or less, and a ratio $Svk_B/Svk_A$ of a Svk value ($Svk_B$) of the second surface to a Svk value ($Svk_A$) of the first surface is 0.735 or more and 1.250 or less.

The ratio $Spk_B/Spk_A$ is preferably 0.495 or more, more preferably 0.500 or more, further preferably 0.505 or more. In addition, the ratio $Spk_B/Spk_A$ is preferably 0.710 or less, more preferably 0.700 or less, further preferably 0.690 or less.

The ratio $Svk_B/Svk_A$ is preferably 0.750 or more, more preferably 0.760 or more, further preferably 0.780 or more. In addition, the ratio $Svk_B/Svk_A$ is preferably 1.240 or less, more preferably 1.200 or less, further preferably 1.150 or less.

The Svk value ($Svk_A$) of the first surface is not limited but is preferably 0.005 µm or more, more preferably 0.007 µm or more, further preferably 0.008 µm or more, especially preferably 0.009 µm or more. In addition, the Svk value ($Svk_A$) of the first surface is not limited but is preferably 0.050 µm or less, more preferably 0.040 µm or less, further preferably 0.035 µm or less.

The Svk value ($Svk_B$) of the second surface is not limited but is preferably 0.005 µm or more, more preferably 0.007 µm or more, further preferably 0.008 µm or more, especially preferably 0.009 µm or more. In addition, the Svk value ($Svk_B$) of the second surface is not limited but is preferably 0.050 µm or less, more preferably 0.040 µm or less, further preferably 0.035 µm or less, especially preferably 0.030 µm.

The Spk value ($Spk_A$) of the first surface is not limited but is preferably 0.030 µm or more, more preferably 0.040 µm or more, further preferably 0.043 µm or more, especially preferably 0.045 µm or more. In addition, the Spk value ($Spk_A$) of the first surface is not limited but is preferably 0.090 µm or less, more preferably 0.080 µm or less, further preferably 0.075 µm or less.

The Spk value ($Spk_B$) of the second surface is not limited but is preferably 0.010 µm or more, more preferably 0.015 µm or more, further preferably 0.020 µm or more, especially preferably 0.025 µm or more. In addition, the Spk value ($Spk_B$) of the second surface is not limited but is preferably 0.060 µm or less, more preferably 0.055 µm or less, further preferably 0.050 µm or less.

The polypropylene film includes a metal layer formed on either or both of the first surface and the second surface, and the first surface and the second surface are in contact with each other in a state in which the metal layer formed thereon when the polypropylene film is wound. According to the polypropylene film, the ratios attained using the Spk value ($Spk_A$) of the first surface, the Spk value ($Spk_A$) of the first surface, the Svk value ($Svk_B$) of the second surface, and the Spk value ($Spk_B$) of the second surface are within the numerical ranges and the degrees of surface roughening are different from each other within the numerical ranges. Hence, the contact area between the first surface and the second surface when the polypropylene film is wound decreases, the gaps between the first surface and the second surface due to moderate coarse protrusions can be maintained, and excellent cushioning property is exhibited. As a result, it is possible to suppress blocking as can be seen from Examples as well. In addition, according to the polypropylene film, the processability in the slitting step is also excellent as a preferred case.

In addition, the polypropylene film is generally wound by using a plurality of conveying rolls while applying tension to the polypropylene film in order not to cause wrinkling and meandering. Therefore, not only one surface touches the conveying rolls, but the winding is performed while both surfaces touch one of the conveying rolls.

According to the polypropylene film, both surfaces of the polypropylene film are roughened to about an equal degree and thus the slipperiness with respect to the conveying rolls is suitable on both surfaces when the polypropylene film after being biaxially stretched is wound into a roll. As a result, suitable conveying property is attained, wrinkling and winding shift are suppressed, and the element winding processability is improved.

Here, it is preferred that the degree of roughening of the first surface is about equal to that of the second surface when only the conveying property is taken into consideration. However, it is preferred that the degree of roughening of the first surface is different from that of the second surface when the dielectric strength is taken into consideration. Hereinafter, this point will be described.

In general, the thickness of the film is such that the apex of the convex portion is the end portion of the thickness in a case in which there are irregularities on the surface. In other words, in a case in which there are irregularities on both the first surface and the second surface, the distance from the apex of the convex portion present on the first surface to the apex of the convex portion present on the second surface is the film thickness.

Here, the thickness of the core portion is the thickness attained by subtracting the height of the convex portion of the first surface and the height of the convex portion of the second surface. Hence, when a polypropylene film of which both surfaces are roughened is fabricated, the thickness of the core portion is thin, a leakage current is likely to be generated, and the dielectric strength decreases.

Consequently, in the second embodiment, the polypropylene film is configured to set (1) the Svk value ($Svk_A$) of the first surface and the Svk value ($Svk_B$) of the second surface to be about the same, namely, the depths of the valley portions, which can also be said to be an index of roughening, to be about the same on the first surface and the second surface and to ensure the thickness of the core portion by setting (2) the Spk value ($Spk_B$) of the second surface to be smaller than the Spk value ($Spk_A$) of the first surface for the coarse protrusions. In this manner, the conveying property due to roughening is exhibited while the dielectric strength is maintained.

As described above, according to the polypropylene film according to the second embodiment, it is possible to suppress blocking and further to achieve all the processability in the slitting step, conveying property, and dielectric strength.

The Svk value ($Svk_A$) of the first surface, the Spk value ($Spk_A$) of the first surface, the Svk value ($Svk_B$) of the second surface, and the Spk value ($Spk_B$) of the second surface are determined by measuring the surface shapes by a three-dimensional surface roughness evaluation method using an optical interference type non-contact surface shape measuring instrument. By the "three-dimensional surface roughness evaluation method", the height of the entire film surface is evaluated and thus the shape of the film surface is three-dimensionally evaluated. Hence, it is possible to grasp the local minute change or modification of the surface to be measured and to more accurately evaluate the surface roughness. It is possible to suppress blocking by evaluating the film surface roughness not simply using the heights of protrusions (two-dimensional surface roughness evaluation by general centerline average roughness Ra and the like) but using the average height of three-dimensional protruding hill portions and average height of protruding valley portions. In addition, it is possible to have a configuration achieving all the favorable processability in the slitting step, conveying property, and dielectric strength.

More specifically, the Svk value ($Svk_A$) of the first surface, the Spk value ($Spk_A$) of the first surface, the Svk value ($Svk_B$) of the second surface, and the Spk value ($Spk_B$) of the second surface are values measured using "VertScan 2.0 (model: R5500GML)" available from Ryoka Systems, Inc. as an optical interference type non-contact surface shape measuring instrument.

The details of the measuring method will be described below.

First, the measurement is performed in a region of 470.92 μm×353.16 μm per one visual field at the WAVE mode by applying a 530 white filter and a 1×BODY lens tube and using an objective lens (10×). This operation is performed at 10 positions at 1 cm intervals in the machine direction from the position to be the center in both the machine direction and width direction of the target sample (polypropylene film).

Next, the acquired data is subjected to noise removal processing by a median filter (3×3) and then to Gaussian filter processing at a cutoff value of 30 μm to remove the waviness component. By this, a state is attained in which the state of the roughened surface can be properly measured.

Next, analysis is performed using the "ISO parameter" in the plug-in function "Bearing" of the analysis software "VS-Viewer" of "VertScan 2.0".

Finally, the average values are each calculated for the respective values ($Svk_A$, $Spk_A$, $Svk_B$, $Spk_B$, $Sq_A$, $Sq_B$, $Sa_A$, $Sa_B$, $Sk_A$, and $Sk_B$) attained at the 10 positions. In this manner, the Svk value ($Svk_A$) of the first surface, the Spk value ($Spk_A$) of the first surface, the Svk value ($Svk_B$) of the second surface, and the Spk value ($Spk_B$) of the second surface are attained. In addition, $Sq_A$, $Sq_B$, $Sa_A$, $Sa_B$, $Sk_A$, and $Sk_B$ are also attained in the same manner.

More specifically, the method described in Examples is adopted.

It is preferred that the ratio $Sq_B/Sq_A$ of the Sq value ($Sq_B$) of the second surface to the Sq value ($Sq_A$) of the first surface, the $Sq_A$, $Sq_B$, the ratio $Sa_B/Sa_A$ of the Sa value ($Sa_B$) of the second surface to the Sa value ($Sa_A$) of the first surface, the $Sa_A$, the $Sa_B$, the ratio $Sk_B/Sk_A$ of the Sk value ($Sk_B$) of the second surface to the Sk value ($Sk_A$) of the first surface, the $Sk_A$, and the $Sk_B$ of the polypropylene film are within the numerical ranges described in the section of "embodiment of first present invention". Moreover, the meanings and determining methods of these parameters have been described in the section of "embodiment of first present invention", and thus description thereof is omitted here.

The method for setting the Svk value ($Svk_A$) of the first surface, the Spk value ($Spk_A$) of the first surface, the Svk value ($Svk_B$) of the second surface, the Spk value ($Spk_B$) of the second surface, the ratio $Spk_B/Spk_A$, the ratio $Svk_B/Svk_A$, the Sq value ($Sq_A$) of the first surface, the Sq value ($Sq_B$) of the second surface, the ratio $Sq_B/Sq_A$, the Sa value ($Sa_A$) of the first surface, the Sa value ($Sa_B$) of the second surface, the ratio $Sa_B/Sa_A$, the Sk value ($Sk_A$) of the first surface, the Sk value ($Sk_B$) of the second surface, and the ratio $Sk_B/Sk_A$ to be within the numerical ranges is not particularly limited, but these values can be appropriately adjusted by (i) the selection of the kinds, stereoregularity, molecular weight distribution, and differential distribution value difference $D_M$ of resins (raw material resins) constituting the polypropylene film, (ii) the contents of the respective resins with respect to the entire polypropylene film, (iii) the stretch ratios in the longitudinal and transverse directions at the time of stretching and the stretching temperature, (iv) the selection of the kinds of additives (particularly nucleating agent) and the contents thereof, and the like.

The method for setting the Svk value ($Svk_A$) of the first surface and the Svk value ($Svk_B$) of the second surface to be different from each other, the method for settiating the Spk value ($Spk_A$) of the first surface and the Spk value ($Spk_B$) of the second surface to be different from each other, the method for setting the Sq value ($Sq_A$) of the first surface and the Sq value ($Sq_B$) of the second surface to be different from each other, the method for setting the Sa value ($Sa_A$) of the first surface and the Sa value ($Sa_B$) of the second surface to be different from each other, and the method for setting the Sk value ($Sk_A$) of the first surface and the Sk value ($Sk_B$) of the second surface to be different from each other are not particularly limited, but these values can be adjusted by, for example, fabricating a cast sheet with the first surface as the cast roll side surface and the second surface as the air knife side surface and biaxially stretching this cast sheet.

Both surfaces of the polypropylene film may be roughened by crater-like fine irregularities. The crater-like fine irregularities have been described in the section of "embodiment of first present invention", and thus description thereof is omitted here.

In the polypropylene film, the ellipse density $D_A$ on the first surface is preferably 50 to 120 pieces/mm². In addition, the ellipse density $D_B$ on the second surface is preferably lower than the $D_A$. In addition, the ellipse density $D_B$ on the second surface is preferably 1 to 90 pieces/mm².

The ellipse density $D_A$ is more preferably 85 to 120 pieces/mm², further preferably 90 to 105 pieces/mm².

The ellipse density $D_B$ is more preferably 1 to 12 pieces/mm², further preferably 3 to 11 pieces/mm², especially preferably 4 to 10 pieces/mm².

The method for determining the ellipse density has been described in the section of "embodiment of first present invention", and thus description thereof is omitted here.

When the ellipse density $D_A$ on the first surface is 50 to 120 pieces/mm² and the ellipse density $D_B$ on the second surface is 1 to 90 pieces/mm², it is possible to further decrease the contact area between the first surface and the second surface when the polypropylene film is wound.

Specifically, when the ellipse density $D_A$ on the first surface is 50 to 120 pieces/mm², it can be said that the number of "ellipses" is relatively large. Hence, the surface is roughened to a greater degree. Meanwhile, when the ellipse density $D_B$ on the second surface is 1 to 90 pieces/mm², it can be said that the number of "ellipses" is relatively small. Hence, the degree of roughening is low although the surface is roughened.

It is possible to prevent the film from meandering to left and right in the slitting step processing and the end surfaces of small roll from being unmatched if the ellipse density $D_A$ on the first surface is set to 50 to 120 pieces/mm² and the ellipse density $D_B$ on the second surface is set to 1 to 90 pieces/mm² in this manner. As a result, it is possible to improve the processability in the slitting step as can be seen from Examples as well.

In addition, when the ellipse density $D_A$ on the first surface is 50 to 120 pieces/mm² and the ellipse density $D_B$ on the second surface is 1 to 90 pieces/mm², both surfaces of the polypropylene film are more suitably roughened, and thus the slipperiness with respect to the conveying rolls is more suitable on both surfaces when the polypropylene film after being biaxially stretched is wound into a roll. As a result, more suitable conveying property is attained and wrinkling and winding shift are further suppressed.

Here, it is preferred that the degree of roughening of the first surface is about equal to that of the second surface when only the conveying property is taken into consideration. However, it is preferred that the degree of roughening of the first surface is different from that of the second surface when the dielectric strength is taken into consideration. Generally, when the surface is roughened, thin parts (concave portions of irregularities) of the film cause leakage current. Hence, it is possible to diminish the number of irregularities that may cause leakage current if the ellipse density $D_B$ on the second surface is set to be lower than the ellipse density $D_A$ on the first surface. Specifically, it can be said that the number of irregularities that may cause leakage current is small when the ellipse density $D_B$ on the second surface is 1 to 90 pieces/mm$^2$. As a result, a configuration is attained in which conveying property due to roughening is more suitably exhibited while the dielectric strength is more suitably maintained.

The average major axis length $L_A$ of the ellipses constituting the ellipse density $D_A$ on the first surface, the average major axis length $L_B$ of the ellipses constituting the ellipse density $D_B$ on the second surface, the ellipse perfectness $P_A$ of the ellipses constituting the ellipse density $D_A$ on the first surface, and the ellipse perfectness $P_B$ of the ellipses constituting the ellipse density $D_B$ on the second surface are preferably within the numerical ranges described in the section of "embodiment of first present invention". Moreover, the meanings and determining methods of these parameters have been described in the section of "embodiment of first present invention", and thus description thereof is omitted here.

The direct current dielectric breakdown strength ES of the polypropylene film at 100° C. and the direct current dielectric breakdown strength ES of the polypropylene film at 120° C. are preferably within the numerical ranges described in the section of "embodiment of first present invention".

The ash content in the polypropylene film is preferably within the numerical range described in the section of "embodiment of first present invention". The method for determining the ash content has been described in the section of "embodiment of first present invention", and thus description thereof is omitted here.

The thickness of the polypropylene film is preferably within the numerical range described in the section of "embodiment of first present invention". The method for determining the thickness has been described in the section of "embodiment of first present invention", and thus description thereof is omitted here.

The polypropylene film may be a biaxially-oriented film, a uniaxially-oriented film, or a nonoriented film. Among these, the polypropylene film is a biaxially-oriented film from the viewpoint of easily setting the Spk value (Spk$_A$) of the first surface, the Spk value (Spk$_A$) of the first surface, the Svk value (Svk$_B$) of the second surface, and the Spk value (Spk$_B$) of the second surface to be within the numerical ranges.

The polypropylene film and the metal layer-integrated polypropylene film are each wound into a roll and preferably in the form of a film roll. The film roll may or may not have a winding core (core). The film roll preferably has a winding core (core). The material for the winding core of the film roll is not particularly limited. As the material, the materials for the winding core described in the section of "embodiment of first present invention" can be adopted.

As described above, the polypropylene film contains a polypropylene resin as the main component. As the polypropylene resin, the polypropylene resins described in the section of "embodiment of first present invention" can be adopted.

The polypropylene film may contain resins other than the polypropylene resins. In addition, the polypropylene film may further contain at least one kind of additive in addition to the resin components. As the other resins and additives, the polypropylene resins described in the section of "embodiment of first present invention" can be adopted.

The polypropylene film is preferably biaxially stretched. In a case in which the polypropylene film is a biaxially-oriented polypropylene film, the biaxially-oriented polypropylene film can be produced by a generally known method for producing a biaxially-oriented polypropylene film. The biaxially-oriented polypropylene film can be produced, for example, by fabricating a cast sheet from a polypropylene resin composition obtained by mixing the linear polypropylene resin A, the linear polypropylene resin B, and the long-chain branched polypropylene resin C with other resins, additives and the like if necessary and then biaxially stretching the cast sheet.

<Preparation of Polypropylene Resin Composition>

As the method for preparing the polypropylene resin composition, the method described in the section of "embodiment of first present invention" can be adopted.

<Fabrication of Cast Sheet>

As the method for fabricating the cast sheet, the method described in the section of "embodiment of first present invention" can be adopted.

<Stretching Treatment>

The biaxially-oriented polypropylene film can be produced by subjecting the cast sheet to a stretching treatment. As the stretching treatment method, the method described in the section of "embodiment of first present invention" can be adopted.

The polypropylene film may be subjected to a corona discharge treatment online or offline after end of the stretching and thermosetting steps. As the corona discharge treatment, the method described in the section of "embodiment of first present invention" can be adopted.

In order to process the polypropylene film as a capacitor, a metal layer may be stacked on either surface or both surfaces of the polypropylene film to obtain a metal layer-integrated polypropylene film. As the material for and the stacking method of the metal layer, the contents described in the section of "embodiment of first present invention" can be adopted.

A plurality of the metal layer-integrated polypropylene films can be stacked by a conventionally known method or subjected to an element winding processing (winding) to be formed into a film capacitor.

As a specific method for fabricating the film capacitor, the method described in the section of "embodiment of first present invention" can be adopted.

Heretofore, the second embodiment (the embodiment according to the second present invention) has been described.

Embodiment According to Third Present Invention

Hereinafter, an embodiment of the third present invention will be described. Incidentally, in the polypropylene film according to the embodiment of the third present invention, the Svk value ($Svk_A$) of the first surface is not required to be 0.005 μm or more and 0.030 μm or less as in the embodiment of the first present invention. In addition, the Spk value ($Spk_A$) of the first surface is not required to be more than 0.035 μm and 0.080 μm or less. In addition, the Svk value ($Svk_B$) of the second surface is not required to be 0.005 μm or more and 0.030 μm or less. In addition, the Spk value ($Spk_B$) of the second surface is not required to be 0.015 μm or more and 0.035 μm or less.

In addition, in the polypropylene film according to the embodiment of the third present invention, the ratio $Spk_B/Spk_A$ of the Spk value ($Spk_B$) of the second surface to the Spk value ($Spk_A$) of the first surface is not required to be 0.490 or more and 0.730 or less as in the embodiment of the second present invention. In addition, the ratio $Svk_B/Svk_A$ of the Svk value ($Svk_B$) of the second surface to the Svk value ($Svk_A$) of the first surface is not required to be 0.735 or more and 1.250 or less.

The polypropylene film according to the embodiment of the third present invention (hereinafter, also referred to as "third embodiment") is a polypropylene film having a first surface and a second surface, in which the polypropylene film contains a polypropylene resin as a main component;

an ellipse density $D_A$ on the first surface is 85 to 120 pieces/mm²; and an ellipse density $D_B$ on the second surface is 1 to 12 pieces/mm².

The ellipse density $D_A$ is more preferably 85 to 110 pieces/mm², further preferably 90 to 105 pieces/mm².

The ellipse density $D_B$ is more preferably 3 to 11 pieces/mm², further preferably 4 to 10 pieces/mm².

Both surfaces of the polypropylene film are roughened by crater-like fine irregularities. The crater-like fine irregularities have been described in the section of "embodiment of first present invention", and thus description thereof is omitted here.

The ellipse density $D_A$ on the first surface is 85 to 120 pieces/mm² and the ellipse density $D_B$ on the second surface is 1 to 12 pieces/mm², thus the contact area between the first surface and the second surface when the polypropylene film is wound decreases, the gap between the first surface and the second surface can be maintained due to the difference in ellipse density, and excellent cushioning property is exhibited. As a result, it is possible to suppress blocking as can be seen from Examples as well.

In addition, the ellipse density $D_A$ on the first surface is 85 to 120 pieces/mm² and it can be said that the number of "ellipses" is relatively large. Hence, the surface is roughened to a greater degree. Meanwhile, the ellipse density $D_B$ on the second surface is 1 to 12 pieces/mm² and it can be said that the number of "ellipses" is relatively small. Hence, the degree of roughening is low although the surface is roughened.

It is possible to prevent the film from meandering to left and right in the slit processing and the end surfaces of small roll from being unmatched if the ellipse density $D_A$ on the first surface is set to 85 to 120 pieces/mm² and the ellipse density $D_B$ on the second surface is set to 1 to 12 pieces/mm² in this manner. As a result, it is possible to improve the processability in the slitting step as can be seen from Examples as well.

In addition, the polypropylene film is generally wound by using a plurality of conveying rolls while applying tension to the polypropylene film in order not to cause wrinkling and meandering. Therefore, not only one surface touches the conveying rolls, but the winding is performed while both surfaces touch one of the conveying rolls.

According to the polypropylene film, both surfaces of the polypropylene film are roughened and thus the slipperiness with respect to the conveying rolls is suitable on both surfaces when the polypropylene film after being biaxially stretched is wound into a roll. As a result, suitable conveying property is attained and wrinkling and winding shift are suppressed.

Specifically, the ellipse density $D_A$ on the first surface is 85 to 120 pieces/mm² and the ellipse density $D_B$ on the second surface is 1 to 12 pieces/mm², thus both surfaces of the polypropylene film are suitably roughened, and thus the slipperiness with respect to the conveying rolls is suitable on both surfaces when the polypropylene film after being biaxially stretched is wound into a roll. As a result, suitable conveying property is attained, wrinkling and winding shift are further suppressed, and the element winding processability is improved.

Here, it is preferred that the degree of roughening of the first surface is about equal to that of the second surface when only the conveying property is taken into consideration. However, it is preferred that the degree of roughening of the first surface is different from that of the second surface when the dielectric strength is taken into consideration. Generally, when the surface is roughened, thin parts (concave portions of irregularities) of the film cause leakage current. Hence, it is possible to diminish the number of irregularities that may cause leakage current if the ellipse density $D_B$ on the second surface is set to be lower than the ellipse density $D_A$ on the first surface. Specifically, it can be said that the number of irregularities that may cause leakage current is small when the ellipse density $D_B$ on the second surface is 1 to 12 pieces/mm². As a result, a configuration is attained in which more suitable conveying property due to roughening is exhibited while the dielectric strength is suitably maintained.

As described above, according to the polypropylene film according to the third embodiment, it is possible to suppress blocking and further to achieve all the processability in the slitting step, conveying property, and dielectric strength.

The method for determining the ellipse density has been described in the section of "embodiment of first present invention", and thus description thereof is omitted here.

The average major axis length $L_A$ of the ellipses constituting the ellipse density $D_A$ on the first surface, the average major axis length $L_B$ of the ellipses constituting the ellipse density $D_B$ on the second surface, the ellipse perfectness $P_A$ of the ellipses constituting the ellipse density $D_A$ on the first surface, and the ellipse perfectness $P_B$ of the ellipses constituting the ellipse density $D_B$ on the second surface are preferably within the numerical ranges described in the section of "embodiment of first present invention". Moreover, the meanings and determining methods of these parameters have been described in the section of "embodiment of first present invention", and thus description thereof is omitted here.

It is preferred that the ratio $Sq_B/Sq_A$ of the Sq value ($Sq_B$) of the second surface to the Sq value ($Sq_A$) of the first surface, the $Sq_A$, $Sq_B$, the ratio $Sa_B/Sa_A$ of the Sa value ($Sa_B$) of the second surface to the Sa value ($Sa_A$) of the first surface, the $Sa_A$, the $Sa_B$, the ratio $Sk_B/Sk_A$ of the Sk value ($Sk_B$) of the second surface to the Sk value ($Sk_A$) of the first surface, the $Sk_A$, and the $Sk_B$ of the polypropylene film are within the numerical ranges described in the section of "embodiment of first present invention". Moreover, the meanings and determining methods of these parameters have been described in the section of "embodiment of first present invention", and thus description thereof is omitted here.

The method for setting the ellipse density $D_A$ on the first surface, the ellipse density $D_B$ on the second surface, the average major axis length $L_A$ of the ellipses constituting the ellipse density $D_A$ on the first surface, the average major axis length $L_B$ of the ellipses constituting the ellipse density $D_B$ on the second surface, the Sq value ($Sq_A$) of the first surface, the Sq value ($Sq_B$) of the second surface, the ratio $Sq_B/Sq_A$, the Sa value ($Sa_A$) of the first surface, the Sa value ($Sa_B$) of the second surface, the ratio $Sa_B/Sa_A$, the Sk value ($Sk_A$) of the first surface, the Sk value ($Sk_B$) of the second surface, and the ratio $Sk_B/Sk_A$ to be within the numerical ranges is not particularly limited, but these values can be appropriately adjusted by (i) the selection of the kinds, stereoregularity, molecular weight distribution, and differential distribution value difference $D_M$ of resins (raw material resins) constituting the polypropylene film, (ii) the contents of the respective resins with respect to the entire polypropylene film, (iii) the stretch ratios in the longitudinal and transverse directions at the time of stretching and the stretching temperature, (iv) the selection of the kinds of additives (particularly nucleating agent) and the contents thereof, and the like.

The method for setting the ellipse density $D_A$ on the first surface and the ellipse density $D_B$ on the second surface to be different from each other, the method for setting the average major axis length $L_A$ of the ellipses constituting the ellipse density $D_A$ on the first surface and the average major axis length $L_B$ of the ellipses constituting the ellipse density $D_B$ on the second surface to be different from each other, the method for setting the Sq value ($Sq_A$) of the first surface and the Sq value ($Sq_B$) of the second surface to be different from each other, the method for setting the Sa value ($Sa_A$) of the first surface and the Sa value ($Sa_B$) of the second surface to be different from each other, and the method for setting the Sk value ($Sk_A$) of the first surface and the Sk value ($Sk_B$) of the second surface to be different from each other are not particularly limited, but these values can be adjusted by, for example, fabricating a cast sheet with the first surface as the cast roll side surface and the second surface as the air knife side surface and biaxially stretching this cast sheet.

The direct current dielectric breakdown strength ES of the polypropylene film at 100° C. and the direct current dielectric breakdown strength ES of the polypropylene film at 120° C. are preferably within the numerical ranges described in the section of "embodiment of first present invention".

The ash content in the polypropylene film is preferably within the numerical range described in the section of "embodiment of first present invention". The method for determining the ash content has been described in the section of "embodiment of first present invention", and thus description thereof is omitted here.

The thickness of the polypropylene film is preferably within the numerical range described in the section of "embodiment of first present invention". The method for determining the thickness has been described in the section of "embodiment of first present invention", and thus description thereof is omitted here.

The polypropylene film may be a biaxially-oriented film, a uniaxially-oriented film, or a nonoriented film. Among these, the polypropylene film is preferably a biaxially-oriented film from the viewpoint of easily setting the ellipse density $D_A$ and the ellipse density $D_B$ to be within the numerical ranges.

The polypropylene film and the metal layer-integrated polypropylene film are each wound into a roll and preferably in the form of a film roll. The film roll may or may not have a winding core (core). The film roll preferably has a winding core (core). The material for the winding core of the film roll is not particularly limited. As the material, the materials for the winding core described in the section of "embodiment of first present invention" can be adopted.

As described above, the polypropylene film contains a polypropylene resin as the main component. As the polypropylene resin, the polypropylene resins described in the section of "embodiment of first present invention" can be adopted.

The polypropylene film may contain resins other than the polypropylene resins. In addition, the polypropylene film may further contain at least one kind of additive in addition to the resin components. As the other resins and additives, the polypropylene resins described in the section of "embodiment of first present invention" can be adopted.

The polypropylene film is preferably biaxially stretched. In a case in which the polypropylene film is a biaxially-oriented polypropylene film, the biaxially-oriented polypropylene film can be produced by a generally known method for producing a biaxially-oriented polypropylene film. The biaxially-oriented polypropylene film can be produced, for example, by fabricating a cast sheet from a polypropylene resin composition obtained by mixing the linear polypropylene resin A, the linear polypropylene resin B, and the long-chain branched polypropylene resin C with other resins, additives and the like if necessary and then biaxially stretching the cast sheet.

<Preparation of Polypropylene Resin Composition>

As the method for preparing the polypropylene resin composition, the method described in the section of "embodiment of first present invention" can be adopted.

<Fabrication of Cast Sheet>

As the method for fabricating the cast sheet, the method described in the section of "embodiment of first present invention" can be adopted.

<Stretching Treatment>

The biaxially-oriented polypropylene film can be produced by subjecting the cast sheet to a stretching treatment. As the stretching treatment method, the method described in the section of "embodiment of first present invention" can be adopted.

The polypropylene film may be subjected to a corona discharge treatment online or offline after end of the stretching and thermosetting steps. As the corona discharge treatment, the method described in the section of "embodiment of first present invention" can be adopted.

In order to process the polypropylene film as a capacitor, a metal layer may be stacked on either surface or both surfaces of the polypropylene film to obtain a metal layer-integrated polypropylene film. As the material for and the stacking method of the metal layer, the contents described in the section of "embodiment of first present invention" can be adopted.

A plurality of the metal layer-integrated polypropylene films can be stacked by a conventionally known method or subjected to an element winding processing (winding) to be formed into a film capacitor.

Specifically, a blade is placed in the center of each margin portion of the metal layer-integrated polypropylene film and slit processing is performed to fabricate a take-up reel having a margin on one surface thereof.

Here, in the polypropylene film, the ellipse density $D_A$ and the ellipse density $D_B$ are within predetermined numerical ranges and thus blocking is suppressed. Hence, it is possible to prevent the polypropylene film from blocking and wrinkling in the machine direction of the film from occurring at the time of the slitting processing.

Next, two sheets of a take-up reel with a left margin and a take-up reel with a right margin are superposed and wound in the width direction so that the vapor deposition part protrudes more than the margin portion (element winding processing). Next, the core material is removed from the wound body and the wound body is pressed. Next, external electrodes are formed on both end surfaces, and further the external electrodes are provided with lead wires. In this manner, a wound film capacitor is obtained.

Heretofore, the embodiment according to the third present invention has been described.

EXAMPLES

Hereinafter, the present invention (first present invention, second present invention, and third present invention) will be described in detail with reference to Examples, but the present invention (first present invention, second present invention, and third present invention) is not limited to the following Examples as long as the gist is not exceeded.

Examples According to First Present Invention

Hereinafter, Examples according to the first present invention will be first described.

[Polypropylene Resin]

Table 1 shows polypropylene resins used to produce polypropylene films of Examples and Comparative Examples.

Resin A1 shown in Table 1 is a product available from Prime Polymer Co., Ltd. Resin A2 is a product available from Prime Polymer Co., Ltd. Resin B1 is S802M available from KOREA PETRO CHEMICAL IND CO., LTD. Resin B2 is HPT-1 available from KOREA PETRO CHEMICAL IND CO., LTD. Resin B3 is available from KOREA PETRO CHEMICAL IND CO., LTD. Resin C1 is MFX6 available from JAPAN POLYPROPYLENE CORPORATION. Resin X1 is WB135HMS (Daploy HMS-PP) available from Borealis. Incidentally, MFX6 is a long-chain branched polypropylene resin polymerized using a metallocene catalyst. WB135HMS is a long-chain branched polypropylene resin obtained through crosslinking modification by a peroxide. Resin A1 and Resin A2 correspond to the linear polypropylene resin A. Resin B1, Resin B2, and Resin B3 correspond to the linear polypropylene resin B. Resin C1 corresponds to the long-chain branched polypropylene resin C. Resin A1, Resin A2, Resin B1, Resin B2, and Resin B3 are all homopolypropylene resins. Resin X2 is a product available from Prime Polymer Co., Ltd. and is linear homopolypropylene.

Table 1 shows the number average molecular weight (Mn), weight average molecular weight (Mw), z average molecular weight (Mz), molecular weight distribution (Mw/Mn), and molecular weight distribution (Mz/Mn) of each resin. These values are values attained when the resins are in the form of raw material resin pellets. The measuring methods are as follows.

<Measurement of Number Average Molecular Weight (Mn), Weight Average Molecular Weight (Mw), z Average Molecular Weight (Mz), Molecular Weight Distribution (Mw/Mn), and Molecular Weight Distribution (Mz/Mn) of Linear Polypropylene Resin>

The weight average molecular weight (Mw), number average molecular weight (Mn), z average molecular weight (Mz), molecular weight distribution (Mw/Mn), and molecular weight distribution (Mz/Mn) of each resin were measured by GPC (gel permeation chromatography) under the following conditions.

Specifically, a differential refractometer (RI)-incorporated high temperature GPC apparatus, model HLC-8121GPC-HT available from TOSOH CORPORATION was used. As the column, three TSKgel GMHHR-H(20)HT available from TOSOH CORPORATION were connected and used. The measurement was performed by setting the column temperature to 140° C. and allowing trichlorobenzene as an eluent to flow at a flow rate of 1.0 ml/min. A calibration curve regarding molecular weight M was created using standard polystyrene available from TOSOH CORPORATION, and measured values were converted into the molecular weight of polypropylene using the Q-factor to attain the weight average molecular weight (Mw), number average molecular weight (Mn), and z average molecular weight (Mz). The molecular weight distribution (Mw/Mn) was attained using these values of Mw and Mn. In addition, the molecular weight distribution (Mz/Mn) was attained using these values of Mz and Mn.

<Measurement of Number Average Molecular Weight (Mn), Weight Average Molecular Weight (Mw), z Average Molecular Weight (Mz), Molecular Weight Distribution (Mw/Mn), and Molecular Weight Distribution (Mz/Mn) of Long-Chain Branched Polypropylene>

The number average molecular weight (Mn), weight average molecular weight (Mw), z average molecular weight (Mz), molecular weight distribution (Mw/Mn), and molecular weight distribution (Mz/Mn) of polypropylene were measured by GPC (gel permeation chromatography) under the following conditions.

A differential refractometer (RI)-incorporated high temperature GPC apparatus, model HLC-8121GPC-HT available from TOSOH CORPORATION was used. As the column, three TSKgel GMHHR-H(20)HT available from TOSOH CORPORATION were connected and one TSKgel guard column HHR (30) was further used. The measurement was performed by setting the column temperature to 140° C. and allowing 0.05 wt % 2,6-di-tert-butyl-para-cresol (general name: BHT) in 1,2,4-trichlorobenzene as an eluent to flow at a flow rate of 1.0 ml/min, and the weight average molecular weight (Mw), number average molecular weight (Mn), and z average molecular weight (Mz) were attained. The molecular weight distribution (Mz/Mn) was attained using these values of Mz and Mn, and the molecular weight distribution (Mw/Mn) was attained using these values of Mw and Mn. The measurement conditions are as follows.

GPC apparatus: HLC-8121GPC/HT (available from TOSOH CORPORATION)

Light scattering detector: DAWN EOS (Wyatt Technology Corporation),

Column: TSKgel guard column HHR (30) (7.8 mm ID×7.5 cm)×1+TSKgelGMH—HR-H(20)HT (7.8 mm ID×30 cm)×3 (available from TOSOH CORPORATION)

Eluent: 0.05 wt % BHT in 1,2,4-trichlorobenzene

Flow rate: 1.0 ml/min

Sample concentration: 2 mg/mL

Injection volume: 300 μL
Column temperature: 140° C.
System temperature: 40° C.
Pretreatment: The sample was precisely weighed, added to the eluent, shaken and dissolved at 140° C. for 1 hour, and heat-filtered through a 0.5 μm sintered metal filter.
<Measurement of Differential Distribution Value when Logarithmic Molecular Weight Log(M)=4.5, Differential Distribution Value when Logarithmic Molecular Weight Log (M)=6.0, and Differential Distribution Value Difference $D_M$>

For each resin, the differential distribution value when the logarithmic molecular weight log (M)=4.5 and the differential distribution value when the logarithmic molecular weight log (M)=6.0 were attained by the following methods. First, the time curve (elution curve) of the intensity distribution detected by using the RI detector was converted into a distribution curve with respect to the molecular weight M (Log(M)) of standard polystyrene using the calibration curve created using the standard polystyrene. Next, the integral distribution curve with respect to Log(M) when the total area of the distribution curve was 100% was attained, and then this integral distribution curve was differentiated by Log(M) to attain the differential distribution curve with respect to Log(M). From this differential distribution curve, the differential distribution values at Log(M)=4.5 and Log(M)=6.0 were read out. In addition, the difference between the differential distribution value when Log(M)=4.5 and the differential distribution value when Log(M)=6.0 was defined as the differential distribution value difference $D_M$. Incidentally, the series of operations until the differential distribution curve was attained was performed using analytical software incorporated in the GPC measuring apparatus used. The results are shown in Table 1.

<Measurement of Melt Flow Rate (MFR)>

For each resin, the melt flow rate (MFR) in the form of raw material resin pellets was measured in accordance with the condition M of JIS K 7210 using a melt indexer available from TOYO SEIKI Co., Ltd. Specifically, 4 g of sample was first inserted into a cylinder set to a test temperature of 230° C. and preheated for 3.5 minutes under a load of 2.16 kg. Thereafter, the weight of the sample extruded through the bottom hole for 30 seconds was measured, and MFR (g/10 min) was determined. The measurement was repeated three times, and the average value thereof was taken as the measured value of MFR. The results are shown in Table 1.

<Measurement of Heptane Insoluble (HI)>

Each resin was press-molded into a size of 10 mm×35 mm×0.3 mm and a sample for measurement of about 3 g was fabricated. Next, about 150 mL of heptane was added thereto and Soxhlet extraction was performed for 8 hours. The heptane insolubles were calculated from the sample masses before and after the extraction. The results are shown in Table 1.

<Measurement of Ash Content>

The ash content in each resin was measured as follows. A sample was weighed by about 200 g, transferred to a platinum dish, and asked at 800° C. for 40 minutes. The ash content (ppm) was measured from the obtained ash residue. The results are shown in Table 1.

<Mesopentad Fraction>

Each resin was dissolved in a solvent and subjected to the measurement under the following conditions using a high temperature type Fourier transformation nuclear magnetic resonance apparatus (high temperature FT-NMR).

High temperature type nuclear magnetic resonance (NMR) apparatus: high temperature type Fourier transformation nuclear magnetic resonance apparatus (high temperature FT-NMR), JNM-ECP500 available from JEOL Ltd.
Observation nucleus: 13C (125 MHz)
Measurement temperature: 135° C.
Solvent: ortho-dichlorobenzene (ODCB: mixed solvent (mixing ratio=4/1) of ODCB and deuterated ODCB)
Measurement mode: single pulse proton broadband decoupling
Pulse width: 9.1 ρsec (45° pulse)
Pulse interval: 5.5 sec
Number of times of integration: 4,500
Shift basis: CH3 (mmmm)=21.7 ppm The pentad fraction indicating the stereoregularity was calculated in percentage (%) based on the integrated value of the intensity of each signal derived from the combination (mmmm, mrrm and the like) of pentad of isotactic diad "meso (m)" and syndiotactic diad "racemo (r)". Regarding attribution of each signal derived from mmmm, mrrm and the like, for example, description of spectrum in "T. Hayashi et al., Polymer, vol. 29, p. 138 (1988)" and so on were referenced.

TABLE 1

| Resin | | Resin A1 | Resin A2 | Resin B1 | Resin B2 | Resin B3 | Resin C1 | Resin X1 | Resin X2 |
|---|---|---|---|---|---|---|---|---|---|
| Number average molecular weight ($M_n$) ×10³ | | 33 | 34 | 46 | 45 | 44 | 160 | 180 | 47 |
| Weight average molecular weight ($M_w$) ×10³ | | 310 | 340 | 380 | 350 | 350 | 380 | 540 | 270 |
| z average molecular weight ($M_z$) ×10³ | | 1400 | 1500 | 1600 | 1600 | 1500 | 840 | 1500 | 750 |
| Molecular weight distribution | $M_w/M_n$ | 9.4 | 10.0 | 8.3 | 7.8 | 8.0 | 2.4 | 3.0 | 5.7 |
| | $M_z/M_n$ | 42.4 | 45.5 | 34.8 | 35.6 | 34.8 | 5.3 | 8.3 | 16.0 |
| Differential distribution value | log(M) = 4.5 | 33.5 | 33.7 | 27.3 | 31.3 | 32.7 | — | — | 29.9 |
| | log(M) = 6.0 | 24.5 | 23.5 | 30.9 | 27.7 | 25.7 | — | — | 21.4 |
| Differential distribution value difference [%] | | 9.0 | 10.2 | −3.6 | 3.6 | 7.0 | — | — | 8.6 |
| MFR [g/10 min] | | 4.9 | 4.9 | 2.3 | 3.8 | 3.8 | 2.0 | 2.4 | 5.6 |
| Heptane insolubles (HI) [%] | | 97.3 | 97.3 | 98.8 | 98.6 | 98.6 | 98.9 | 97.9 | 97.8 |
| Ash content [ppm] | | 2 × 10 | 2 × 10 | 3 × 10 | 3 × 10 | 3 × 10 | 35 × 10 | 55 × 10 | 2 × 10 |
| Mesopentad fraction [mmmm] [%] | | 95.8 | 95.1 | 98.0 | 97.2 | 96.5 | — | — | 97.4 |

Polypropylene films of Examples and Comparative Examples were produced using the resins described above and the physical properties thereof were evaluated.

<Fabrication of Polypropylene Film>

Example 1

Resin A1, Resin B1, and Resin C1 were dry-blended. The mixing ratio was set to (Resin A1):(Resin B1):(Resin C1)=63:34:3 in terms of mass ratio. After that, the dry-blended resin was melted at a resin temperature of 250° C., then extruded using a T die, wound around a metal drum of which the surface temperature was kept at 95° C., and solidified to fabricate a cast sheet. At this time, the cast sheet was fabricated while pressing the melt-extruded resin composition against the metal drum with an air knife. The unstretched cast sheet obtained was kept at a temperature of 130° C., and allowed to pass between rolls running at different speeds to be stretched to 4.5 times in the machine direction, and immediately cooled to room temperature. Subsequently, the stretched sheet was guided to the tenter, and stretched to 8 times in the width direction at a temperature of 158° C., and then subjected to relaxation and thermosetting, and wound, and subjected to an aging treatment in an atmosphere at about 40° C. to obtain a polypropylene film according to Example 1.

Examples 2 to 5 and Comparative Examples 1 to 6

Polypropylene films according to Examples 2 to 5 and Comparative Examples 1 to 6 were obtained in the same manner as in Example 1 except that the mixing ratio at the time of dry blending of the raw material resins was changed as shown in Table 2.

However, in Comparative Example 6, it was not be able to fabricate a smooth cast sheet because of melt fracture at the time of extrusion molding. For this reason, breakage occurred when the cast sheet was stretched.

Examples 6 to 8, Comparative Example 7, and Comparative Example 8

Polypropylene films according to Examples 6 to 8, Comparative Example 7, and Comparative Example 8 were obtained in the same manner as in Example 1 except that the mixing ratio at the time of dry blending of the raw material resins was changed as shown in Table 2.

TABLE 2

| | Example 1 | Example 2 | Example 3 | Example 4 | Example 5 | Example 6 | Example 7 | Example 8 | Comparative Example 1 |
|---|---|---|---|---|---|---|---|---|---|
| Resin A1 (parts by mass) | 63 | 63 | 63 | 62 | 64 | 60 | 60 | 98 | 65 |
| Resin A2 (parts by mass) | — | — | — | — | — | — | — | — | — |
| Resin B1 (parts by mass) | 34 | 34 | — | 33 | — | — | 30 | — | — |
| Resin B2 (parts by mass) | — | — | 34 | — | 35 | 30 | — | — | 35 |
| Resin B3 (parts by mass) | — | — | — | — | — | — | — | — | — |
| Resin C1 (parts by mass) | 3 | 3 | 3 | 5 | 1 | 10 | 10 | 2 | — |
| Resin X1 (parts by mass) | — | — | — | — | — | — | — | — | — |
| Resin X2 (parts by mass) | — | — | — | — | — | — | — | — | — |

| | Comparative Example 2 | Comparative Example 3 | Comparative Example 4 | Comparative Example 5 | Comparative Example 6 | Comparative Example 7 | Comparative Example 8 |
|---|---|---|---|---|---|---|---|
| Resin A1 (parts by mass) | 65 | 63 | 100 | — | — | — | 98 |
| Resin A2 (parts by mass) | — | — | — | 64 | — | — | — |
| Resin B1 (parts by mass) | 35 | 34 | — | — | — | — | — |
| Resin B2 (parts by mass) | — | — | — | — | — | — | — |
| Resin B3 (parts by mass) | — | — | — | 34 | — | — | — |
| Resin C1 (parts by mass) | — | — | — | — | 100 | 2 | — |

TABLE 2-continued

| | | | | | | | |
|---|---|---|---|---|---|---|---|
| Resin X1 (parts by mass) | — | 3 | — | 2 | — | — | 2 |
| Resin X2 (parts by mass) | — | — | — | — | — | 98 | — |

<Measurement of Thickness of Polypropylene Film>

The thickness of the polypropylene films of Examples and Comparative Examples was measured. Specifically, the thickness was measured in accordance with JIS-C2330 except that the measurement was performed at 100±10 kPa using a paper thickness measuring device MEI-11 available from Citizen Seimitsu Co., Ltd. The results are shown in Table 3.

<Measurement of Svk Value ($Svk_A$) of First Surface, Spk Value ($Spk_A$) of First Surface, Svk Value ($Svk_B$) of Second Surface, Spk Value ($Spk_B$) of Second Surface, Sq Value ($Sq_A$) of First Surface, Sq Value ($Sq_B$) of Second Surface, Sa Value ($Sa_A$) of First Surface, Sa Value ($Sa_B$) of Second Surface, Sk Value ($Sk_A$) of First Surface, and Sk Value ($Sk_B$) of Second Surface>

Hereinafter, the first surface is referred to as "surface A" and the second surface is referred to as "surface B" in some cases. In Table 3 as well, the terms surface A and surface B are used in some cases.

As an optical interference type non-contact surface shape measuring instrument, "VertScan 2.0 (model: R5500GML)" available from Ryoka Systems, Inc. was used.

First, the measurement was performed in a region of 470.92 μm×353.16 μm per one visual field at the WAVE mode by applying a 530 white filter and a 1×BODY lens tube and using an objective lens (10×). This operation was performed at 10 positions at 1 cm intervals in the machine direction from the position to be the center in both the machine direction and width direction of the target sample (polypropylene film).

Next, the acquired data was subjected to noise removal processing by a median filter (3×3) and then to Gaussian filter processing at a cutoff value of 30 μm to remove the waviness component. By this, a state was attained in which the state of the roughened surface was able to be properly measured.

Next, analysis was performed using the "ISO parameter" in the plug-in function "Bearing" of the analysis software "VS-Viewer" of "VertScan 2.0".

Finally, the average values were each calculated for the respective values ($Svk_A$, $Spk_A$, $Svk_B$, $Spk_B$, $Sq_A$, $Sq_B$, $Sa_A$, $Sa_B$, $Sk_A$, and $Sk_B$) attained at the 10 positions. The Svk value ($Svk_A$) of the first surface, the Spk value ($Spk_A$) of the first surface, the Svk value ($Svk_B$) of the second surface, the Spk value ($Spk_B$) of the second surface, the Sq value ($Sq_A$) of the first surface, the Sq value ($Sq_B$) of the second surface, the Sa value ($Sa_A$) of the first surface, the Sa value ($Sa_B$) of the second surface, the Sk value ($Sk_A$) of the first surface, and the Sk value ($Sk_B$) of the second surface were determined in this manner. The results are shown in Table 3. Incidentally, Table 3 also shows the values of the ratio $Sq_B/Sq_A$, the ratio $Sa_B/Sa_A$, and the ratio $Sk_B/Sk_A$.

<Measurement of Ellipse Density>

The ellipse densities of the first surface (surface A) and the second surface (surface B) of the polypropylene films of Examples and Comparative Examples were measured. Specifically, each surface of the polypropylene film was observed at a lens magnification: 100-fold, by a measurement method: reflection measurement, in a visual field range: 3.4 mm×2.6 mm using a digital scope (Digital Microscope VHX-2000 available from Keyence Corporation), and the number of "ellipses" observed in the visual field range was counted. Thereafter, the number was converted into the number per unit area. The results are shown in Table 3.

Incidentally, those satisfying S≤L and 1 L 300, where the length of one axis was denoted as L μm and the length of the other axis was denoted as S μm, were defined as "ellipses" to be considered when the ellipse density was calculated. Those that did not satisfy this were not considered when the ellipse density was calculated (not counted as "ellipses" when the ellipse density was calculated).

<Measurement of Average Major Axis Length>

The average value of the major axes of the ellipses observed in the measurement of ellipse density was calculated. The results are shown in Table 3.

<Measurement of Ellipse Perfectness>

First, surface shape data in a region of 470.92 μm×353.16 μm per one visual field was acquired at the WAVE mode by applying a 530 white filter and a 1×BODY lens tube and using an objective lens (10×) and "VertScan 2.0 (model: R5500GML)" available from Ryoka Systems, Inc. as an optical interference type non-contact surface shape measuring instrument. This operation was performed at 10 positions at 1 cm intervals in the machine direction from the position to be the center in both the machine direction and width direction of the target sample (polypropylene film).

Next, the acquired data was subjected to noise removal processing by a median filter (3×3) and then to Gaussian filter processing at a cutoff value of 30 μm to remove the waviness component.

Three crater projection images each consisting of paired arcs were extracted from each of the projection images of surface shape data at 10 positions acquired as described above. Incidentally, the projection image was defined as a projection image acquired by projecting parts having a height of 0.02 μm or more among fine irregularities onto the film surface.

When extracting crater projection images, three crater projection images in which arcs based on different β-spherulites were not acknowledged to overlap each other were extracted. As the method for extracting three crater projection images, the ellipses which became the quartiles (first quartile, second quartile (namely, median value), and third quartile) in the area of ellipse by visual observation were extracted.

Next, for each of the three extracted crater projection images, the total length Lt of the paired arcs and the total circumferential length Lc of the virtual circular ring including the paired arcs were measured to determine the ratio (Lt/Lc). Thereafter, the values of the ratio for total 30 images thus attained were averaged to attain the average value a of the ratio (Lt/Lc).

The determination of virtual circular ring and the measurement of Lt and Lc were performed using the plug-in function "edge curve length" of the analysis software "VS- Viewer" of the optical interference type non-contact surface shape measuring instrument VertScan 2.0. The specific procedure is as follows.

(1) First, two points farthest from each other on arcs 30a and 30b are denoted as $P_1$ and $P_2$ and a straight line (hereinafter, referred to as straight line ($P_1$-$P_2$)) connecting $P_1$ and $P_2$ is determined as illustrated in FIG. 3(a).

(2) Subsequently, an ellipse ($E_0$) is derived from the shape (location data) of the arcs 30a and 30b at the part located on one side (the upper side of the straight line ($P_1$-$P_2$) in FIG. 3) of the straight line ($P_1$-$P_2$) by the least-squares method so that the straight line ($P_1$-$P_2$) becomes the major axis as illustrated in FIG. 3(b). Thereafter, the curve (a part of the circumference of the ellipse ($E_0$)) constituting this ellipse ($E_0$) complements the part between the arcs 30a and 30b on the one side to form a complementary line 40a. Incidentally, the ellipse ($E_0$) is not illustrated except for the part corresponding to the complementary line 40a in FIG. 3.

(3) Subsequently, an ellipse ($E_1$) is derived from the shape (location data) of the arcs 30a and 30b at the part located on the other side (the lower side of the straight line ($P_1$-$P_2$) in FIG. 3) of the straight line ($P_1$-$P_2$) by the least-squares method so that the straight line ($P_1$-$P_2$) becomes the major axis as illustrated in FIG. 3(c). Thereafter, the curve (a part of the circumference of the ellipse ($E_1$)) constituting this ellipse ($E_1$) complements the part between the arcs 30a and 30b on the other side to form a complementary line 40b. Incidentally, the ellipse ($E_1$) is not illustrated except for the part corresponding to the complementary line 40b in FIG. 3.

(4) The circular ring which is connected by the complementary lines 40a and 40b thus determined and the arcs 30a and 30b and illustrated in FIG. 3(c) is a virtual circular ring.

(5) Thereafter, a height profile of fine irregularities 20 is drawn which indicates the heights of the fine irregularities 20 at the respective locations with respect to the respective locations (distances when a point on the circumference is used as the basis) on the circumference of this virtual circular ring. Lt and Lc in a crater projection image G corresponding to the part having a height of 0.02 μm or more are read out from this height profile.

Incidentally, 30 pieces (n=30) of location data are used for each when the least-squares method is carried out.

<Measurement of Dielectric Breakdown Strength of Polypropylene Film (Dielectric Strength Evaluation)>

The dielectric breakdown voltage value of the polypropylene film was measured 12 times at 100° C. and 125° C. using a DC power source in accordance with JIS C2330 (2001) 7.4.11.2 Method B (plate electrode method). The dielectric breakdown voltage value Vcc was divided by the film thickness (μm), and the average value for 8 points excluding the upper 2 points and the lower 2 points among the measurement results for 12 times was defined as the dielectric breakdown strength ES ($V_{DC}$/μm). The results are shown in Table 3.

Incidentally, in Comparative Examples 1 and 4, it can be seen that the dielectric breakdown strength at 120° C. is less than 485 $V_{DC}$/μm and the dielectric strength is poor.

<Evaluation on Blocking of Metal Vapor-Deposited Roll>

A metal layer-integrated polypropylene film was obtained by subjecting a biaxially-oriented polypropylene film to aluminum vapor deposition at a vapor deposition resistance of 15Ω/□ to form a T-margin vapor deposition pattern. The pattern vapor deposition was performed according to a vacuum vapor deposition method by a wire system, and the heavy edge vapor deposition was performed according to a vacuum vapor deposition method by a crucible system. The film used for vapor deposition had a width of 620 mm, and the film length after vapor deposition was 50,000 m. A blade was placed in the center of each margin of this 620 mm wide metal layer-integrated polypropylene film, and slit processing was performed at a slit speed of 350 m/min so as to obtain small rolls with a width of 30 mm and a length of 10,000 m. At that time, it was evaluated as AA in a case in which wrinkles in the machine direction generated by blocking of the vapor-deposited surface and the non-vapor-deposited surface were not observed at the metal vapor deposition winding and unwinding parts, A in a case in which slight streaks which were not wrinkles were observed, B in a case in which wrinkles in the machine direction were observed at the end portion in the width direction, and C in a case in which wrinkles in the machine direction were observed even at the central portion in the width direction. The results are shown in Table 3.

<Measurement of Ash Content>

The ash content in the polypropylene films of Examples and Comparative Examples was measured as follows.

A sample was weighed by about 200 g, transferred to a platinum dish, and asked at 800° C. for 40 minutes. The ash content (ppm) was measured from the obtained ash residue. The results are shown in Table 3.

<Evaluation on Processability in Slitting Step>

A metal vapor-deposited roll having a width of 620 mm was slit at a slit speed of 350 m/min so as to have a width of 30 mm and a length of 10,000 m and was thus divided into 20 pieces in the width direction. As a result, it was evaluated as A in a case in which the end surface shift (the shift length when the film meandered left and right at the time of winding and the end surfaces of small roll were unmatched) in all the 20 small rolls obtained was within 0.5% of the slit width, B in a case in which the end surface shift in all the 20 small rolls was within 1.0% of the slit width and did not reach the evaluation A, C in a case in which the end surface shift in all the 20 small rolls was within 2.0% of the slit width and did not reach the evaluation B, and D in a case in which the end surface shift was more than 2.0% of the slit width in one or more of the 20 small rolls. The results are shown in Table 3.

<Evaluation on Element Winding Processability>

Among the small rolls obtained in the evaluation on slit processability, two sheets of a take-up reel with a left margin and a take-up reel with a right margin were superposed and wound in the width direction so that the vapor deposition part protruded more than the margin portion (element winding processing). The winding was performed by 1360 turns at a winding tension of 200 g using an automated winder 3KAW-N2 available from KAIDO MFG. CO., LTD. At that time, the rolls were visually observed from the beginning of winding to the end of winding, and those in which wrinkling and shift occurred were judged to be unacceptable, and the proportion of the number of unacceptable products to the total number of produced products was expressed as a percentage and used as an index of processability (hereinafter referred to as element winding yield). It is more preferable as the element winding yield is higher. An element winding yield of 95% or more was evaluated to be favorable "0", and an element winding yield of less than 95% was evaluated to be defective "x". The results are shown in Table 3.

TABLE 3

|  |  | Example 1 | Example 2 | Example 3 | Example 4 | Example 5 | Example 6 | Example 7 | Example 8 |
|---|---|---|---|---|---|---|---|---|---|
| Thickness [μm] |  | 2.3 | 2.3 | 2.3 | 2.3 | 2.3 | 2.3 | 2.3 | 2.3 |
| Spk [μm] | $Spk_A$ (Spk of surface A) | 0.048 | 0.080 | 0.049 | 0.043 | 0.060 | 0.040 | 0.035 | 0.080 |
|  | $Spk_B$ (Spk of surface B) | 0.024 | 0.022 | 0.032 | 0.021 | 0.034 | 0.027 | 0.024 | 0.026 |
| Svk [μm] | $Svk_A$ (Svk of surface A) | 0.011 | 0.030 | 0.013 | 0.010 | 0.022 | 0.029 | 0.025 | 0.028 |
|  | $Svk_B$ (Svk of surface B) | 0.010 | 0.011 | 0.016 | 0.009 | 0.015 | 0.025 | 0.022 | 0.022 |
| Sq [μm] | $Sq_A$ (Sq of surface A) | 0.028 | 0.069 | 0.032 | 0.025 | 0.049 | 0.051 | 0.045 | 0.067 |
|  | $Sq_B$ (Sq of surface B) | 0.014 | 0.015 | 0.023 | 0.013 | 0.025 | 0.042 | 0.037 | 0.038 |
| $Sq_B/Sq_A$ |  | 0.500 | 0.217 | 0.719 | 0.520 | 0.510 | 0.827 | 0.827 | 0.563 |
| Sa [μm] | SaA (Sa of surface A) | 0.014 | 0.021 | 0.017 | 0.012 | 0.018 | 0.017 | 0.015 | 0.020 |
|  | SaB (Sa of surface B) | 0.010 | 0.011 | 0.014 | 0.009 | 0.012 | 0.014 | 0.013 | 0.013 |
| $Sa_B/Sa_A$ |  | 0.714 | 0.524 | 0.824 | 0.750 | 0.667 | 0.840 | 0.834 | 0.655 |
| Sk [μm] | $Sk_A$ (Sk of surface A) | 0.040 | 0.057 | 0.046 | 0.036 | 0.045 | 0.050 | 0.046 | 0.052 |
|  | $Sk_B$ (Sk of surface B) | 0.031 | 0.032 | 0.039 | 0.028 | 0.036 | 0.043 | 0.038 | 0.039 |
| $Sk_B/Sk_A$ |  | 0.775 | 0.561 | 0.848 | 0.778 | 0.800 | 0.855 | 0.839 | 0.738 |
| Ellipse density [pieces/mm$^2$] | $D_A$ (ellipse density on surface A) | 94 | 93 | 86 | 103 | 84 | 119 | 117 | 86 |
|  | $D_B$ (ellipse density on surface B) | 6 | 5 | 11 | 6 | 12 | 7 | 6 | 12 |
| $D_B/D_A$ |  | 0.0638 | 0.0538 | 0.1279 | 0.0583 | 0.1429 | 0.0588 | 0.0513 | 0.1395 |
| Average major axis length [μm] | $L_A$ (average major axis length on surface A) | 51 | 59 | 56 | 45 | 67 | 39 | 41 | 89 |
|  | $L_B$ (average major axis length on surface B) | 57 | 67 | 54 | 52 | 73 | 43 | 47 | 110 |
| $L_B/L_A$ |  | 1.118 | 1.136 | 0.964 | 1.156 | 1.090 | 1.103 | 1.146 | 1.236 |
| Ellipse perfectness [%] | $P_A$ (ellipse perfectness on surface A) | 43 | 57 | 49 | 43 | 50 | 60 | 63 | 50 |
|  | $P_B$ (ellipse perfectness on surface B) | 27 | 32 | 32 | 27 | 33 | 37 | 41 | 31 |
| $P_B/P_A$ |  | 0.628 | 0.561 | 0.653 | 0.628 | 0.660 | 0.617 | 0.651 | 0.620 |
| Dielectric breakdown strength at 100° C. | [$V_{DC}$/μm] | 543 | 510 | 530 | 537 | 528 | 555 | 561 | 534 |
| Dielectric breakdown strength at 120° C. | [$V_{DC}$/μm] | 515 | 490 | 500 | 512 | 501 | 505 | 506 | 490 |

TABLE 3-continued

| | | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Ash content [ppm] | | $3 \times 10$ | $3 \times 10$ | $3 \times 10$ | $4 \times 10$ | $2 \times 10$ | $5 \times 10$ | $5 \times 10$ | $3 \times 10$ |
| Evaluation on blocking suppressing property of metal vapor-deposited roll | | AA | AA | AA | AA | AA | AA | AA | AA |
| Evaluation on processability in slitting step | | A | A | A | A | B | A | A | A |
| Evaluation on element winding processability | | ○ | ○ | ○ | ○ | ○ | ○ | ○ | ○ |

| | | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Thickness [um] | | 2.3 | 2.3 | 2.3 | 2.3 | 2.3 | — | 2.3 | 2.3 |
| Spk [μm] | $Spk_A$ (Spk of surface A) | 0.082 | 0.079 | 0.051 | 0.086 | 0.050 | — | 0.073 | 0.041 |
| | $Spk_B$ (Spk of surface B) | 0.038 | 0.028 | 0.014 | 0.040 | 0.014 | — | 0.028 | 0.009 |
| Svk [μm] | $Svk_A$ (Svk of surface A) | 0.039 | 0.033 | 0.012 | 0.041 | 0.012 | — | 0.032 | 0.029 |
| | $Svk_B$ (Svk of surface B) | 0.014 | 0.009 | 0.009 | 0.014 | 0.010 | — | 0.026 | 0.009 |
| Sq [μm] | $Sq_A$ (Sq of surface A) | 0.081 | 0.071 | 0.038 | 0.089 | 0.040 | — | 0.066 | 0.050 |
| | $Sq_B$ (Sq of surface B) | 0.028 | 0.017 | 0.010 | 0.031 | 0.011 | — | 0.043 | 0.015 |
| | $Sq_B/Sq_A$ | 0.346 | 0.239 | 0.263 | 0.348 | 0.275 | — | 0.659 | 0.297 |
| Sa [μm] | SaA (Sa of surface A) | 0.019 | 0.016 | 0.014 | 0.020 | 0.014 | — | 0.020 | 0.017 |
| | SaB (Sa of surface B) | 0.011 | 0.008 | 0.008 | 0.012 | 0.09 | — | 0.015 | 0.005 |
| | $Sa_B/Sa_A$ | 0.579 | 0.500 | 0.571 | 0.600 | 0.600 | — | 0.726 | 0.306 |
| Sk [μm] | $Sk_A$ (Sk of surface A) | 0.043 | 0.038 | 0.040 | 0.045 | 0.039 | — | 0.056 | 0.048 |
| | $Sk_B$ (Sk of surface B) | 0.031 | 0.024 | 0.023 | 0.032 | 0.024 | — | 0.044 | 0.015 |
| | $Sk_B/Sk_A$ | 0.721 | 0.632 | 0.575 | 0.711 | 0.615 | — | 0.790 | 0.316 |
| Ellipse density [pieces/mm²] | $D_A$ (ellipse density on surface A) | 74 | 81 | 80 | 75 | 81 | — | 83 | 80 |
| | $D_B$ (ellipse density on surface B) | 14 | 6 | 0 | 13 | 0 | — | 11 | 0 |
| | $D_B/D_A$ | 0.1892 | 0.0741 | 0.0000 | 0.1733 | 0.0000 | — | 0.1325 | 0.0000 |
| Average major axis length [μm] | $L_A$ (average major axis length on surface A) | 89 | 80 | 70 | 90 | 70 | — | 52 | 73 |
| | $L_B$ (average major axis length on surface B) | 111 | 118 | — | 110 | — | — | 60 | — |
| | $L_B/L_A$ | 1.247 | 1.475 | — | 1.222 | — | — | 1.154 | — |
| Ellipse perfectness [%] | $P_A$ (ellipse perfectness on surface A) | 51 | 45 | 39 | 51 | 40 | — | 44 | 43 |
| | $P_B$ (ellipse perfectness on surface B) | 35 | 30 | 13 | 36 | 14 | — | 29 | — |
| | $P_B/P_A$ | 0.686 | 0.667 | 0.333 | 0.706 | 0.350 | — | 0.659 | — |
| Dielectric breakdown strength at 100° C. | [$V_{DC}$/μm] | 528 | 542 | 532 | 504 | 530 | — | 531 | 520 |
| Dielectric breakdown strength at 120° C. | [$V_{DC}$/μm] | 482 | 505 | 486 | 462 | 485 | — | 480 | 475 |

TABLE 3-continued

|  | | | | | | | | |
|---|---|---|---|---|---|---|---|---|
| Ash content [ppm] | 2 × 10 | 2 × 10 | 4 × 10 | 2 × 10 | 3 × 10 | 35 × 10 | 2 × 10 | 3 × 10 |
| Evaluation on blocking suppressing property of metal vapor-deposited roll | A | C | C | A | C | — | A | C |
| Evaluation on processability in slitting step | C | D | C | C | C | — | C | C |
| Evaluation on element winding processability | ○ | ○ | ○ | ○ | ○ | — | ○ | ○ |

<Fabrication of Capacitor and Capacitance>

Capacitors were fabricated as follows using the polypropylene films obtained in Examples. A metal layer-integrated polypropylene film including a metal film on either surface of the polypropylene film was obtained by subjecting the polypropylene film to aluminum vapor deposition at a vapor deposition resistance of 15Ω/□ to form a T-margin vapor deposition pattern. After the film was slit into a width of 60 mm, two metal layer-integrated polypropylene films were combined and wound by 1076 turns at a winding tension of 250 g using an automated winder 3KAW-N2 available from KAIDO MFG. CO., LTD. The wound element was subjected to a heat treatment at 120° C. for 15 hours under pressing, and then zinc metal was thermally sprayed on the element end surface to obtain a flat-shaped capacitor. A lead wire was soldered to the end surface of the flat-shaped capacitor, and the flat-shaped capacitor was then sealed with epoxy resin. The capacitances of the finished capacitors were all 75 μF (±5 μF).

Heretofore, Examples according to the first present invention has been described.

Examples According to Second Present Invention

Next, Examples according to the second present invention will be described.

Polypropylene films of the following Examples and Comparative Examples were fabricated using the polypropylene resins (Resin A1, Resin A2, Resin B1, Resin B2, Resin C1, Resin X1, and Resin X2) described in the section of "Examples according to first present invention", and the physical properties thereof were evaluated.

<Fabrication of Polypropylene Film>

Example 9

Resin A1, Resin B1, and Resin C1 were dry-blended. The mixing ratio was set to (Resin A1):(Resin B1):(Resin C1)=64:33:3 in terms of mass ratio. After that, the dry-blended resin was melted at a resin temperature of 250° C., then extruded using a T die, wound around a metal drum of which the surface temperature was kept at 95° C., and solidified to fabricate a cast sheet. At this time, the cast sheet was fabricated while pressing the melt-extruded resin composition against the metal drum with an air knife. The unstretched cast sheet obtained was kept at a temperature of 130° C., and allowed to pass between rolls running at different speeds to be stretched to 4.5 times in the machine direction, and immediately cooled to room temperature. Subsequently, the stretched sheet was guided to the tenter, and stretched to 8 times in the width direction at a temperature of 158° C., and then subjected to relaxation and thermosetting, and wound, and subjected to an aging treatment in an atmosphere at about 40° C. to obtain a polypropylene film according to Example 9.

Example 10 and Comparative Examples 9 to 14

Polypropylene films according to Example 10 and Comparative Examples 9 to 14 were obtained in the same manner as in Example 9 except that the mixing ratio at the time of dry blending of the raw material resins was changed as shown in Table 4.

However, in Comparative Example 14, it was not be able to fabricate a smooth cast sheet because of melt fracture at the time of extrusion molding. For this reason, breakage occurred when the cast sheet was stretched.

Examples 11 to 13, Comparative Example 15, and Comparative Example 16

Polypropylene films according to Examples 11 to 13, Comparative Example 15, and Comparative Example 16 were obtained in the same manner as in Example 9 except that the mixing ratio at the time of dry blending of the raw material resins was changed as shown in Table 4.

TABLE 4

|  | Example 9 | Example 10 | Example 11 | Example 12 | Example 13 | Comparative Example 9 | Comparative Example 10 |
|---|---|---|---|---|---|---|---|
| Resin A1 (parts by mass) | 64 | 64 | 60 | 60 | 98 | 65 | 65 |
| Resin A2 (parts by mass) | — | — | — | — | — | — | — |
| Resin B1 (parts by mass) | 33 | — | — | 30 | — | — | 35 |
| Resin B2 (parts by mass) | — | 33 | 30 | — | — | 35 | — |

TABLE 4-continued

| | | | | | | | |
|---|---|---|---|---|---|---|---|
| Resin B3 (parts by mass) | — | — | — | — | — | — | — |
| Resin C1 (parts by mass) | 3 | 3 | 10 | 10 | 2 | — | — |
| Resin X1 (parts by mass) | — | — | — | — | — | — | — |
| Resin X2 (parts by mass) | — | — | — | — | — | — | — |

| | Comparative Example 11 | Comparative Example 12 | Comparative Example 13 | Comparative Example 14 | Comparative Example 15 | Comparative Example 16 |
|---|---|---|---|---|---|---|
| Resin A1 (parts by mass) | 63 | 100 | — | — | — | 98 |
| Resin A2 (parts by mass) | — | — | 64 | — | — | — |
| Resin B1 (parts by mass) | 34 | — | — | — | — | — |
| Resin B2 (parts by mass) | — | — | — | — | — | — |
| Resin B3 (parts by mass) | — | — | 34 | — | — | — |
| Resin C1 (parts by mass) | — | — | — | 100 | 2 | — |
| Resin X1 (parts by mass) | 3 | — | 2 | — | — | 2 |
| Resin X2 (parts by mass) | — | — | — | — | 98 | — |

<Measurement of Thickness of Polypropylene Film>

The thickness of the polypropylene films of Examples and Comparative Examples was measured by a method similar to that described in the section of "Examples according to first present invention". The results are shown in Table 5.

<Measurement of Svk Value ($Svk_A$) of First Surface, Spk Value ($Spk_A$) of First Surface, Svk Value ($Svk_B$) of Second Surface, Spk Value ($Spk_B$) of Second Surface, Sq Value ($Sq_A$) of First Surface, Sq Value ($Sq_B$) of Second Surface, Sa Value ($Sa_A$) of First Surface, Sa Value ($Sa_B$) of Second Surface, Sk Value ($Sk_A$) of First Surface, and Sk Value ($Sk_B$) of Second Surface>

The Svk value ($Svk_A$) of the first surface, the Spk value ($Spk_A$) of the first surface, the Svk value ($Svk_B$) of the second surface, the Spk value ($Spk_B$) of the second surface, the Sq value ($Sq_A$) of the first surface, the Sq value ($Sq_B$) of the second surface, the Sa value ($Sa_A$) of the first surface, the Sa value ($Sa_B$) of the second surface, the Sk value ($Sk_A$) of the first surface, and the Sk value ($Sk_B$) of the second surface were determined by methods similar to those described in the section of "Examples according to first present invention". The results are shown in Table 5. Incidentally, Table 5 also shows the values of the ratio $Spk_B/Spk_A$, the ratio $Svk_B/Svk_A$, the ratio $Sq_B/Sq_A$, the ratio $Sa_B/Sa_A$, and the ratio $Sk_B/Sk_A$.

<Measurement of Ellipse Density>

The ellipse densities of the first surface (surface A) and second surface (surface B) of the polypropylene films of Examples and Comparative Examples were measured by methods similar to those described in the section of "Examples according to first present invention". The results are shown in Table 5.

<Measurement of Average Major Axis Length>

The average value of the major axes of the ellipses observed in the measurement of ellipse density was calculated. The results are shown in Table 5.

<Measurement of Ellipse Perfectness>

The ellipse perfectness of the polypropylene films of Examples and Comparative Examples was measured by a method similar to that described in the section of "Examples according to first present invention". The results are shown in Table 5.

<Measurement of Dielectric Breakdown Strength of Polypropylene Film (Dielectric Strength Evaluation)>

The dielectric breakdown strength ES ($V_{DC}/\mu m$) of the polypropylene films of Examples and Comparative Examples was measured by a method similar to that described in the section of "Examples according to first present invention". The results are shown in Table 5.

Incidentally, in Comparative Examples 9 and 12, it can be seen that the dielectric breakdown strength at 120° C. is less than 485 $V_{DC}/\mu m$ and the dielectric strength is poor.

<Evaluation on Blocking of Metal Vapor-Deposited Roll>

The evaluation on blocking of the metal vapor-deposited roll was performed by a method similar to that described in the section of "Examples according to first present invention". The results are shown in Table 5.

<Measurement of Ash Content>

The ash content in the polypropylene film was measured by a method similar to that described in the section of "Examples according to first present invention". The results are shown in Table 5.

<Evaluation on Processability in Slitting Step>

The evaluation on processability in the slitting step was performed by a method similar to that described in the section of "Examples according to first present invention". The results are shown in Table 5.

<Evaluation on Element Winding Processability>

The evaluation on element winding processability was performed by a method similar to that described in the section of "Examples according to first present invention". The results are shown in Table 5.

TABLE 5

|  |  | Example 9 | Example 10 | Example 11 | Example 12 | Example 13 | Comparative Example 9 |
|---|---|---|---|---|---|---|---|
| Thickness [μm] | | 2.3 | 2.3 | 2.3 | 2.3 | 2.3 | 2.3 |
| Spk [μm] | $Spk_A$ (Spk of surface A) | 0.049 | 0.050 | 0.040 | 0.035 | 0.080 | 0.082 |
| | $Spk_B$ (Spk of surface B) | 0.025 | 0.033 | 0.027 | 0.024 | 0.026 | 0.038 |
| $Spk_B/Spk_A$ | | 0.510 | 0.660 | 0.691 | 0.676 | 0.327 | 0.463 |
| Svk [μm] | $Svk_A$ (Svk of surface A) | 0.012 | 0.014 | 0.029 | 0.025 | 0.028 | 0.039 |
| | $Syk_B$ (Svk of surface B) | 0.011 | 0.016 | 0.025 | 0.022 | 0.022 | 0.014 |
| $Svk_B/Svk_A$ | | 0.917 | 1.143 | 0.870 | 0.895 | 0.777 | 0.359 |
| Sq [μm] | $Sq_A$ (Sq of surface A) | 0.027 | 0.032 | 0.051 | 0.045 | 0.067 | 0.081 |
| | $Sq_B$ (Sq of surface B) | 0.014 | 0.022 | 0.042 | 0.037 | 0.038 | 0.028 |
| $Sq_B/Sq_A$ | | 0.519 | 0.688 | 0.827 | 0.827 | 0.563 | 0.346 |
| Sa [μm] | $Sa_A$ (Sa of surface A) | 0.014 | 0.017 | 0.017 | 0.015 | 0.020 | 0.019 |
| | $Sa_B$ (Sa of surface B) | 0.010 | 0.014 | 0.014 | 0.013 | 0.013 | 0.011 |
| $Sa_B/Sa_A$ | | 0.714 | 0.824 | 0.840 | 0.834 | 0.655 | 0.579 |
| Sk [μm] | $Sk_A$ (Sk of surface A) | 0.038 | 0.043 | 0.050 | 0.046 | 0.052 | 0.043 |
| | $Sk_B$ (Sk of surface B) | 0.031 | 0.037 | 0.043 | 0.038 | 0.039 | 0.031 |
| $Sk_B/Sk_A$ | | 0.816 | 0.860 | 0.855 | 0.839 | 0.738 | 0.721 |
| Ellipse density [pieces/mm$^2$] | $D_A$ (ellipse density on surface A) | 93 | 85 | 119 | 117 | 86 | 74 |
| | $D_B$ (ellipse density on surface B) | 6 | 11 | 7 | 6 | 12 | 14 |
| $D_B/D_A$ | | 0.0645 | 0.1294 | 0.0588 | 0.0513 | 0.1395 | 0.1892 |
| Average major axis length [μm] | $L_A$ (average major axis length on surface A) | 51 | 56 | 39 | 41 | 89 | 89 |
| | $L_B$ (average major axis length on surface B) | 57 | 53 | 43 | 47 | 110 | 111 |
| $L_B/L_A$ | | 1.118 | 0.946 | 1.103 | 1.146 | 1.236 | 1.247 |
| Ellipse perfectness [%] | $P_A$ (ellipse perfectness on surface A) | 44 | 50 | 60 | 63 | 50 | 51 |
| | $P_B$ (ellipse perfectness on surface B) | 28 | 32 | 37 | 41 | 31 | 35 |
| $P_B/P_A$ | | 0.636 | 0.640 | 0.617 | 0.651 | 0.620 | 0.686 |
| Dielectric breakdown strength at 100° C. | [$V_{DC}/\mu m$] | 543 | 530 | 555 | 561 | 534 | 528 |
| Dielectric breakdown strength at 120° C. | [$V_{DC}/\mu m$] | 515 | 500 | 505 | 506 | 490 | 482 |

TABLE 5-continued

|  |  |  |  |  |  |  |  |
|---|---|---|---|---|---|---|---|
| Ash content [ppm] | | $3 \times 10$ | $3 \times 10$ | $5 \times 10$ | $5 \times 10$ | $3 \times 10$ | $2 \times 10$ |
| Evaluation on blocking suppressing property of metal vapor-deposited roll | | AA | AA | AA | AA | AA | A |
| Evaluation on processability in slitting step | | A | A | A | A | A | C |
| Evaluation on element winding processability | | ○ | ○ | ○ | ○ | ○ | ○ |

|  |  | Comparative Example 10 | Comparative Example 11 | Comparative Example 12 | Comparative Example 13 | Comparative Example 14 | Comparative Example 15 | Comparative Example 16 |
|---|---|---|---|---|---|---|---|---|
| Thickness [μm] | | 2.3 | 2.3 | 2.3 | 2.3 | — | 2.3 | 2.3 |
| Spk [μm] | $Spk_A$ (Spk of surface A) | 0.079 | 0.051 | 0.086 | 0.050 | — | 0.073 | 0.041 |
| | $Spk_B$ (Spk of surface B) | 0.028 | 0.014 | 0.040 | 0.014 | — | 0.028 | 0.009 |
| $Spk_B/Spk_A$ | | 0.354 | 0.275 | 0.465 | 0.280 | — | 0.384 | 0.227 |
| Svk [μm] | $Svk_A$ (Svk of surface A) | 0.033 | 0.012 | 0.041 | 0.012 | — | 0.032 | 0.029 |
| | $Svk_B$ (Svk of surface B) | 0.009 | 0.009 | 0.014 | 0.010 | — | 0.026 | 0.009 |
| $Svk_B/Svk_A$ | | 0.273 | 0.750 | 0.341 | 0.833 | — | 0.807 | 0.309 |
| Sq [μm] | $Sq_A$ (Sq of surface A) | 0.071 | 0.038 | 0.089 | 0.040 | — | 0.066 | 0.050 |
| | $Sq_B$ (Sq of surface B) | 0.017 | 0.010 | 0.031 | 0.011 | — | 0.043 | 0.015 |
| $Sq_B/Sq_A$ | | 0.239 | 0.263 | 0.348 | 0.275 | — | 0.659 | 0.297 |
| Sa [μm] | $Sa_A$ (Sa of surface A) | 0.016 | 0.014 | 0.020 | 0.014 | — | 0.020 | 0.017 |
| | $Sa_B$ (Sa of surface B) | 0.008 | 0.008 | 0.012 | 0.09 | — | 0.015 | 0.005 |
| $Sa_B/Sa_A$ | | 0.500 | 0.571 | 0.600 | 0.600 | — | 0.726 | 0.306 |
| Sk [μm] | $Sk_A$ (Sk of surface A) | 0.038 | 0.040 | 0.045 | 0.039 | — | 0.056 | 0.048 |
| | $Sk_B$ (Sk of surface B) | 0.024 | 0.023 | 0.032 | 0.024 | — | 0.044 | 0.015 |
| $Sk_B/Sk_A$ | | 0.632 | 0.575 | 0.711 | 0.615 | — | 0.790 | 0.316 |
| Ellipse density [pieces/mm²] | $D_A$ (ellipse density on surface A) | 81 | 80 | 75 | 81 | — | 83 | 80 |
| | $D_B$ (ellipse density on surface B) | 6 | 0 | 13 | 0 | — | 11 | 0 |
| $D_B/D_A$ | | 0.0741 | 0.0000 | 0.1733 | 0.0000 | — | 0.1325 | 0.0000 |
| Average major axis length [μm] | $L_A$ (average major axis length on surface A) | 80 | 70 | 90 | 70 | — | 52 | 73 |
| | $L_B$ (average major axis length on surface B) | 118 | — | 110 | — | — | 60 | — |
| $L_B/L_A$ | | 1.475 | — | 1.222 | — | — | 1.154 | — |
| Ellipse perfectness [%] | $P_A$ (ellipse perfectness on surface A) | 45 | 39 | 51 | 40 | — | 44 | 43 |
| | $P_B$ (ellipse perfectness on surface B) | 30 | 13 | 36 | 14 | — | 29 | — |
| $P_B/P_A$ | | 0.667 | 0.333 | 0.706 | 0.350 | — | 0.659 | — |
| Dielectric breakdown strength at 100° C. | [$V_{DC}$/μm] | 542 | 532 | 504 | 530 | — | 531 | 520 |
| Dielectric breakdown strength at 120° C. | [$V_{DC}$/μm] | 505 | 486 | 462 | 485 | — | 480 | 475 |
| Ash content [ppm] | | $2 \times 10$ | $4 \times 10$ | $2 \times 10$ | $3 \times 10$ | $35 \times 10$ | $2 \times 10$ | $3 \times 10$ |
| Evaluation on blocking suppressing property of metal vapor-deposited roll | | C | C | A | C | — | A | C |
| Evaluation on processability in slitting step | | D | C | C | C | — | C | C |
| Evaluation on element winding processability | | ○ | ○ | ○ | ○ | — | ○ | ○ |

<Fabrication of Capacitor and Capacitance>

Capacitors were fabricated as follows using the polypropylene films obtained in Examples. A metal layer-integrated polypropylene film including a metal film on either surface of the polypropylene film was obtained by subjecting the polypropylene film to aluminum vapor deposition at a vapor deposition resistance of 15Ω/□ to form a T-margin vapor deposition pattern. After the film was slit into a width of 60 mm, two metal layer-integrated polypropylene films were combined and wound by 1076 turns at a winding tension of 250 g using an automated winder 3KAW-N2 available from KAIDO MFG. CO., LTD. The wound element was subjected to a heat treatment at 120° C. for 15 hours under pressing, and then zinc metal was thermally sprayed on the element end surface to obtain a flat-shaped capacitor. A lead wire was soldered to the end surface of the flat-shaped capacitor, and the flat-shaped capacitor was then sealed with epoxy resin. The capacitances of the finished capacitors were all 75 μF (±5 μF).

Heretofore, Examples according to the second present invention has been described.

Examples According to Third Present Invention

Next, Examples according to the third present invention will be described.

Polypropylene films of the following Examples and Comparative Examples were fabricated using the polypropylene resins (Resin A1, Resin A2, Resin B1, Resin B2, Resin C1, Resin X1, and Resin X2) described in the section of "Examples according to first present invention", and the physical properties thereof were evaluated.

<Fabrication of Polypropylene Film>

Example 14

Resin A1, Resin B1, and Resin C1 were dry-blended. The mixing ratio was set to (Resin A1):(Resin B1):(Resin C1)=63:34:3 in terms of mass ratio. After that, the dry-blended resin was melted at a resin temperature of 250° C., then extruded using a T die, wound around a metal drum of which the surface temperature was kept at 95° C., and solidified to fabricate a cast sheet. At this time, the cast sheet was fabricated while pressing the melt-extruded resin composition against the metal drum with an air knife. The unstretched cast sheet obtained was kept at a temperature of 130° C., and allowed to pass between rolls running at different speeds to be stretched to 4.5 times in the machine direction, and immediately cooled to room temperature. Subsequently, the stretched sheet was guided to the tenter, and stretched to 8 times in the width direction at a temperature of 158° C., and then subjected to relaxation and thermosetting, and wound, and subjected to an aging treatment in an atmosphere at about 40° C. to obtain a polypropylene film according to Example 14.

Example 15 and Comparative Examples 17 to 22

Polypropylene films according to Example 15 and Comparative Examples 17 to 22 were obtained in the same manner as in Example 14 except that the mixing ratio at the time of dry blending of the raw material resins was changed as shown in Table 6.

However, in Comparative Example 22, it was not be able to fabricate a smooth cast sheet because of melt fracture at the time of extrusion molding. For this reason, breakage occurred when the cast sheet was stretched.

Examples 16 to 18, Comparative Example 23, and Comparative Example 24

Polypropylene films according to Examples 16 to 18, Comparative Example 23, and Comparative Example 24 were obtained in the same manner as in Example 14 except that the mixing ratio at the time of dry blending of the raw material resins was changed as shown in Table 6.

TABLE 6

| | Example 14 | Example 15 | Example 16 | Example 17 | Example 18 | Comparative Example 17 | Comparative Example 18 |
|---|---|---|---|---|---|---|---|
| Resin A1 (parts by mass) | 63 | 62 | 60 | 60 | 98 | 65 | 65 |
| Resin A2 (parts by mass) | — | — | — | — | — | — | — |
| Resin B1 (parts by mass) | 34 | — | — | 30 | — | — | 35 |
| Resin B2 (parts by mass) | — | 35 | 30 | — | — | 35 | — |
| Resin B3 (parts by mass) | — | — | — | — | — | — | — |
| Resin C1 (parts by mass) | 3 | 3 | 10 | 10 | 2 | — | — |
| Resin X1 (parts by mass) | — | — | — | — | — | — | — |
| Resin X2 (parts by mass) | — | — | — | — | — | — | — |

TABLE 6-continued

| | | Comparative Example 19 | Comparative Example 20 | Comparative Example 21 | Comparative Example 22 | Comparative Example 23 | Comparative Example 24 |
|---|---|---|---|---|---|---|---|
| Resin A1 (parts by mass) | | 63 | 100 | — | — | — | 98 |
| Resin A2 (parts by mass) | | — | — | 64 | — | — | — |
| Resin B1 (parts by mass) | | 34 | — | — | — | — | — |
| Resin B2 (parts by mass) | | — | — | — | — | — | — |
| Resin B3 (parts by mass) | | — | — | 34 | — | — | — |
| Resin C1 (parts by mass) | | — | — | — | 100 | 2 | — |
| Resin X1 (parts by mass) | | 3 | — | 2 | — | — | 2 |
| Resin X2 (parts by mass) | | — | — | — | — | 98 | — |

<Measurement of Thickness of Polypropylene Film>

The thickness of the polypropylene films of Examples and Comparative Examples was measured by a method similar to that described in the section of "Examples according to first present invention". The results are shown in Table 7.

<Measurement of Ellipse Density>

The ellipse densities of the first surface (surface A) and second surface (surface B) of the polypropylene films of Examples and Comparative Examples were measured by methods similar to those described in the section of "Examples according to first present invention". The results are shown in Table 7.

<Measurement of Average Major Axis Length>

The average value of the major axes of the ellipses observed in the measurement of ellipse density was calculated. The results are shown in Table 7.

<Measurement of Ellipse Perfectness>

The ellipse perfectness of the polypropylene films of Examples and Comparative Examples was measured by a method similar to that described in the section of "Examples according to first present invention". The results are shown in Table 7.

<Measurement of Sq Value ($Sq_A$) of First Surface, Sq Value ($Sq_B$) of Second Surface, Sa Value ($Sa_A$) of First Surface, Sa Value ($Sa_B$) of Second Surface, Sk Value ($Sk_A$) of First Surface, and Sk Value ($Sk_B$) of Second Surface>

The Sq value ($Sq_A$) of the first surface, the Sq value ($Sq_B$) of the second surface, the Sa value ($Sa_A$) of the first surface, the Sa value ($Sa_B$) of the second surface, the Sk value ($Sk_A$) of the first surface, and the Sk value ($Sk_B$) of the second surface were determined by methods similar to those described in the section of "Examples according to first present invention". The results are shown in Table 7. Incidentally, Table 7 also shows the values of the ratio $Sq_B/Sq_A$, the ratio $Sa_B/Sa_A$, and the ratio $Sk_B/Sk_A$.

<Measurement of Dielectric Breakdown Strength of Polypropylene Film (Dielectric Strength Evaluation)>

The dielectric breakdown strength ES ($V_{DC}/\mu m$) of the polypropylene films of Examples and Comparative Examples was measured by a method similar to that described in the section of "Examples according to first present invention". The results are shown in Table 7.

Incidentally, in Comparative Examples 17 and 20, it can be seen that the dielectric breakdown strength at 120° C. is less than 485 $V_{DC}/\mu m$ and the dielectric strength is poor.

<Evaluation on Blocking of Metal Vapor-Deposited Roll>

The evaluation on blocking of the metal vapor-deposited roll was performed by a method similar to that described in the section of "Examples according to first present invention". The results are shown in Table 7.

<Measurement of Ash Content>

The ash content in the polypropylene film was measured by a method similar to that described in the section of "Examples according to first present invention". The results are shown in Table 7.

<Evaluation on Processability in Slitting Step>

The evaluation on processability in the slitting step was performed by a method similar to that described in the section of "Examples according to first present invention". The results are shown in Table 7.

<Evaluation on Element Winding Processability>

The evaluation on element winding processability was performed by a method similar to that described in the section of "Examples according to first present invention". The results are shown in Table 7.

TABLE 7

| | Example 14 | Example 15 | Example 16 | Example 17 | Example 18 | Comparative Example 17 | Comparative Example 18 | Comparative Example 19 | Comparative Example 20 | Comparative Example 21 | Comparative Example 22 | Comparative Example 23 | Comparative Example 24 |
|---|---|---|---|---|---|---|---|---|---|---|---|---|---|
| Thickness [μm] | 2.3 | 2.3 | 2.3 | 2.3 | 2.3 | 2.3 | 2.3 | 2.3 | 2.3 | 2.3 | — | 2.3 | 2.3 |
| Ellipse density $D_A$ (ellipse density on surface A) [pieces/mm²] | 94 | 87 | 119 | 117 | 86 | 74 | 81 | 80 | 75 | 81 | — | 83 | 80 |
| $D_B$ (ellipse density on surface B) | 6 | 11 | 7 | 6 | 12 | 14 | 6 | 0 | 13 | 0 | — | 11 | 0 |
| $D_B/D_A$ | 0.0638 | 0.1264 | 0.0588 | 0.0513 | 0.1395 | 0.1892 | 0.0741 | 0.0000 | 0.1733 | 0.0000 | — | 0.1325 | 0.0000 |
| Average major axis length [μm] $L_A$ (average major axis length on surface A) | 51 | 56 | 39 | 41 | 89 | 89 | 80 | 70 | 90 | 70 | — | 52 | 73 |
| $L_B$ (average major axis length on surface B) | 57 | 55 | 43 | 47 | 110 | 111 | 118 | — | 110 | — | — | 60 | — |
| $L_B/L_A$ | 1.118 | 0.982 | 1.103 | 1.146 | 1.236 | 1.247 | 1.475 | — | 1.222 | — | — | 1.154 | — |
| Ellipse perfectness [%] $P_A$ (ellipse perfectness on surface A) | 43 | 48 | 60 | 63 | 50 | 51 | 45 | 39 | 51 | 40 | — | 44 | 43 |
| $P_B$ (ellipse perfectness on surface B) | 27 | 32 | 37 | 41 | 31 | 35 | 30 | 13 | 36 | 14 | — | 29 | — |
| $P_B/P_A$ | 0.628 | 0.667 | 0.617 | 0.651 | 0.620 | 0.686 | 0.667 | 0.333 | 0.706 | 0.350 | — | 0.659 | — |
| Sq [μm] $Sq_A$ (Sq of surface A) | 0.028 | 0.032 | 0.051 | 0.045 | 0.067 | 0.081 | 0.071 | 0.038 | 0.089 | 0.040 | — | 0.066 | 0.050 |
| $Sq_B$ (Sq of surface B) | 0.014 | 0.022 | 0.042 | 0.037 | 0.038 | 0.028 | 0.017 | 0.010 | 0.031 | 0.011 | — | 0.043 | 0.015 |
| $Sq_B/Sq_A$ | 0.500 | 0.688 | 0.827 | 0.827 | 0.563 | 0.346 | 0.239 | 0.263 | 0.348 | 0.275 | — | 0.659 | 0.297 |
| Sa [μm] $Sa_A$ (Sa of surface A) | 0.014 | 0.018 | 0.017 | 0.015 | 0.020 | 0.019 | 0.016 | 0.014 | 0.020 | 0.014 | — | 0.020 | 0.017 |
| $Sa_B$ (Sa of surface B) | 0.010 | 0.013 | 0.014 | 0.013 | 0.013 | 0.011 | 0.008 | 0.008 | 0.012 | 0.09 | — | 0.015 | 0.005 |
| $Sa_B/Sa_A$ | 0.714 | 0.722 | 0.840 | 0.834 | 0.655 | 0.579 | 0.500 | 0.571 | 0.600 | 0.600 | — | 0.726 | 0.306 |

TABLE 7-continued

| | | Example 14 | Example 15 | Example 16 | Example 17 | Example 18 | Comparative Example 17 | Comparative Example 18 | Comparative Example 19 | Comparative Example 20 | Comparative Example 21 | Comparative Example 22 | Comparative Example 23 | Comparative Example 24 |
|---|---|---|---|---|---|---|---|---|---|---|---|---|---|---|
| Sk [μm] | $Sk_A$ (Sk of surface A) | 0.040 | 0.043 | 0.050 | 0.046 | 0.052 | 0.043 | 0.038 | 0.040 | 0.045 | 0.039 | — | 0.056 | 0.048 |
| | $Sk_B$ (Sk of surface B) | 0.031 | 0.037 | 0.043 | 0.038 | 0.039 | 0.031 | 0.024 | 0.023 | 0.032 | 0.024 | — | 0.044 | 0.015 |
| | $Sk_B/Sk_A$ | 0.775 | 0.860 | 0.855 | 0.839 | 0.738 | 0.721 | 0.632 | 0.575 | 0.711 | 0.615 | — | 0.790 | 0.316 |
| Dielectric breakdown strength at 100° C. | [$V_{DC}$/μm] | 543 | 530 | 555 | 561 | 534 | 528 | 542 | 532 | 504 | 530 | — | 531 | 520 |
| Dielectric breakdown Strength at 120° C. | [$V_{DC}$/μm] | 515 | 500 | 505 | 506 | 490 | 482 | 505 | 486 | 462 | 485 | — | 480 | 475 |
| Ash content [ppm] | | 3 × 10 | 3 × 10 | 5 × 10 | 5 × 10 | 3 × 10 | 2 × 10 | 2 × 10 | 4 × 10 | 2 × 10 | 3 × 10 | 35 × 10 | 2 × 10 | 3 × 10 |
| Evaluation on blocking suppressing property of metal vapor-deposited roll | | AA | AA | AA | AA | AA | A | C | C | A | C | — | A | C |
| Evaluation on processability in slitting step | | A | A | A | A | A | C | D | C | C | C | — | C | C |
| Evaluation on element winding processability | | ○ | ○ | ○ | ○ | ○ | ○ | ○ | ○ | ○ | ○ | — | ○ | ○ |

<Fabrication of Capacitor and Capacitance>

Capacitors were fabricated as follows using the polypropylene films obtained in Examples. A metal layer-integrated polypropylene film including a metal film on either surface of the polypropylene film was obtained by subjecting the polypropylene film to aluminum vapor deposition at a vapor deposition resistance of 15Ω/□ to form a T-margin vapor deposition pattern. After the film was slit into a width of 60 mm, two metal layer-integrated polypropylene films were combined and wound by 1076 turns at a winding tension of 250 g using an automated winder 3KAW-N2 available from KAIDO MFG. CO., LTD. The wound element was subjected to a heat treatment at 120° C. for 15 hours under pressing, and then zinc metal was thermally sprayed on the element end surface to obtain a flat-shaped capacitor. A lead wire was soldered to the end surface of the flat-shaped capacitor, and the flat-shaped capacitor was then sealed with epoxy resin. The capacitances of the finished capacitors were all 75 μF (±5 μF).

Heretofore, Examples according to the third present invention has been described.

The invention claimed is:

1. A polypropylene film having a first surface and a second surface, wherein:
   the polypropylene film contains a polypropylene resin as a main component;
   a Svc value ($Svk_A$) of the first surface is 0.005 μm or more and 0.030 μm or less;
   a Spk value ($Spk_A$) of the first surface is more than 0.035 μm and 0.080 μm or less;
   a Svk value ($Svk_B$) of the second surface is 0.005 μm or more and 0.030 μm or less; and
   a Spk value ($Spk_B$) of the second surface is 0.015 μm or more and 0.035 μm or less.

2. The polypropylene film according to claim 1 wherein said polypropylene film is biaxially stretched.

3. The polypropylene film according to claim 1, wherein a ratio $Sq_B/Sq_A$ of a Sq value ($Sq_B$) of the second surface to a Sq value ($Sq_A$) of the first surface is 0.4 to 1.0.

4. The polypropylene film according to claim 1, wherein a ratio $Sa_B/Sa_A$ of a Sa value ($Sa_B$) of the second surface to a Sa value ($Sa_A$) of the first surface is 0.6 to 1.0.

5. The polypropylene film according to claim 1, wherein the polypropylene resin contains:
   a linear polypropylene resin A having a difference of 8.0% or more attained by subtracting a differential distribution value when a logarithmic molecular weight Log (M)=6.0 from a differential distribution value when a logarithmic molecular weight Log (M)=4.5 in a molecular weight differential distribution curve;
   a linear polypropylene resin B having a difference of less than 8.0% attained by subtracting a differential distribution value when a logarithmic molecular weight Log (M)=6.0 from a differential distribution value when a logarithmic molecular weight Log (M)=4.5 in a molecular weight differential distribution curve; and
   a long-chain branched polypropylene resin C polymerized using a metallocene catalyst.

6. A metal layer-integrated polypropylene film comprising:
   the polypropylene film according to claim 1; and
   a metal layer stacked on either surface or both surfaces of the polypropylene film.

7. A film capacitor comprising the metal layer-integrated polypropylene film according to claim 6, wherein said polypropylene film is wound or a configuration in which a plurality of the metal layer-integrated polypropylene films are stacked.

8. A film roll, wherein the polypropylene film according to claim 1 is wound into the roll.

* * * * *

UNITED STATES PATENT AND TRADEMARK OFFICE
CERTIFICATE OF CORRECTION

PATENT NO. : 11,492,475 B2
APPLICATION NO. : 16/767092
DATED : November 8, 2022
INVENTOR(S) : Tatsuji Ishida et al.

It is certified that error appears in the above-identified patent and that said Letters Patent is hereby corrected as shown below:

On the Title Page

Column 2 (Abstract), Line 5, Delete "(SvkA)" and insert -- $(Svk_A)$ --.
Column 2 (Abstract), Line 6, Delete "(SvkA)" and insert -- $(Svk_A)$ --.
Page 2, Column 1 (Abstract), Line 2, Delete "(SvkB)" and insert -- $(Svk_B)$ --.
Page 2, Column 1 (Abstract), Line 3, Delete "(SvkB)" and insert -- $(Svk_B)$ --.

In the Specification

Column 2, Line 1, Delete "paragraph[0023])." and insert -- paragraph [0023]). --.
Column 2, Line 21, Delete "paragraph[0025])." and insert -- paragraph [0025]). --.
Column 54, Line 32, Delete "psec" and insert -- μ sec --.

In the Claims

Column 81, Line 27, In Claim 1, delete "Svc" and insert -- Svk --.

Signed and Sealed this
Fourteenth Day of March, 2023

Katherine Kelly Vidal
*Director of the United States Patent and Trademark Office*